United States Patent
Hagiwara et al.

(10) Patent No.: US 11,380,406 B2
(45) Date of Patent: Jul. 5, 2022

(54) OUTPUT CIRCUIT

(71) Applicant: Kioxia Corporation, Tokyo (JP)

(72) Inventors: Yousuke Hagiwara, Kawasaki Kanagawa (JP); Kensuke Yamamoto, Yokohama Kanagawa (JP); Takeshi Hioka, Machida Tokyo (JP); Satoshi Inoue, Zushi Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 13 days.

(21) Appl. No.: 17/017,726

(22) Filed: Sep. 11, 2020

(65) Prior Publication Data

US 2021/0174882 A1    Jun. 10, 2021

(30) Foreign Application Priority Data

Dec. 4, 2019 (JP) .............................. JP2019-219580

(51) Int. Cl.
| | |
|---|---|
| G11C 7/00 | (2006.01) |
| G11C 16/30 | (2006.01) |
| G11C 16/26 | (2006.01) |
| G11C 16/04 | (2006.01) |
| G11C 16/34 | (2006.01) |
| G11C 16/10 | (2006.01) |

(52) U.S. Cl.
CPC .......... *G11C 16/30* (2013.01); *G11C 16/0441* (2013.01); *G11C 16/10* (2013.01); *G11C 16/26* (2013.01); *G11C 16/3459* (2013.01)

(58) Field of Classification Search
CPC ....... G11C 5/147; G11C 5/14; G11C 11/4074; G11C 16/30; G11C 5/143
USPC .............................................. 365/226, 189.05
See application file for complete search history.

(56) References Cited

U.S. PATENT DOCUMENTS

| | | | | |
|---|---|---|---|---|
| 5,933,371 A | * | 8/1999 | Watanabe | G11C 7/1078 365/189.05 |
| 10,355,685 B2 | * | 7/2019 | Iida | H03K 19/017 |
| 2010/0102853 A1 | * | 4/2010 | Hollis | G11C 7/02 326/86 |
| 2010/0259316 A1 | | 10/2010 | Fujita et al. | |

FOREIGN PATENT DOCUMENTS

JP    5388663 B2    9/2008

* cited by examiner

*Primary Examiner* — Son T Dinh
(74) *Attorney, Agent, or Firm* — Holtz, Holtz & Volek PC

(57) ABSTRACT

In general, according to one embodiment, an output circuit includes first to third power supply lines, a pad, first to second transistors, and a first circuit. A first end of the first transistor is coupled to the first power supply line. A second end of the first transistor is coupled to the pad. A first end of the second transistor is coupled to the second power supply line. A second end of the second transistor is coupled to the pad. The first circuit is coupled to each of the third power supply line and a gate of the first transistor. In a first case, the first circuit applies a fourth voltage to the gate of the first transistor.

16 Claims, 35 Drawing Sheets

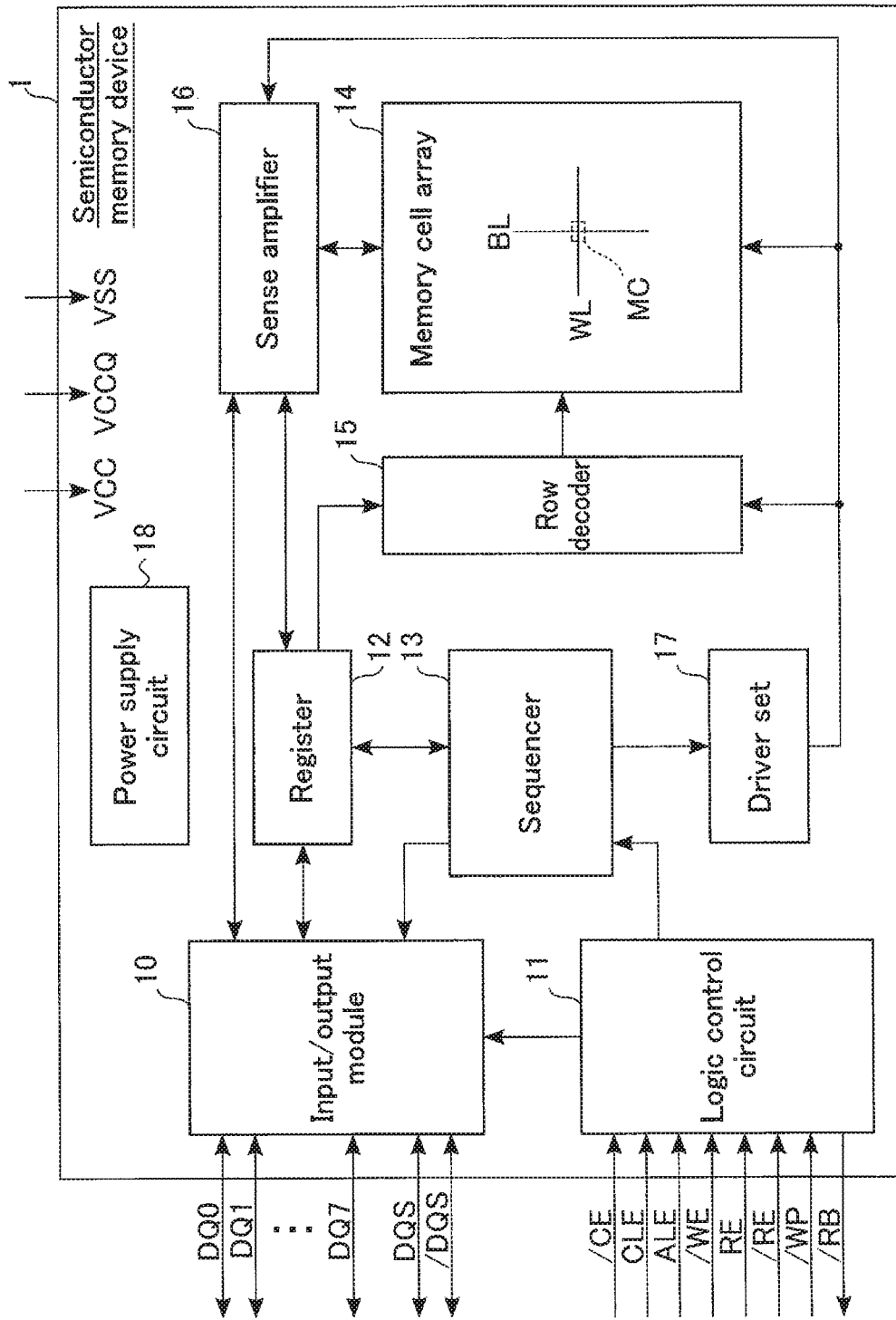
F I G. 2

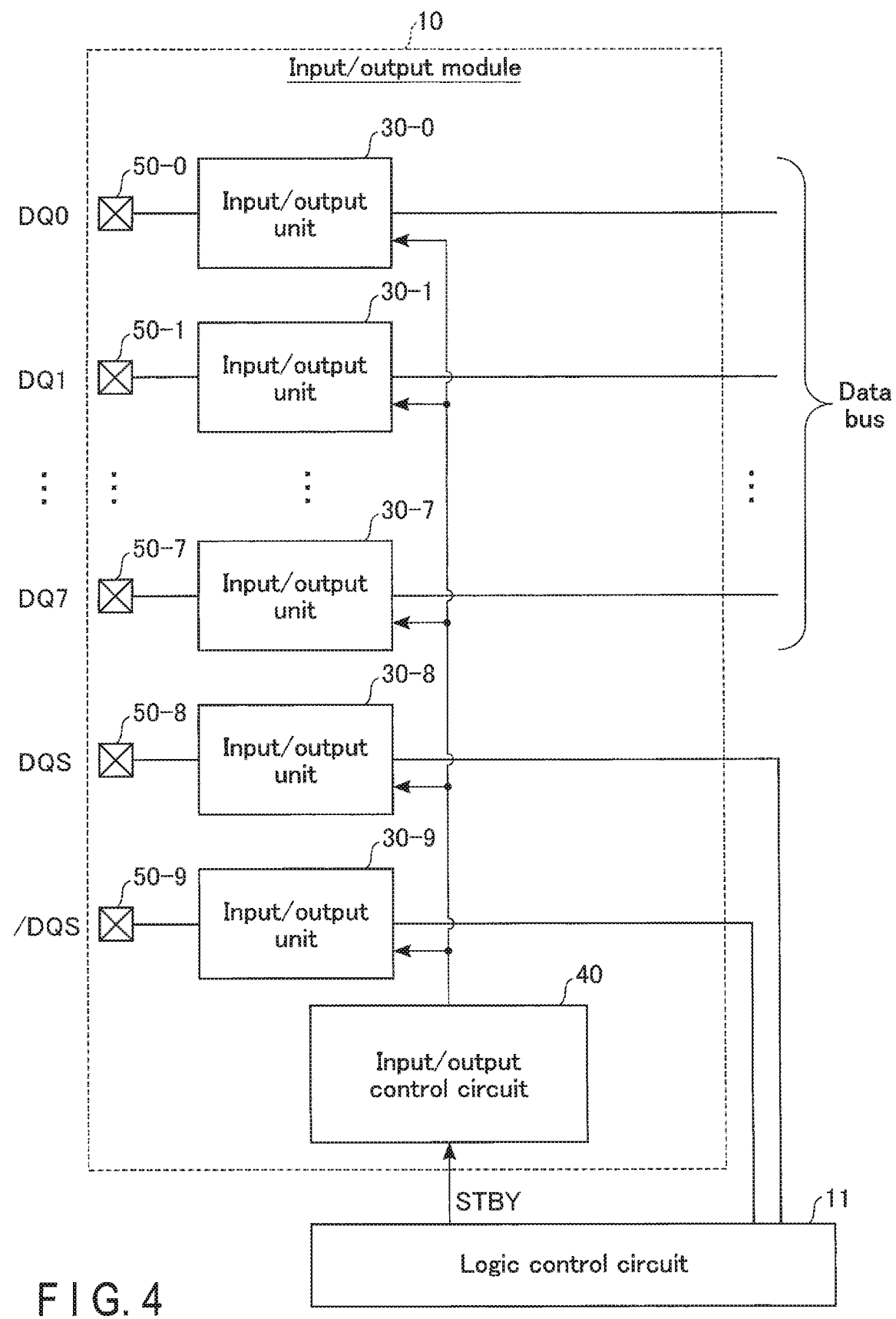
F I G. 4

| State | STBY | | /STBY | | S1 | | S2 | |
|---|---|---|---|---|---|---|---|---|
| | Logic level | Voltage | Logic level | Voltage | Logic level | Voltage | Logic level | Voltage |
| First | H | VDD | L | VSS | L | VSS | L | VSS |
| Second | L | VSS | H | VDD | H | VDD1 | H | VDD2 |

FIG. 9

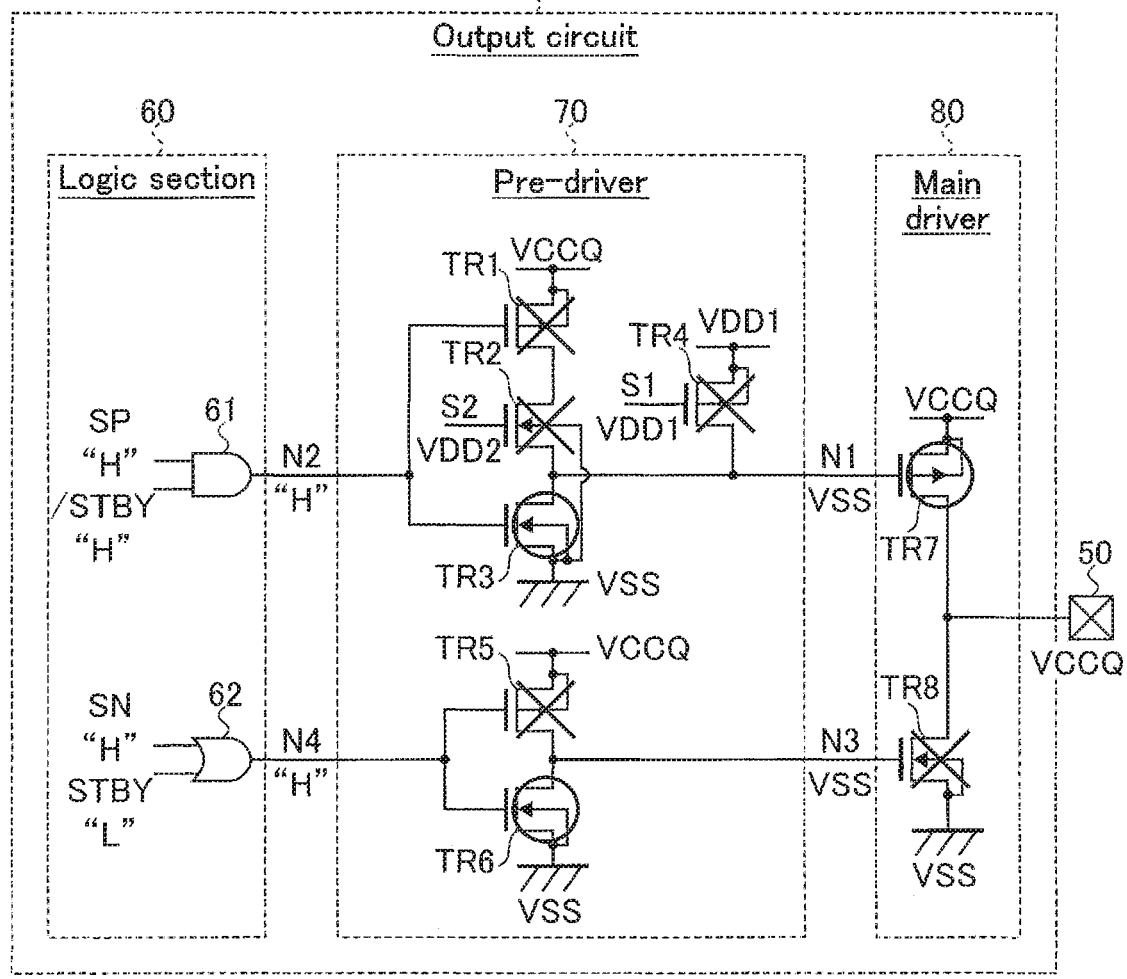
F I G. 12

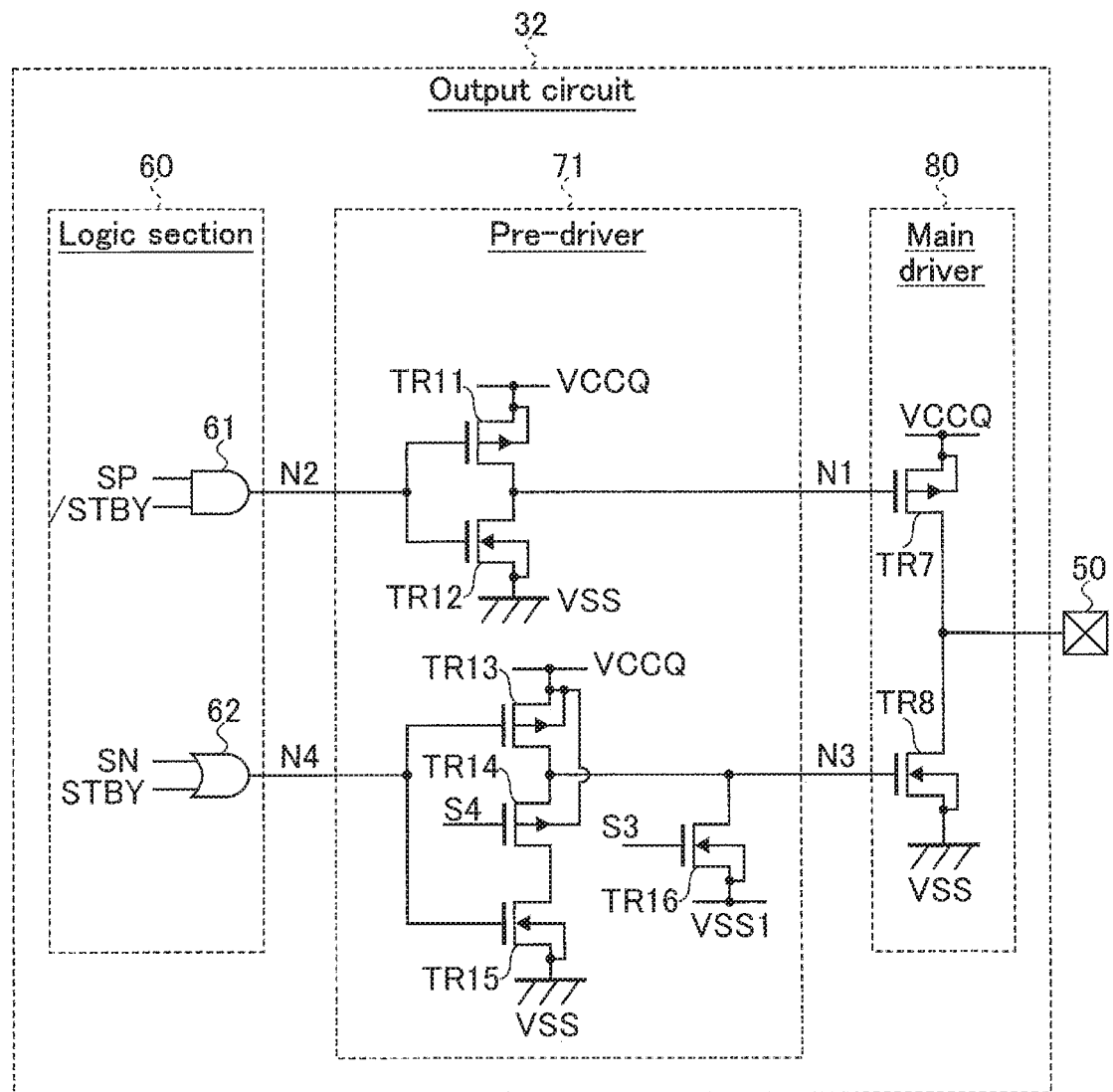
F I G. 15

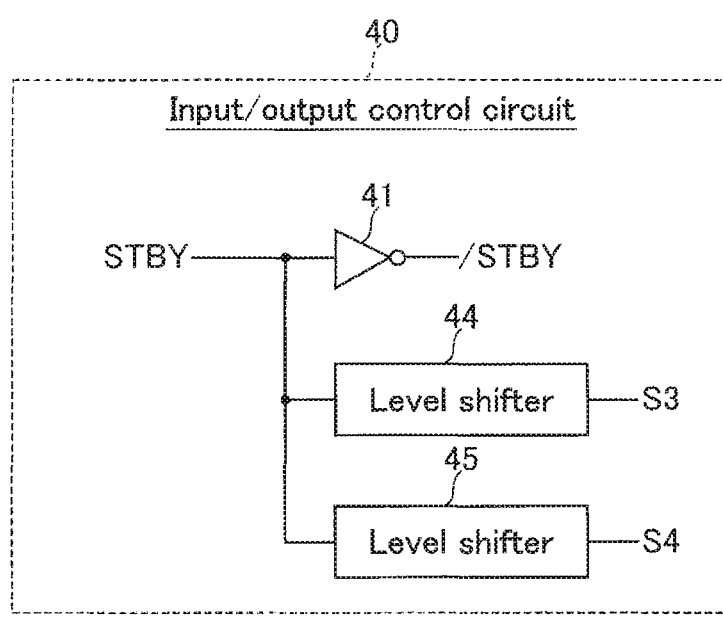
F I G. 16

| State | STBY | | /STBY | | S3 | | S4 | |
|---|---|---|---|---|---|---|---|---|
| | Logic level | Voltage | Logic level | Voltage | Logic level | Voltage | Logic level | Voltage |
| First | H | VDD | L | VSS | H | VDD | H | VDD |
| Second | L | VSS | H | VDD | L | VSS1 | L | VSS2 |

FIG. 17

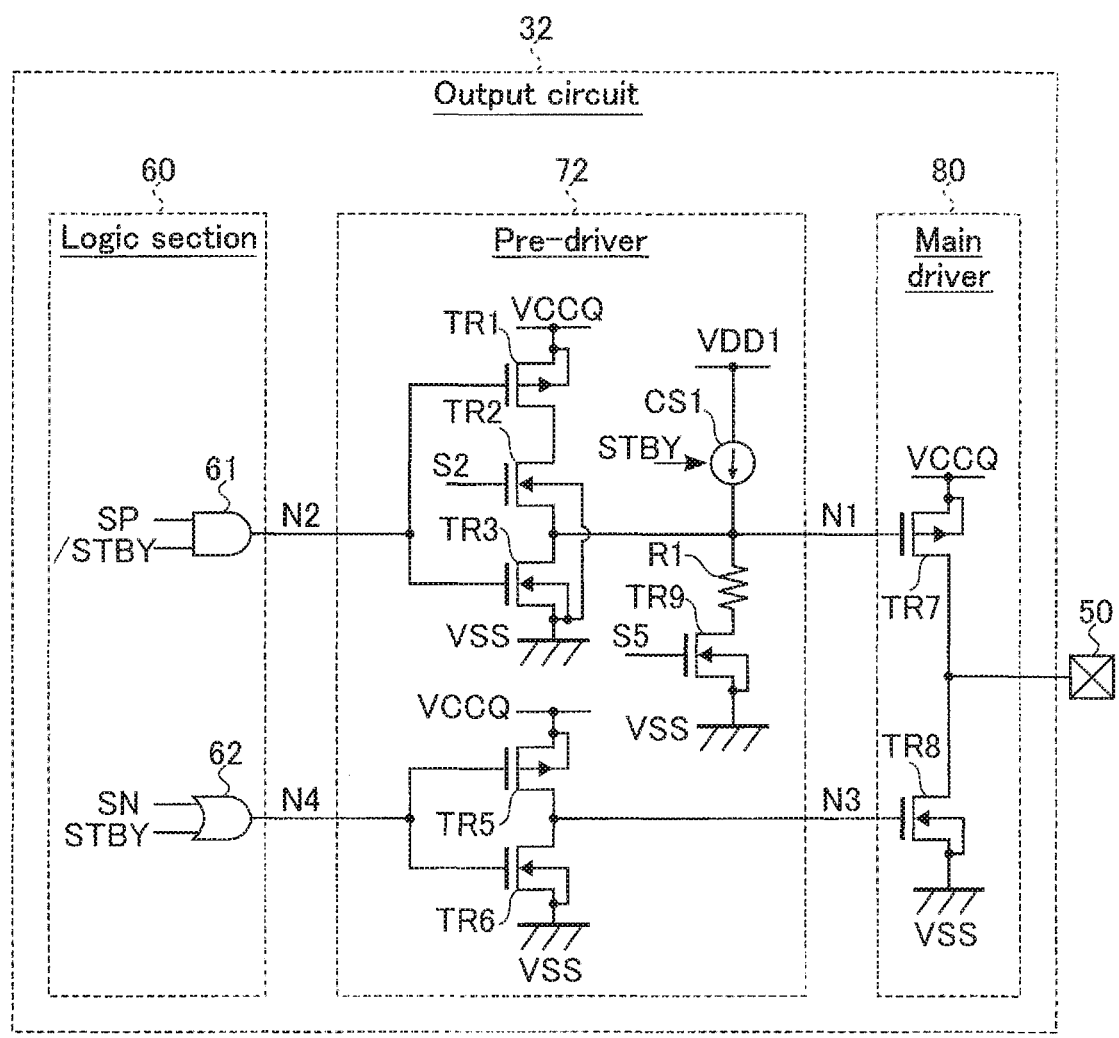
F I G. 18

| State | STBY | | /STBY | | S1 | | S2 | | S5 | |
|---|---|---|---|---|---|---|---|---|---|---|
| | Logic level | Voltage | Logic level | Voltage | Logic level | Voltage | Logic level | Voltage | Logic level | Voltage |
| First | H | VDD | L | VSS | L | VSS | L | VSS | H | VDD1 |
| Second | L | VSS | H | VDD | H | VDD1 | H | VDD2 | L | VSS |

F I G. 20

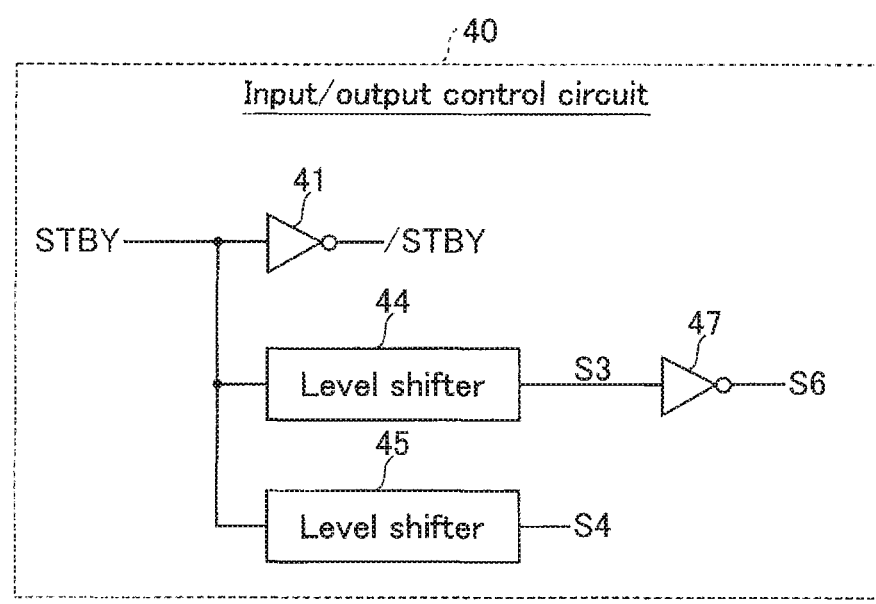
F I G. 22

| State | STBY | | /STBY | | S3 | | S4 | | S6 | |
|---|---|---|---|---|---|---|---|---|---|---|
| | Logic level | Voltage | Logic level | Voltage | Logic level | Voltage | Logic level | Voltage | Logic level | Voltage |
| First | H | VDD | L | VSS | H | VDD | H | VDD | L | VSS1 |
| Second | L | VSS | H | VDD | L | VSS1 | L | VSS2 | H | VDD |

FIG. 23

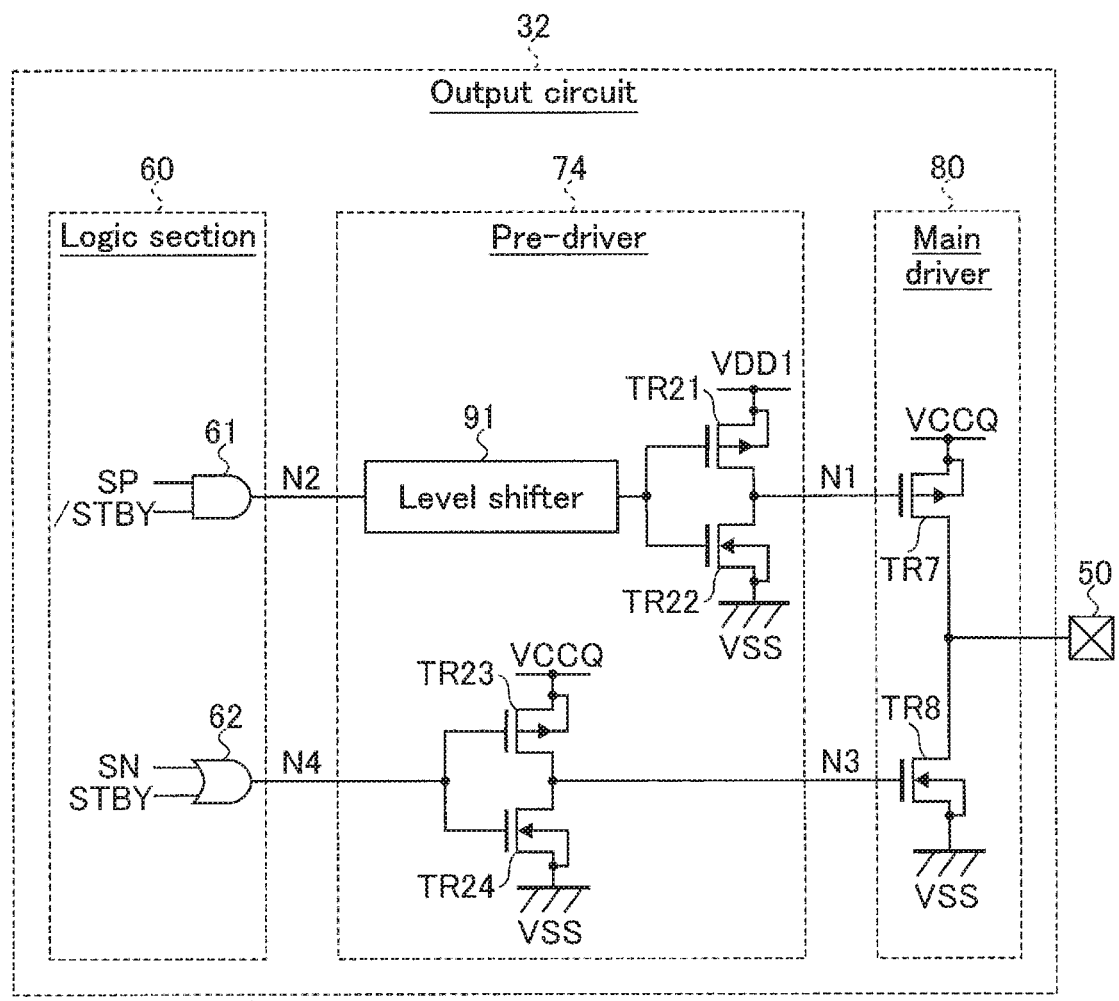
F I G. 24

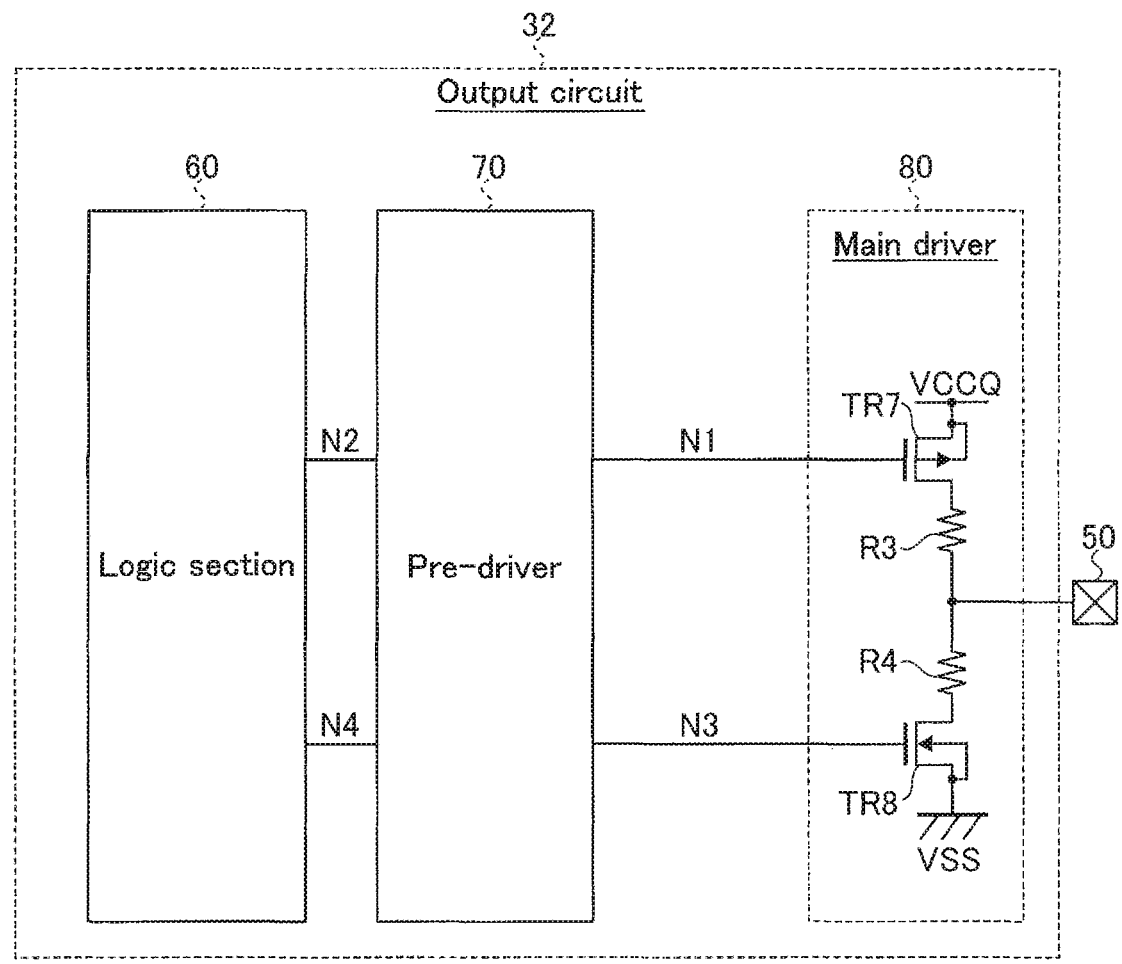
F I G. 26

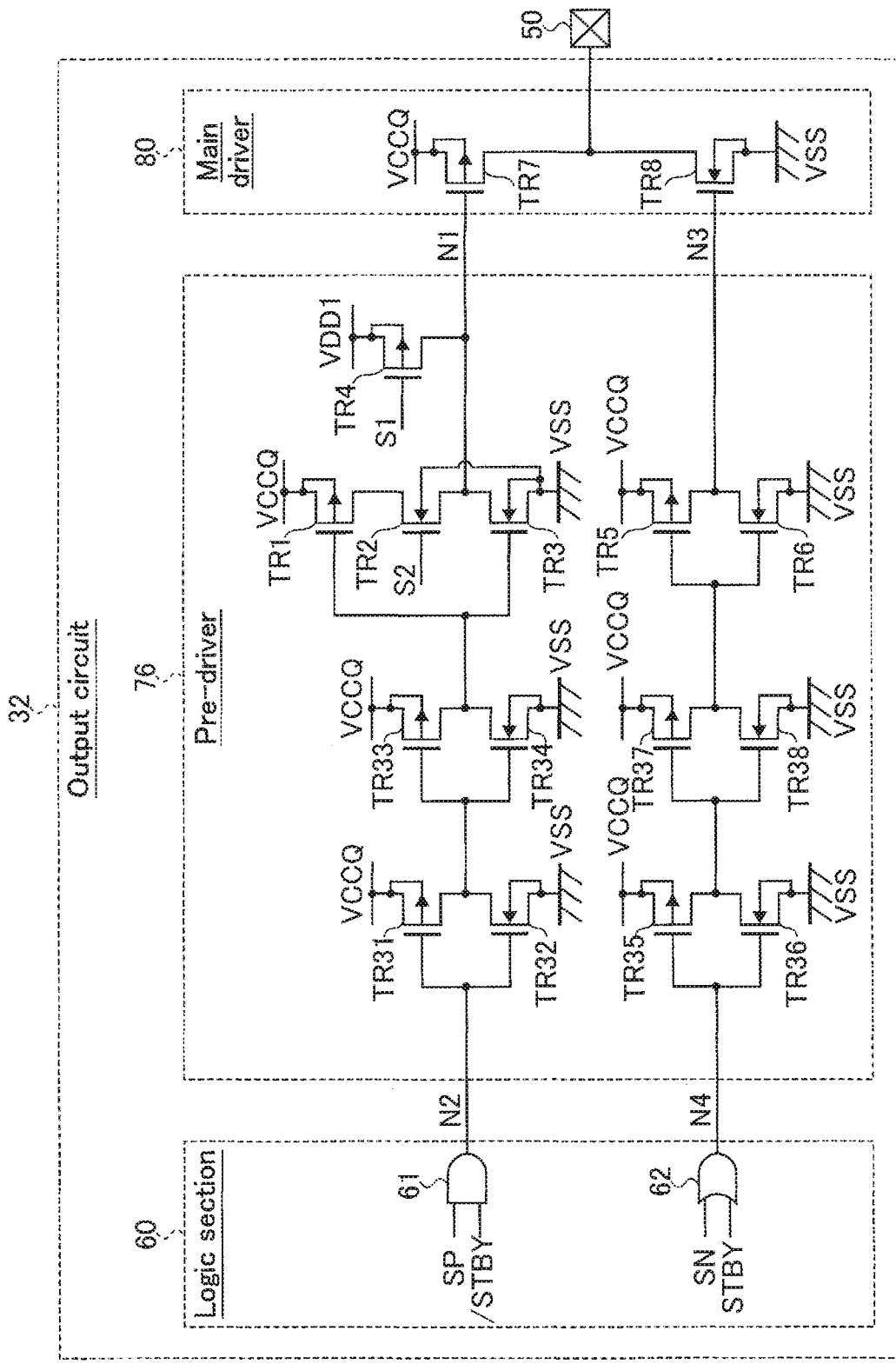
F I G. 27

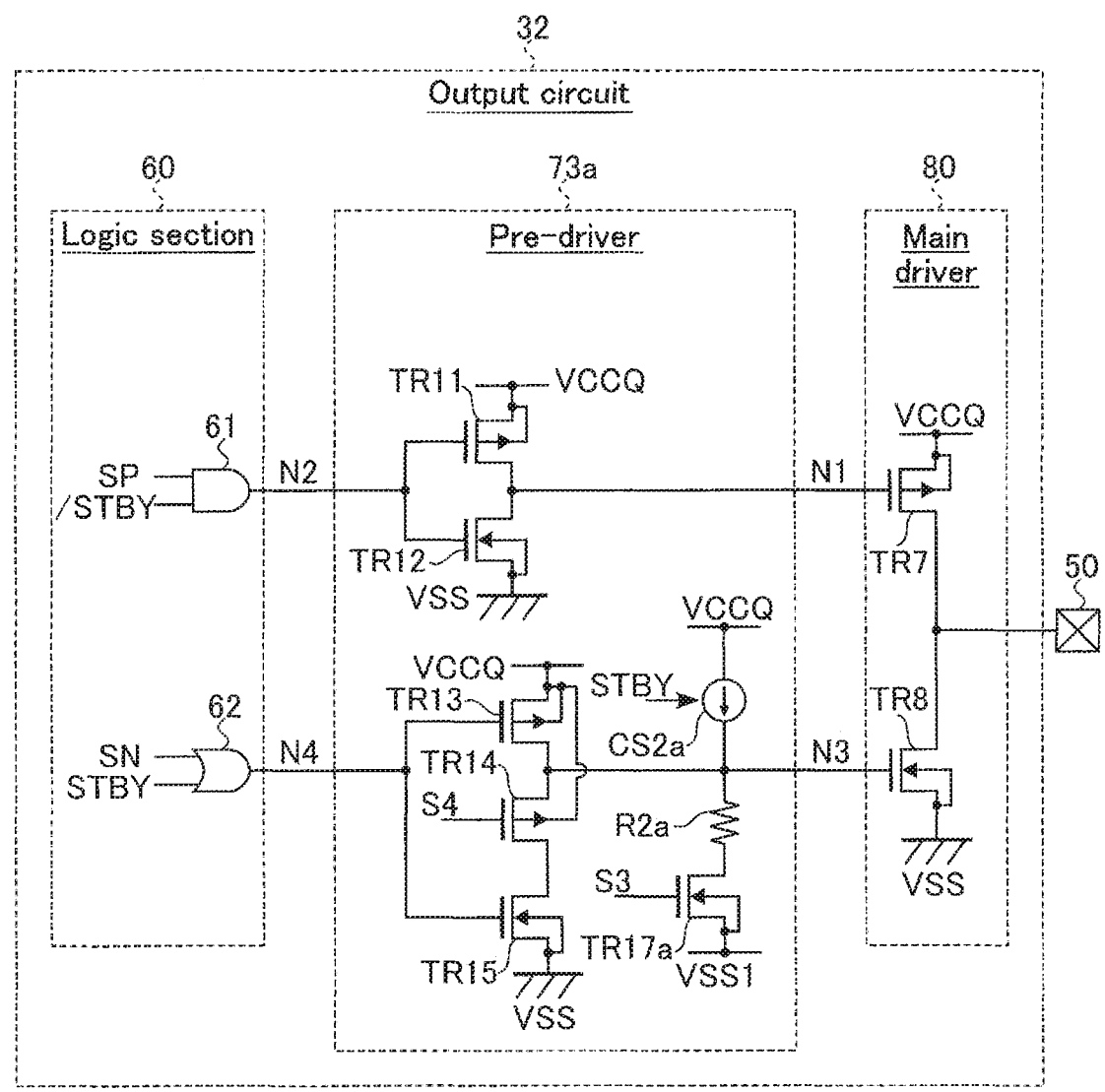
F I G. 30

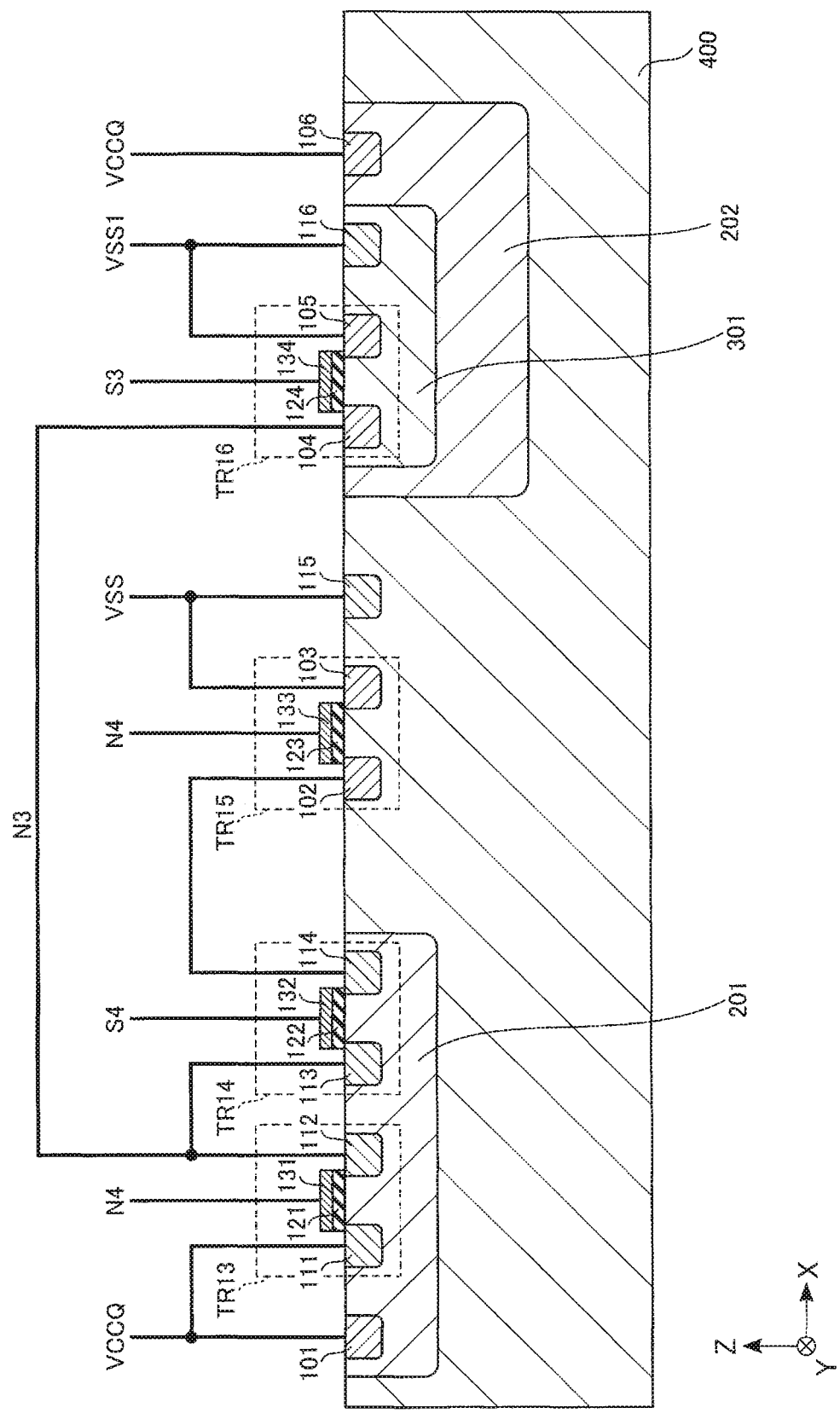
F I G. 31

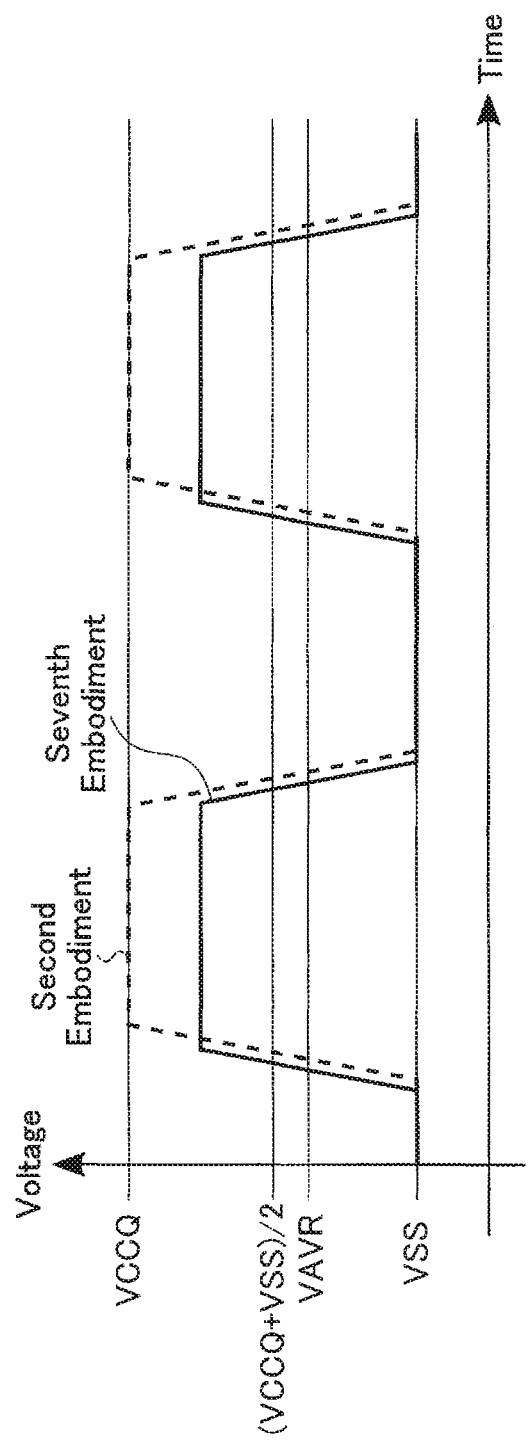
F I G. 34

OUTPUT CIRCUIT

CROSS-REFERENCE TO RELATED APPLICATIONS

This application is based upon and claims the benefit of priority from Japanese Patent Application No. 2019-219580, filed Dec. 4, 2019, the entire contents of which are incorporated herein by reference.

FIELD

Embodiments described herein relate generally to an output circuit.

BACKGROUND

An output circuit that outputs a signal is known.

BRIEF DESCRIPTION OF THE DRAWINGS

FIG. 2 is a block diagram illustrating a configuration example of the semiconductor memory device according to the first embodiment;

FIG. 4 is a block diagram illustrating a configuration example of an input/output module included in the semiconductor memory device according to the first embodiment;

FIG. 9 is a table illustrating a relationship between the logic level and the voltage of each signal in the semiconductor memory device according to the first embodiment;

FIG. 12 is a circuit diagram illustrating an example of an operation of the output circuit included in the semiconductor memory device according to the first embodiment in the second state;

FIG. 15 is a circuit diagram illustrating a configuration example of an output circuit included in the semiconductor memory device according to the second embodiment;

FIG. 16 is a block diagram illustrating a configuration example of an input/output control circuit included in the semiconductor memory device according to the second embodiment;

FIG. 17 is a table illustrating a relationship between the logic level and the voltage of each signal in the semiconductor memory device according to the second embodiment and a seventh embodiment;

FIG. 18 is a circuit diagram illustrating a configuration example of an output circuit included in a semiconductor memory device according to a third embodiment;

FIG. 20 is a table illustrating a relationship between the logic level and the voltage of each signal in the semiconductor memory device according to the third embodiment;

FIG. 22 is a block diagram illustrating a configuration example of an input/output control circuit included in the semiconductor memory device according to the fourth embodiment;

FIG. 23 is a table illustrating a relationship between the logic level and the voltage of each signal in the semiconductor memory device according to the fourth embodiment;

FIG. 24 is a circuit diagram illustrating a configuration example of an output circuit included in a semiconductor memory device according to a fifth embodiment;

FIG. 26 is a circuit diagram illustrating a configuration example of a main driver included in a semiconductor memory device according to a modification of the first embodiment;

FIG. 27 is a circuit diagram illustrating a configuration example of a pre-driver included in a semiconductor memory device according to a modification of the first embodiment;

FIG. 30 is a circuit diagram illustrating a configuration example of an output circuit included in a semiconductor memory device according to a modification of the fourth embodiment;

FIG. 31 is a diagram illustrating an example of a cross-sectional structure of a pre-driver included in the semiconductor memory device according to the second embodiment;

FIG. 34 is a graph illustrating an output waveform of the output circuit according to the seventh embodiment and an output waveform of the output circuit according to the second embodiment.

DETAILED DESCRIPTION

Figure 1:
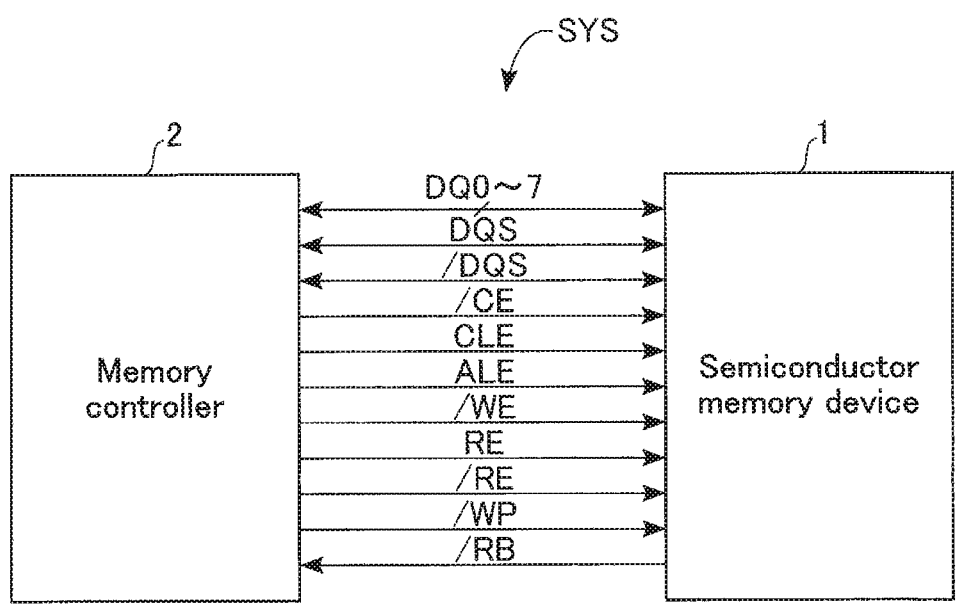
FIG. 1 is a block diagram illustrating a configuration example of a memory system including a semiconductor memory device according to a first embodiment.

In general, according to one embodiment, an output circuit includes a first power supply line, a second power supply line, a third power supply line, a pad, a first transistor, a second transistor, and a first circuit. A first end of the first transistor is coupled to the first power supply line. A second end of the first transistor is coupled to the pad. A first end of the second transistor is coupled to the second power supply line. A second end of the second transistor is coupled to the pad. The first circuit is coupled to each of the third power supply line and a gate of the first transistor. A first voltage is applied to the first power supply line. A second voltage which is lower than the first voltage is applied to the second power supply line. A third voltage which is different from both the first and second voltages is applied to the third power supply line. In a first case, the first circuit applies a fourth voltage to the gate of the first transistor. In a second case, the first circuit causes the third power supply line and the gate of the first transistor to be electrically non-coupled.

Hereinafter, embodiments will be described with reference to the accompanying drawings. Each embodiment exemplifies a device and a method for embodying the technical idea of the invention. The drawings are schematic or conceptual, and the dimensions, ratios, etc. in the drawings are not necessarily the same as those of actual products. The technical idea underlying the present invention is not limited by the shapes, structures, arrangements, etc. of the structural elements.

In the description below, elements having substantially the same functions and configurations will be denoted by the same reference symbols. The numbers after the letters of reference symbols are used to distinguish between elements that have the same structure and that are referenced by reference signs that contain the same characters. Where elements denoted by reference symbols including the same letters need not be discriminated from each other, they will be denoted by reference symbols including only letters.

[1] First Embodiment

In the description below, a semiconductor memory device 1 according to a first embodiment will be described.

[1-1] Configuration

FIG. 1 illustrates a configuration example of a memory system SYS including the semiconductor memory device 1 according to the first embodiment. As illustrated in FIG. 1, the memory system SYS includes a semiconductor memory device 1 and a memory controller 2. The semiconductor memory device 1 is, for example, a NAND flash memory. The memory system SYS is coupled to external host equipment (not illustrated) and executes an operation, such as storing, reading, etc. of data, in accordance with an instruction from the host equipment.

The semiconductor memory device 1 and the memory controller 2 are coupled via, for example, a NAND bus. The communications through the NAND bus encompass, for example, signals DQ0 to DQ7, DQS, /DQS, /CE, CLE, ALE, /WE, RE, /RE, /WP, and /RB.

The signals DQ0 to DQ7 are each, for example, an 8-bit signal, and are transmitted and received between the semiconductor memory device 1 and the memory controller 2. The signals DQ0 to DQ7 are data objects transmitted and received between the semiconductor memory device 1 and the memory controller 2, and each may contain any one of a command, an address, and data.

The signals DQS and /DQS are transmitted and received between the semiconductor memory device 1 and the memory controller 2. The signals DQS and /DQS are used to control the operation timing when the signals DQ0 to DQ7 are received.

The signal /CE is transmitted from the memory controller 2 to the semiconductor memory device 1. The signal /CE is a signal to bring the semiconductor memory device 1 into a selected state or non-selected state. For example, in the case where a plurality of semiconductor memory devices are coupled to a memory controller, the memory controller 2 can select a semiconductor memory device to be operated using the signal /CE. Where the signal /CE is at the "H" level, the memory controller 2 brings the semiconductor memory device 1 into a non-selected state. Where the signal /CE is at the "L" level, the memory controller 2 brings the semiconductor memory device 1 into a selected state.

Each of the signals CLE, ALE, /WE, RE, /RE, and /WP is transmitted from the memory controller 2 to the semiconductor memory device 1. The signal CLE is a signal for reporting that the signals DQ0 to DQ7 are commands. The signal ALE is a signal for reporting that the signals DQ0 to DQ7 are addresses. The signal /WE is a signal for instructing the semiconductor memory device 1 to fetch the signals DQ0 to DQ7. The signals RE and /RE are signals for instructing the semiconductor memory device 1 to output the signals DQ0 to DQ7. In addition, the signals RE and /RE control the operation timing of the semiconductor memory device 1 at the time of outputting the signals DQ0 to DQ7. The signal /WP is a signal to cause the semiconductor memory device 1 to inhibit write and erase operations.

The signal /RB is transmitted from the semiconductor memory device 1 to the memory controller 2. The signal /RB is a signal to indicate whether the semiconductor memory device 1 is in a ready state (in a state where the semiconductor memory device 1 can accept a command from the outside) or a busy state (in a state where the semiconductor memory device 1 cannot accept a command from the outside).

FIG. 2 illustrates a configuration example of the semiconductor memory device 1. As illustrated in FIG. 2, the semiconductor memory device 1 operates using voltages VCC, VCCQ, and VSS supplied from the outside. VCC is a voltage on the order of, for example, 2.5 V. VCCQ is a voltage of the order of, for example, 1.2 V. In the present embodiment, VCC is a voltage higher than VCCQ. VSS is, for example, a ground voltage of 0 V. Furthermore, the semiconductor memory device 1 includes, an input/output module 10, a logic control circuit 11, a register 12, a sequencer 13, a memory cell array 14, a row decoder 15, a sense amplifier 16, a driver set 17, and a power supply circuit 18. The voltage VCC (Voltages VDD, VDD1, and VDD2 generated from the voltage VCC, which will be described later) is supplied to, for example, the logic control circuit 11, register 12, sequencer 13, memory cell array 14, row decoder 15, sense amplifier 16, driver set 17, and power supply circuit 18. The voltage VCCQ is supplied to, for example, at least part of the input/output module 10.

The input/output module 10 transmits and receives signals DQ0 to DQ7, a signal DQS, and a signal /DQS. The input/output module 10 is coupled to a data bus. The data bus includes a plurality of interconnects through which data is transmitted in the semiconductor memory device 1. For example, the input/output module 10, register 12, and sense amplifier 16 are coupled to the data bus. The input/output module 10 transfers commands and addresses in the signals DQ0 to DQ7 to the register 12. The input/output module 10 transmits write data and read data to and receives write data and read data from the sense amplifier 16. The input/output module 10 generates the signals DQS and /DQS based on the signals RE and /RE.

The logic control circuit 11 receives signals /CE, CLE, ALE, /WE, RE, /RE, and /WP, and transmits the signal /RB. The logic control circuit 11 transmits a signal based on a received signal to the input/output module 10 and sequencer 13.

The register 12 temporarily holds the command and address received via the input/output module 10. The register 12 transfers the address to the row decoder 15 and the sense amplifier 16. The register 12 also transfers the command to the sequencer 13.

The sequencer 13 controls the overall operation of the semiconductor memory device 1. For example, the sequencer 13 receives a command from the register 12, and executes a read operation, etc., based on the received command. The sequencer 13 also controls the input/output module 10 based on the control of the logic control circuit 11.

The memory cell array 14 holds data in a non-volatile manner. The memory cell array 14 includes a plurality of bit lines BL, a plurality of word lines WL, and a plurality of memory cells MC. The plurality of memory cells MC are provided so as to be arrayed, for example, in a row direction and a column direction. The plurality of bit lines are provided correspondingly to the column direction, and coupled to a plurality of memory cells MC corresponding to the same column. The plurality of word lines WL are provided correspondingly to the row direction, and coupled to a plurality of memory cells MC corresponding to the same row.

The row decoder 15 receives a row address in the address from the register 12 and selects a memory cell MC of a row based on said row address. A voltage from the driver set 17 is then transferred to memory cell MC of the selected row via the row decoder 15.

At the time of reading data, the sense amplifier 16 senses read data that has been read out from the memory cell MC to a bit line BL and transfers the sensed read data to the input/output module 10. At the time of writing data, the sense amplifier 16 transfers written data which has been written via a bit line EL to a memory cell MC. In addition, the sense amplifier 16 receives a column address in an address from the register 12 and outputs data of a column based on the column address.

The driver set 17 generates a voltage used for the operations of the memory cell array 14, the row decoder 15, and the sense amplifier 16.

The power supply circuit 18 generates a power supply voltage used in the semiconductor memory device 1. For example, the power supply circuit 18 generates various voltages used in the input/output module 10, using a voltage VCC.

Figure 3:
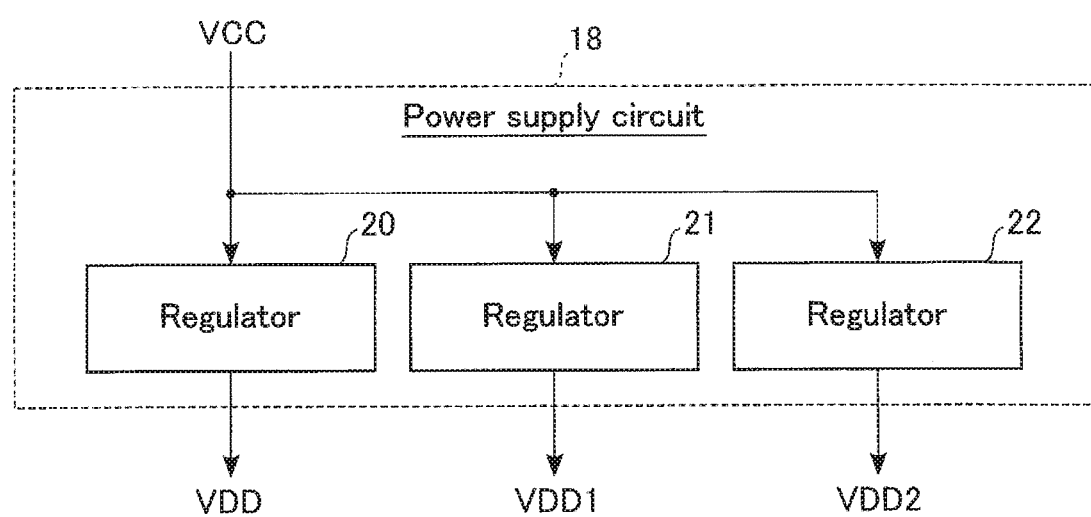
FIG. 3 is a block diagram illustrating a configuration example of a power supply circuit included in the semiconductor memory device according to the first embodiment.

FIG. 3 illustrates a configuration example of the power supply circuit 18. As illustrated in FIG. 3, the power supply circuit 18 includes a regulator 20, a regulator 21, and a regulator 22. The regulator 20 generates a voltage VDD from the voltage VCC. The regulator 21 generates a voltage VDD1 from the voltage VCC. The regulator 22 generates a voltage VDD2 from the voltage VCC. Details of the voltages VDD, VDD1, and VDD2 will be described later.

FIG. 4 illustrates a configuration example of the input/output module 10. As illustrated in FIG. 4, the input/output module 10 includes input/output units 30-0 to 30-9, an input/output control circuit 40, and pads 50-0 to 50-9. Each of the input/output units 30 is coupled to corresponding pad 50. The input/output units 30-0 to 30-7 correspond to the signals DQ0 to DQ7, respectively. The input/output unit 30-8 corresponds to the signal DQS. The input/output unit 30-9 corresponds to the signal /DQS. The input/output units 30-0 to 30-7 are coupled to the data bus. The input/output units 30-8 and 30-9 are coupled to the logic control circuit 11. The input/output control circuit 40 receives a signal STBY from the logic control circuit 11. The signal STBY is a signal based on the signal /CE. The input/output control circuit 40 controls the input/output units 30-0 to 30-9 based on the signal STBY.

Figure 5:
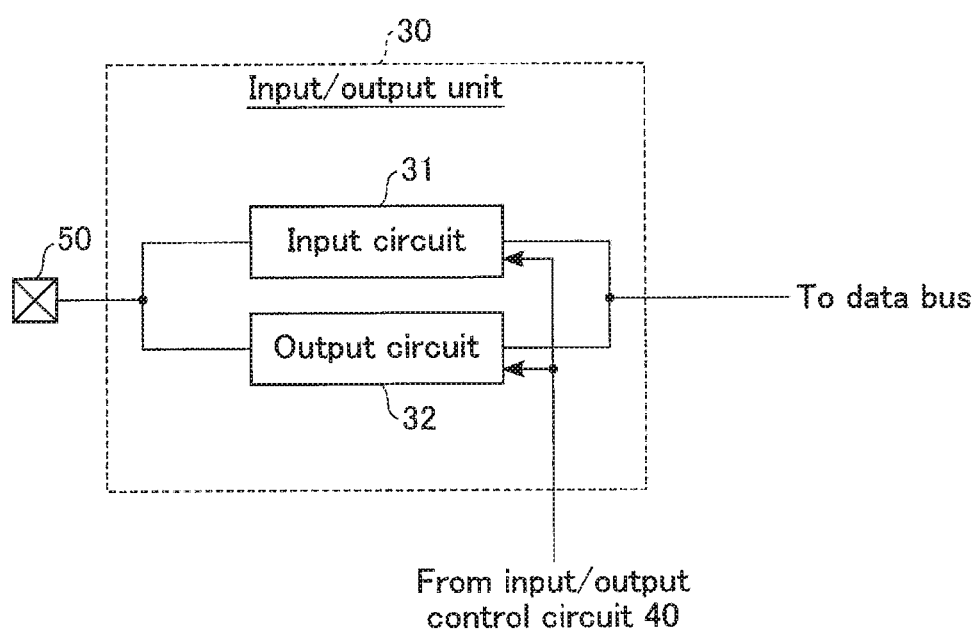
FIG. 5 is a block diagram illustrating a configuration example of an input/output unit included in the input/output module, which is included in the semiconductor memory device according to the first embodiment.

FIG. 5 illustrates a configuration example of the input/output unit 30. As illustrated in FIG. 5, the input/output unit 30 includes an input circuit 31 and an output circuit 32. The input circuit 31 and the output circuit 32 are coupled in parallel between a pad 50 and the data bus. When a signal is input in the pad 50, the input circuit 31 receives the signal input in the pad 50 and transfers the received signal to the data bus. When the signal is output from the pad 50, the output circuit 32 receives the signal of the data bus and outputs the received signal to the pad 50. The input circuit 31 and the output circuit 32 are respectively controlled by the input/output control circuit 40.

Figure 6:
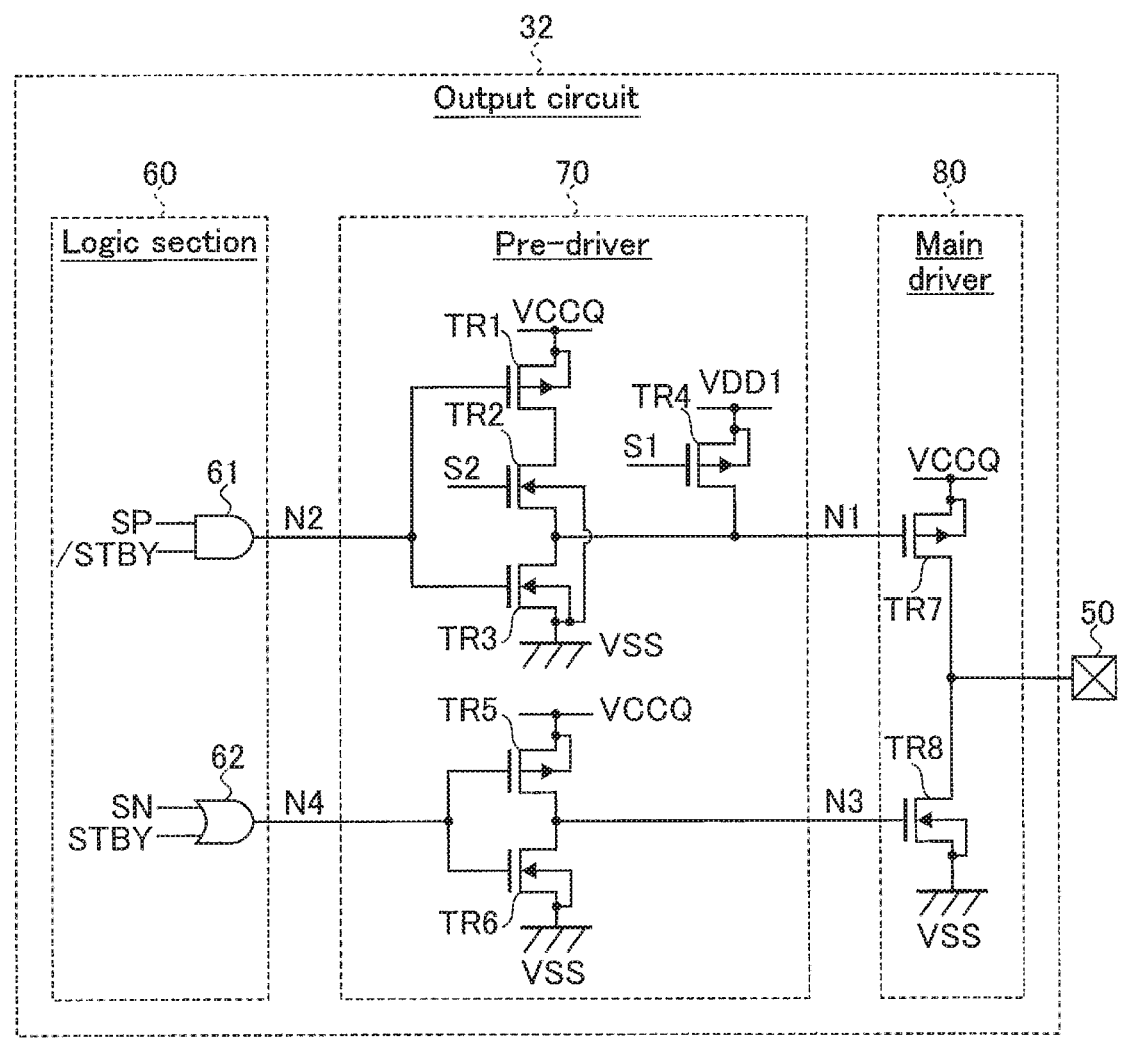
FIG. 6 is a circuit diagram illustrating a configuration example of an output circuit included in the input/output module, which is included in the semiconductor memory device according to the first embodiment.

FIG. 6 illustrates a configuration example of the output circuit 32. As illustrated in FIG. 6, the output circuit 32 includes a logic section 60, a pre-driver 70, and a main driver 80.

The logic section 60 outputs a signal that has been input in the output circuit 32 or a standby voltage to the pre-driver 70, based on the signal STBY. The logic section 60 includes an AND gate 61 and an OR gate 62. The AND gate 61 performs an AND operation of a signal SP and a signal /STBY, and outputs an operation result to a node N2. The OR gate 62 performs an OR operation of a signal SN and the signal STBY, and outputs an operation result to a node N4. The signals SP and SN are, for example, signals that have been input from the data bus into the output circuit 32.

The pre-driver 70 outputs a signal that input from the logic section 60 or stand-by voltage to a main driver 80, based on the signal STBY. The pre-driver 70 includes transistors TR1 to TR6. The transistors TR1, TR4, and TR5 are, for example, P-type MOSFETs (PMOS). The transistors TR2, TR3, and TR6 are, for example, N-type MOSFETs (NMOS).

The voltage VCCQ is applied to each of the source and the back gate of the transistor TR1. The gate of the transistor TR1 is coupled to the node N2. The drain of the transistor TR1 is coupled to the drain of the transistor TR2. The source of the transistor TR2 is coupled to a node N1. The back gate of the transistor TR2 is grounded signal S2 is applied to the gate of the transistor TR2. The source and the back gate of the transistor TR3 are respectively grounded. The drain of the transistor TR3 is coupled to the node N1. The gate of the transistor TR3 is coupled to the node N2. The voltage VDD1 is applied to each of the source and the back gate of the transistor TR4. The drain of the transistor TR4 is coupled to the node N1. A signal S1 is applied to the gate of the transistor TR4.

The voltage VCCQ is applied to each of the source and the back gate of the transistor TR5. The drain of the transistor TR5 is coupled to a node N3. The gate of the transistor TR5 is coupled to the node N4. The source and the back gate of the transistor TR6 are grounded. The drain of the transistor TR6 is coupled to the node N3. The gate of the transistor TR6 is coupled to the node N4.

The main driver 80 outputs a voltage to the pad 50, based on the output of the pre-driver, or brings the output node of the main driver 80 into a high-impedance state. The main driver 80 includes the transistor TR7 and the transistor TR8. The voltage VCCQ is applied to each of the source and the back gate of the transistor TR7. The drain of the transistor TR7 is coupled to the pad 50. The gate of the transistor TR7 is coupled to the node N1. The source and the back gate of the transistor TR8 are respectively grounded. The drain the transistor TR8 is coupled to the pad 50. The gate of the transistor TR8 is coupled to the node N3. The drain of the transistor TR7 and the drain of the transistor TR8 also serve as output nodes of the main driver 80. The output impedance of the main driver 80 is based on the ON resistance of the transistor TR7 or TR8. The output impedance of the output circuit 32 is based on the output impedance of the main driver 80.

A plurality of voltages are supplied to the output circuit 32. The voltage VDD is supplied to the logic section 60. The voltage VCCQ and a voltage different from the voltage VCCQ are supplied to the pre-driver 70. The voltage different from the voltage VCCQ is, for example, the voltage VDD1. The voltage VCCQ is supplied to the main driver 80. The signals STBY, /STBY, S1, and S2 are signals output by the input/output control circuit 40. The signal STBY may be input in the input/output unit 30 without going through the input/output control circuit 40.

Figure 7:
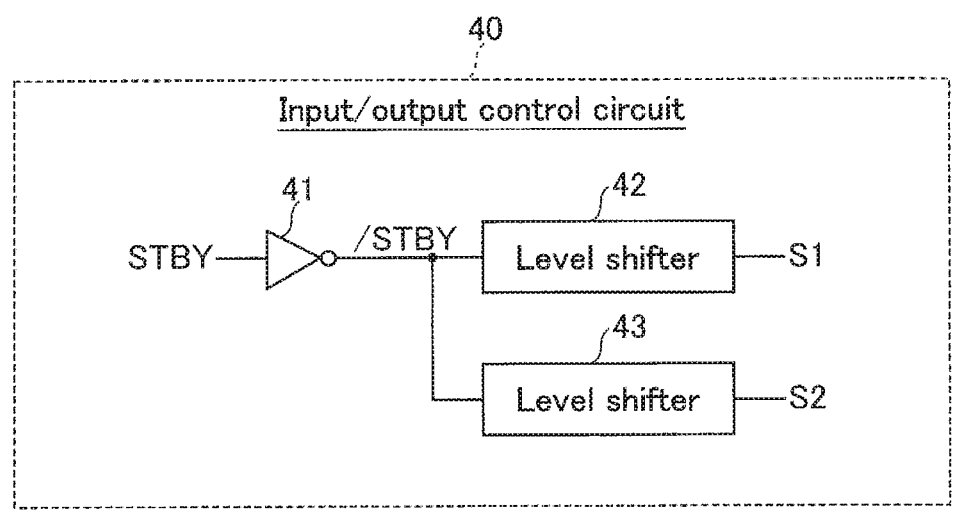
FIG. 7 is a block diagram illustrating a configuration example of an input/output control circuit included in the input/output module, which is included in the semiconductor memory device according to the first embodiment.

FIG. 7 illustrates the configuration of the input/output control circuit 40. As illustrated in FIG. 7, the input/output control circuit 40 includes an inverter 41 and level shifters 42 and 43. The inverter 41 outputs a signal /STBY in which the signal STBY is logically inverted. The level shifter 42 outputs a signal S1 in which a voltage of the "H" level of the signal STBY is shifted to the voltage VDD1. The level shifter 43 outputs a signal S2 in which a voltage of the "H" level of the signal /STBY is shifted to the voltage VDD2.

[1-2] Operations

Next, the operations of the semiconductor memory device 1 according to the first embodiment will be described. In the first embodiment, it is assumed that the voltage VCC is greater than the voltages VDD, VDD1, and VDD2, the voltage VDD1 is greater than the voltage VDD, the voltage VDD2 is greater than the voltages VDD and VDD1, and the voltage VDD2 is equal to or greater than a sum of the voltage VCCQ and the threshold voltage of the transistor TR2. The output circuit 32 included in the semiconductor memory device 1 according to the first embodiment performs different operations in accordance with the logic level of the signal STBY. Hereinafter, details of the various signals and the operations of the output circuit 32 will be described in sequence.

Figure 8:
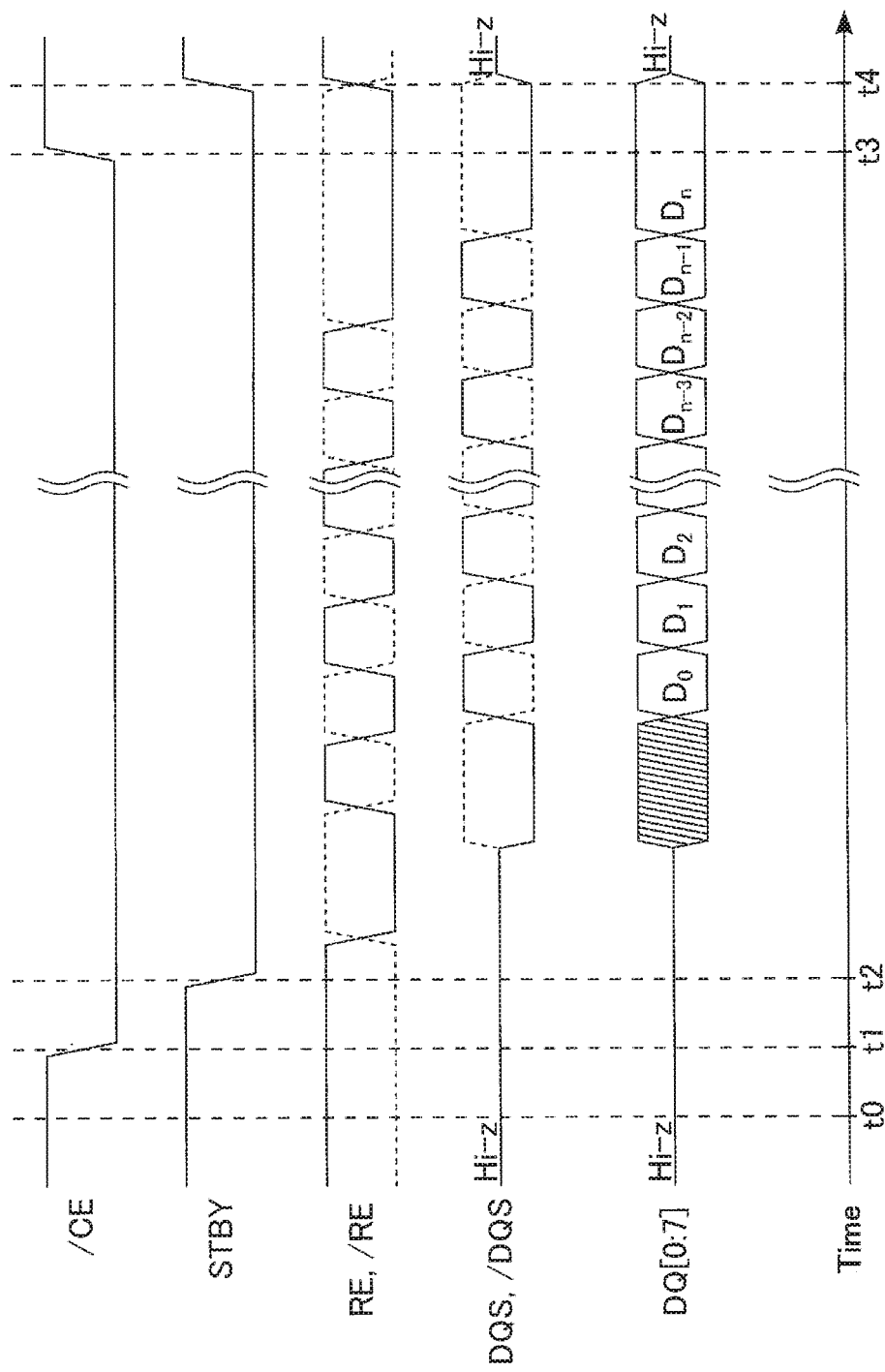
FIG. 8 is a timing chart illustrating an example of various signals transmitted to or received by the semiconductor memory device according to the first embodiment.

FIG. 8 is a timing chart illustrating an example of various signals transmitted to or received by the semiconductor memory device 1 according to the first embodiment. FIG. 8 illustrates an example of operations of signals DQS, /DQS, DQ0 to DQ7, /CE, /RE, and RE when a plurality of output circuits 32 output the signals to the memory controller 2. At time t0, the signal /CE is at the "H" level, and the semiconductor memory device 1 is in a non-selected state. The signal STBY is at the "H" level, and respective output nodes of the output circuits 32 are in a high-impedance state. At time t1, the memory controller 2 transitions the signal /CE from the "H" level to the "L" level. In response to the transition of the signal /CE to the "L" level, the semiconductor memory device 1 enters a selected state. Subsequently, at time t2, the logic control circuit 11 of the semiconductor memory device 1, which has entered into the selected state, transitions the signal STBY from the "H" level to the "L" level, based on the signal /CE. In response to the transition of the signal STBY to the "L" level, the respective output circuits 32 enter a state of enabling outputting of a signal. Subsequently, the signals DQS, /DQS, and DQ0 to DQ7 are sequentially output from the plurality of output circuits 32, based on the signals RE and /RE received from the memory controller 2. Subsequently, when the semiconductor memory device 1 has completed outputting of data, the memory controller 2 transitions the signal/CE to the "H" level at time t3. Based on the fact that the signal /CE has been transitioned to the "H" level, the logic control circuit 11 transitions the signal STBY to the "H" level at time t4. When the signal STBY transitions to the "H" level, the output nodes of the output circuits 32 enter a high-impedance state. Details of this operation will be described later.

In this way, the semiconductor memory device 1 according to the first embodiment transmits the signals DQS, /DQS, and signals DQ0 to DQ7 during the time the signal STBY is at the "L" level. In addition, the semiconductor memory device 1 brings the output node of each of the output circuits 32 corresponding to the signal DQS, /DQS, and the signals DQ0 to DQ7 to the high-impedance state.

FIG. 9 illustrates a relationship between a logic level and a voltage of each of the signals in the semiconductor memory device 1 according to the first embodiment. The signal STBY is a signal based on a chip enable signal /CE. As illustrated in FIG. 9, the semiconductor memory device 1 according to the first embodiment possibly enter a first state and a second state.

In the first state, the signals STBY, /STBY, S1, and S2 are controlled to be at the "H" level, "L" level, "L" level, and "L" level, respectively. At that time, the output nodes of the output circuits 32 enter a high-impedance state. In the description below, the first state is referred to as a "stand-by state of the output circuits 32". That is, when the signal STBY is at the "H" level, the output circuits 32 enter the stand-by state.

In the second state, the signals STBY, /STBY, S1, and S2 are controlled to be at the "L" level, "H" level, "H" level, and "H" level, respectively. At that time, the output circuits 32 enter a state of enabling output of a signal based on the signals SP and SN. In the description below, the second state is referred to as an "active state of the output circuits 32". That is, when the signal STBY is at the "L" level, the output circuits enter the active state.

As described above, the respective output circuits 32 in the input/output module 10 can be controlled to be in the stand-by state or active state based on the signal STBY. The "H" level of the signal STBY corresponds to the voltage VDD. The "L" level of the signal STBY corresponds to the voltage VSS. The "H" level of the signal /STBY corresponds to the voltage VDD. The "L" level of the signal /STBY corresponds to the voltage VSS. The "H" level of the signal S1 corresponds to the voltage VDD1. The "L" level of the signal S1 corresponds to the voltage VSS. The "H" level of the signal S2 corresponds to the voltage VDD2. The "L" level of the signal S2 corresponds to the voltage VSS.

Figure 10:
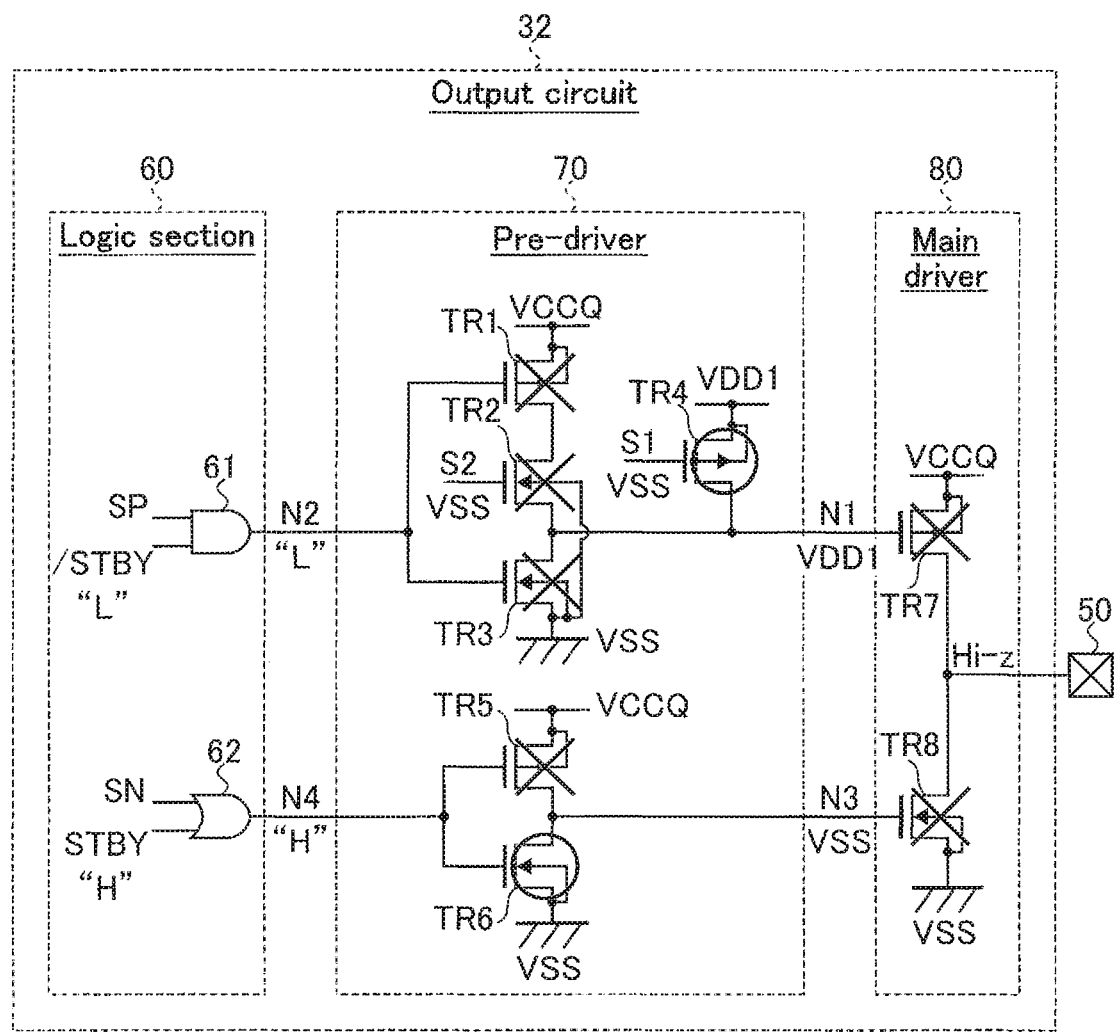
FIG. 10 is a circuit diagram illustrating an example of an operation of the output circuit included in the semiconductor memory device according to the first embodiment in a first state.

FIG. 10 illustrates an example of the operation of an output circuit 32 in the first state included in the semiconductor memory device 1 according to the first embodiment. In the first state, the signal STBY is in the stand-by state since the signal is at the "H" level. A description will be given in the order of the logic section 60, pre-driver 70, and main driver 80 in the output circuit 32 in the stand-by state.

The operation of the logic section 60 will be described. A signal /STBY of the "L" level is input in the AND gate 61. Therefore, the AND gate 61 outputs the "L" level to the node N2, irrespective of the logic level of the signal SP. The "L" level output by the AND gate 61 is, for example, the voltage VSS. A signal STBY of the "H" level is input in the OR gate 62. Therefore, the OR gate outputs the "H" level to the node N4, irrespective of the logic level of the signal SN. The "H" level output by the OR gate 62 is, for example, the voltage VCCQ.

The operation of the pre-driver 70 will be described. The PMOS transistor TR4 enters the ON state since a signal S1 with the voltage VSS has been applied to the gate. The NMOS transistor TR3 enters the OFF state since the "L" level has been applied to the gate from the node N2. The NMOS transistor TR2 enters the OFF state since a signal S2 with the voltage VSS has been applied to the gate. The PMOS transistor TR1 enters the ON state since the "L" level has been applied to the gate from the node N2, but since the transistor TR2 coupled to the drain of the PMOS transistor TR1 is in the OFF state, no current flows to the PMOS transistor TR1. Therefore, the PMOS transistor TR1 enters substantially the OFF state. As a result, the voltage of the node N1 is determined to be the voltage VDD1 by the transistor TR4 which has entered the ON state. The PMOS transistor TR5 enters the OFF state since the "H" level has been applied to the gate from the node N4. The NMOS transistor TR6 enters the ON state since the "H" level has been applied to the gate from the node N4. As a result, the voltage of the node N3 is determined to be the voltage VSS by the transistor TR6 which has entered the ON state.

The operation of the main driver 80 will be described. The PMOS transistor TR7 enters the OFF state since the voltage VDD1 has been applied to the gate from the node N1. The NMOS transistor TR8 enters the OFF state since the voltage VSS has been applied to the gate from the node N3. As a result, the output node of the output circuit 32 enters a high-impedance state.

In this way, in the output circuit 32 in the stand-by state, the transistors TR7 and TR8 enter the OFF state, and the output node of the output circuit 32 enters a high-impedance state. At that time, the voltage VDD1 has been applied to the gate of the PMOS transistor TR7.

Figure 11:
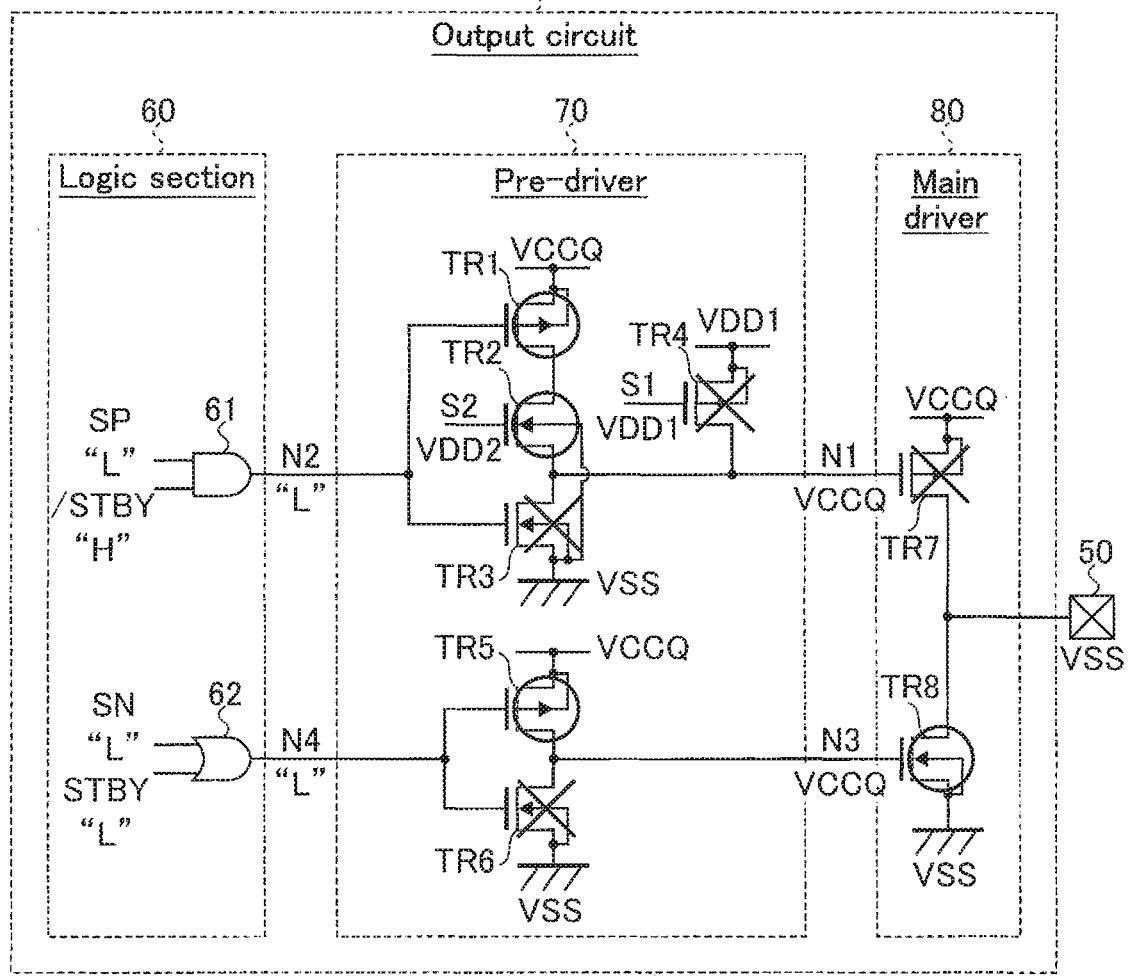
FIG. 11 is a circuit diagram illustrating an example of an operation of the output circuit included in the semiconductor memory device according to the first embodiment in a second state.

FIG. 11 illustrates an example of the operation of an output circuit 32 in the second state included in the semiconductor memory device 1 according to the first embodiment. In the second state, since the signal STBY is at the "L" level, the output circuit 32 is in an active state. In the example illustrated in FIG. 11, the output circuit 32 in the active state has output the "L" level. A description will be given in the order of the logic section 60, the pre-driver 70, and the main driver 80.

The operation of the logic section 60 will be described. In the second state, the signal STBY is at the "L" level, and the signal /STBY is at the "H" level. The AND gate 61 performs an AND operation of the logic level of the signal SP and the "H" level of the signal /STBY, and outputs an operation result to the node N2. In the example illustrated in FIG. 11, the signal SP is at the "L" level, and AND gate 61 therefore outputs the "L" level to the node N2. The "L" level output by the AND gate 61 is, for example, the voltage VSS. The OR gate 62 performs an OR operation of the logic level of a signal SN and the "L" level of the signal STBY, and outputs an operation result to the node N4. In the example illustrated in FIG. 11, the signal SN is at the "L" level, and the OR gate 62 therefore outputs the "L" level to the node N4. The "L" level output by the OR gate 62 is, for example, the voltage VSS.

The operation of the pre-driver 70 will be described. The PMOS transistor TR4 enters the OFF state since a signal S1 with the voltage VDD1 has been applied to the gate. The PMOS transistor TR1 enters the ON state since the "L" level has been applied to the gate from the node N2. The PMOS transistor TR2 enters the ON state since a signal S2 with the voltage VDD2 has been applied to the gate. The PMOS transistor TR3 enters the OFF state since the "L" level has been applied to the gate from the node N2. As a result, the voltage VCCQ is transmitted to the node N1 via the PMOS transistors TR1 and NMOS transistor TR2 which have entered the ON state. Here, the voltage VDD2 that has been applied to the gate of the NMOS transistor TR2 is greater than a sum of the threshold voltage of the transistor TR2 and the voltage VCCQ. Therefore, the voltage VCCQ supplied from the source of the PMOS transistor TR1 is directly transmitted to the node N1, without falling due to a threshold drop (Vth drop) by the NMOS transistor TR2. The PMOS transistor TR5 enters the ON state since the "L" level has been applied to the gate, and the voltage between the gate and the source is greater than the threshold voltage. The NMOS transistor TR6 enters the OFF state since the "L" level has been applied to the gate from the node N4, and the voltage between the gate and the source is substantially 0 V. As a result, the voltage VCCQ is applied to the node N3 via the PMOS transistor TR5 which has entered the ON state.

The operation of the main driver 80 will be described. The PMOS transistor TR7 enters the OFF state since the voltage VCCQ has been applied to the gate from the node N1, and the voltage between the gate and the source is substantially 0 V. The NMOS transistor TR8 enters the ON state since the voltage VCCQ has been applied to the gate from the node N3, and the voltage between the gate and the source is greater than the threshold voltage. As a result, the voltage VSS is applied to the pad 50 via the transistor TR8 which has entered the ON state.

FIG. 12 illustrates an example of the operation of the output circuit 32 in the second state included in the semiconductor memory device 1 according to the first embodiment. In the example illustrated in FIG. 12, the output circuit 32 in the active state has output the "H" level. A description will be given in the order of the logic section 50, the pre-driver 70, and the main driver 80.

The operation of the logic section 60 will be described. In the second state, the signal STBY is at the "L" level, and the signal /STBY is at the "H" level. The AND gate 61 performs an AND operation of the logic level of the signal SP and the "H" level of the signal /STBY, and outputs an operation result to the node N2. In the example illustrated in FIG. 12, the signal SP is at the "H" level, and AND gate 61 therefore outputs the "H" level to the node N2. The "H" level output by the AND gate 61 is, for example, the voltage VCCQ. The OR gate 62 performs an OR operation of the logic level of the signal SN and the "L" level of the signal STBY, and outputs an operation result to the node N4. In the example illustrated in FIG. 12, the signal SN is at the "H" level, and the OR gate 62 therefore outputs the "H" level to the node N4. The "H" level output by the OR gate 62 is, for example, the voltage VCCQ.

The operation of the pre-driver 70 will be described. The transistor TR4 enters the OFF state since a signal S1 with the voltage of VDD1 has been applied to the gate. The voltage between the gate and the source of the transistor TR1 is substantially 0 V, and the transistor TR1 therefore enters the OFF state. A voltage VDD2, which is a voltage greater than a sum of the threshold voltage of the transistor TR2 and the voltage VCCQ, has been applied to the gate of the transistor TR2. However, since the transistor TR1 is in the OFF state, the transistor TR2 does not apply the voltage to the node N1. The transistor TR3 enters the ON state since the voltage between the gate and source is greater than the threshold voltage. As a result, the voltage VSS is supplied to the node N1 via the transistor TR3 which has entered the ON state. The transistor TR5 enters the OFF state since the voltage between the gate and the source is substantially 0 V. The transistor TR6 enters the ON state since the voltage between the gate and the source is greater than the threshold voltage. As a result, the voltage VSS is applied to the node N3 via the transistor TR6 which has entered the ON state.

The operation of the main driver 80 will be described. The transistor TR7 enters the ON state since the voltage between the gate and the sources is greater than the threshold voltage. The transistor TR8 enters the OFF state since the voltage between the gate and the source is substantially 0 V. As a result, the voltage VCCQ is applied to the pad 50 via the transistor TR7 which has entered the ON state.

As described with reference to FIGS. 11 and 12, the output circuit 32 included in the semiconductor memory device 1 according to the first embodiment can control, in the active state, the voltage of the node N1 to be set to the voltage VCCQ or VSS and output the "H" level or "L" level to the output node.

[1-3] Advantageous Effects of First Embodiment

According to the semiconductor memory device 1 according to the first embodiment described above, it is possible to suppress leakage current in the stand-by state. In the description below, details of the advantageous effects of the semiconductor memory device 1 according to the first embodiment will be described.

For signal transmission from a semiconductor memory device to a memory controller, impedance matching is required to maintain the signal quality. Specifically, an output circuit, a transmission line, and a receiver circuit are configured such that the output impedance of the output circuit, the characteristic impedance of the transmission line, and the input impedance of the receiver circuit are matched one another. To perform communication at high speed, it is preferable to establish the impedance matching at a low impedance.

To make the output impedance of the output circuit low, the current supply ability of the main driver may be increased. Specifically, for example, a large-size transistor may be used for the main driver. However, when the size of the transistor is increased, the circuit area on the top surface of the semiconductor substrate increases, and the leakage current of the transistor may increase. Alternatively, to increase the current supply ability of the main driver, a transistor with a low threshold voltage may be used for the main driver. A transistor with a low threshold voltage has a greater current supply ability than that of a transistor with a high threshold voltage, even though these transistors have the same size. Therefore, by using a transistor with a low threshold voltage in the main driver, it is possible to increase the current supply ability while suppressing a circuit area of the transistor. However, when a transistor with a low threshold voltage is used, leakage current may increase in comparison with the case of using a transistor with a high threshold voltage.

The leakage current of a transistor may change depending on the characteristic of the transistor and the bias state of the transistor. The characteristics of the transistor vary depending on the manufacturing process, for example. Some transistor may have the characteristics in which the leakage current is minimized at a strong reverse bias state. On the other hand, other transistors may have the respective characteristics in which the leakage current is minimized at a weak reverse bias state, a zero-bias state, or a weak forward bias state. For example, the transistor TR7 has the characteristics in which the leakage current becomes smaller at a reverse bias state as compared with that at a zero bias state.

Hence, in the semiconductor memory device 1 according to the first embodiment, the voltage VDD1 is applied, in the stand-by state, to the node N1. The voltage VDD1 is a voltage higher than the voltage VCCQ. Therefore, the PMOS transistor TR7 enters a reverse bias state since the voltage VCCQ is applied to the source, and the voltage VDD1 which is higher than the voltage VCCQ is applied to the gate. With this configuration, it is possible for the semiconductor memory device 1 according to the first embodiment to suppress, in the stand-by state, the leakage current of the transistor TR7. The leakage current of the transistor TR7 is suppressed, and thereby the electric power consumption of the semiconductor memory device 1 can be reduced.

In addition, to suppress leakage current, a transistor switch with a high cut-off capability may be inserted into a current pathway through which leakage current flows. Specifically, for example, the voltage VCCQ may be applied to the source of the transistor TR7 via the transistor switch, and in the stand-by state, the transistor switch to the OFF state, thereby preventing leakage current from flowing through the current pathway. However, in general, a transistor switch with a high cut-off capability may have a large ON resistance as compared to regular transistors. As, the output impedance of the output circuit becomes a sum of the ON resistance of the transistor switch and the output resistance of the main driver, when the transistor switch with the high cut-off capability is provided between a power supply voltage and an output circuit, it may result in the higher output impedance of the output circuit. Alternatively, to lower the ON resistance of the transistor switch with the high cut-off capability, a larger area is required.

In contrast, in the semiconductor memory device 1 according to the first embodiment, leakage current is suppressed by controlling, in the stand-by state, the gate voltage of the PMOS transistor TR7, out of the PMOS transistor TR7 and NMOS transistor TR8 constituting the main driver 80. Specifically, the voltage of the node N1 in the stand-by state is controlled by controlling the transistor TR2 and the transistor TR4. The transistor TR4 is provided in a size that enables supply of the voltage VDD1 to the node N1 during stand-by state. The transistor TR2 is provided in a size that enables setting, in the active state, the voltage of the node N1 to the voltage VCCQ or the voltage VSS, based on the signal SP. The transistors TR2 and TR4 allow being provided in a small size as compared to the case of providing a switch between the power supply voltage VCCQ and the main driver 80. That is, it is possible to suppress a circuit area by omitting a circuit for suppressing the leakage current.

Furthermore, in the semiconductor memory device 1 according to the first embodiment, the transistor TR2 is controlled to be in the OFF state in accordance with the time when the transistor TR1 enters the ON state during stand-by state to supply the voltage VDD1 to the node N1.

When a transistor is provided on a semiconductor substrate, a diffusion region functioning as a source or drain is provided, for example, in a well region. For example, in the case of a P-type MOSFET, the diffusion region functioning as a source or drain is of a P type, and the well region, in which the diffusion region is provided, is of an N type. When a voltage having a voltage difference higher than the threshold voltage of a PN junction existing between the diffusion region and the well region is applied to the PN junction, the PN junction enters the ON state and can function as a current pathway.

In the semiconductor memory device 1 according to the first embodiment, the transistor TR2 is controlled, in the stand-by state, to enter the OFF state, and thereby the voltage VDD1 is prevented from being applied to the drain of the transistor TR1. With this configuration, it is possible to prevent the PN junction existing in a diffusion region functioning as a drain of the transistor TR1 from entering the ON state to make the current flow, even when the magnitude of the voltage VDD1 is greater than a sum of the voltage VCCQ and the threshold voltage of the PN junction.

In addition, in the semiconductor memory device 1 according to the first embodiment, when controlling, in the active state, the NMOS transistor TR2 to enter the ON state, the voltage VDD2 which is greater than a sum of the voltage VCCQ and the threshold voltage of the transistor TR2 is applied to the gate. The NMOS transistor TR2 can transfer the voltage VCCQ which is supplied to the drain via the transistor TR1 directly to the node N1 coupled to the source, without a so-called threshold drop (Vth drop), by applying the voltage VDD2 to the gate of the NMOS transistor TR2. With this configuration, the transistor TR1, transistor TR2, and transistor TR3 can operate as inverters which output the voltage VCCQ or voltage VSS during the time the transistor TR2 is controlled to be in the ON state.

[1-4] Modification of First Embodiment

In the semiconductor memory 1 according to the first embodiment, the high/low levels of the voltages VCCQ, VDD, VDD1 and VDD2 may be changed suitably in accordance with the characteristic of the transistor. One kind of signal may be used for different purposes in accordance with the high/low level relationship of various voltages, thereby omitting another kind of signal. For a gate voltage allowing minimization of leakage current of a transistor, various cases are considered in accordance with the characteristic of the transistor. For example, when the leakage current can be suppressed by setting the gate voltage to be in a strong reverse bias state, the value of the voltage VDD1 may be determined such that the voltage is in a strong reverse bias state.

In addition, for example in the case where a transistor has a characteristic with a large amount of gate-induced drain leakage (GIDL), when the voltage is set to be in a strong reverse bias state, the amount of leakage current is possibly increased to be greater than in the case of being set to a weak reversed bias state. In this case, it suffices that the value of the voltage VDD1 is determined such that the voltage enters a weak reverse bias state. In addition, for example, when the transistor has a conspicuous GIDL characteristic, a weak forward bias state may sometimes induce a smaller amount of leakage current than in the case of a reverse bias state and a zero bias state. In this case, it suffices that the value of the voltage VDD1 is determined such that the voltage enters a weak forward bias state.

Examples are described for the respective cases. For example, when the voltage is set to be in a strong reverse bias state, the voltage VDD1 is set to a voltage higher than the voltage VDD. For example, when the voltage is set to be in a weak reverse bias state, the voltage VDD1 is set to a voltage lower than the voltage VDD and higher than the voltage VCCQ. For example, when the voltage is set to be in a weak forward bias state, the voltage VDD1 is set to a voltage lower than the voltage VCCQ, and to have a difference between the voltage VDD1 and the voltage VCCQ, which is lower than the threshold voltage of the transistor TR7.

In this way, the voltage VDD1 may be set to have various magnitudes. For the signal S1, a signal with a voltage of the "H" level equal greater than the voltage VDD1 may also serve as the signal S1. For example, when the voltage VDD1 is equal to or lower than the voltage VDD, the signal /STBY may be used in place of the signal S1. For example, when the voltage VDD1 is equal to or lower than the voltage VDD2, the signal S2 may be used in place of the signal S1. When another signal is used in place of the signal S1, the level shifter 42 may be omitted. In addition, when another signal is used in place of the signal S1, and the voltage VDD1 is equal to the voltage VDD, the regulator 21 may be omitted.

The voltage VDD2 and the signal S2 may be changed suitably in accordance with the characteristic of the transistor and the high/low level relationship of the various voltages. It suffices that the voltage VDD2 is a voltage greater than a sum of the voltage VCCQ and the threshold voltage of the transistor TR2. For example, when the voltage VDD is equal to or greater than the sum of the voltage VCCQ and the threshold voltage of the transistor TR2, the signal /STBY may be used in place of the signal S2. For example, when the voltage VDD1 is equal to or greater than the sum of the voltage VCCQ and the threshold voltage of the transistor TR2, the signal S1 may be used in place of the signal S2. In addition, when another signal is used in place of the signal S2, the regulator 22 and the level shifter 43 may be omitted.

Figure 13:
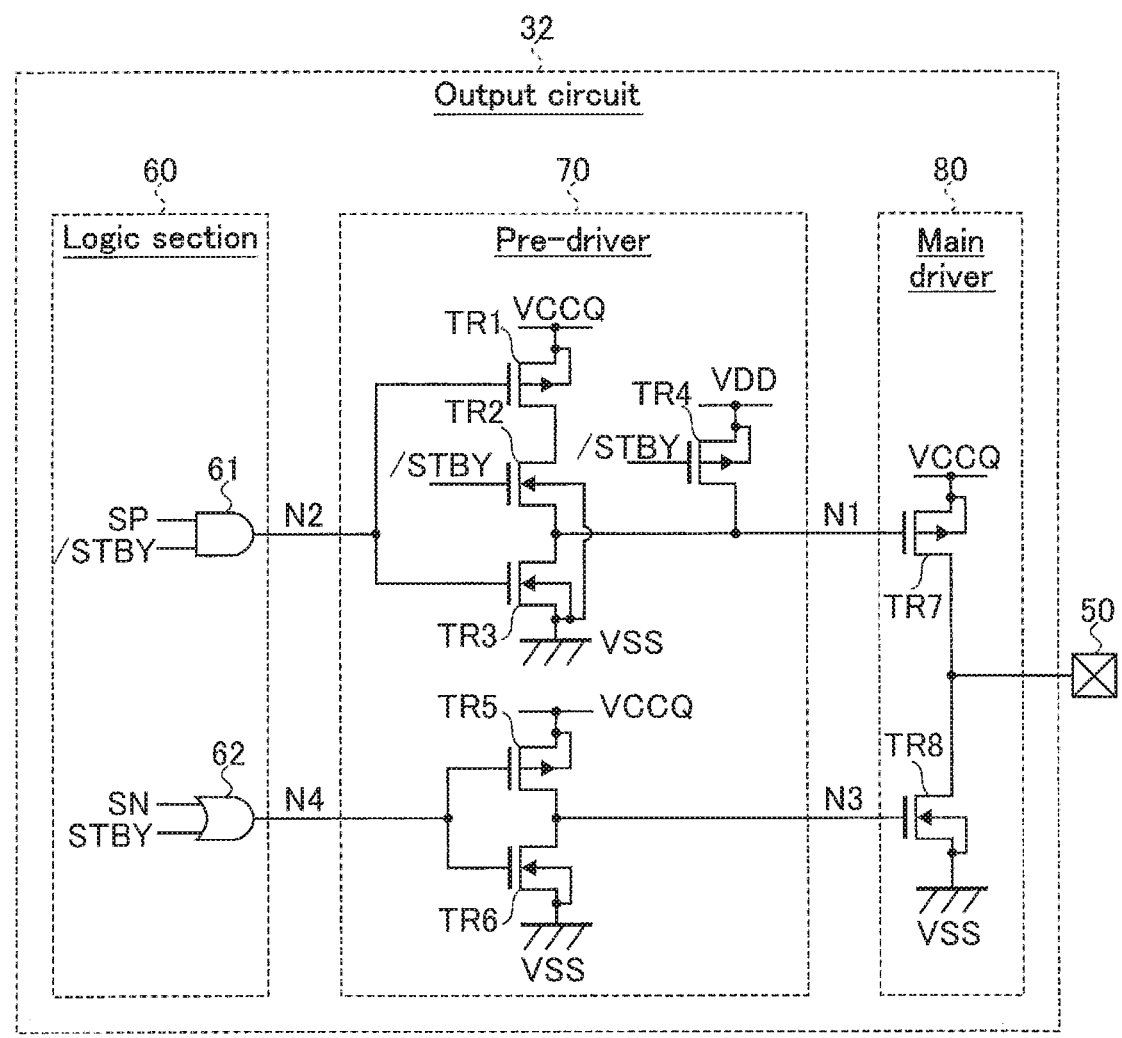
FIG. 13 is a circuit diagram illustrating a configuration example of an output circuit included in a semiconductor memory device according to a modification of the first embodiment.

FIG. 13 illustrates the configuration of an output circuit 32 included in the semiconductor memory device according to a modification of the first embodiment. In the output circuit 32 according to the modification, the voltage VDD is used in place of the voltage VDD1, and the signal /STBY is used in place of the signals S1 and S2, as compared to the output circuit 32 according to the first embodiment. The semiconductor memory device according to the modification allows omission of the regulator 21, regulator 22, and the level shifters 42 and 43, as compared to the semiconductor memory device 1 according to the first embodiment. This allows further suppression of a circuit area.

[2] Second Embodiment

The semiconductor memory device 1 according to a second embodiment differs from the semiconductor memory device 1 according to the first embodiment in the configurations of the power supply circuit 18, pre-driver 71, and input-output control circuit 40. In the description below, a description will be given of the points in which the memory system according to the second embodiment differs from that according to the first embodiment.

[2-1] Configuration

Figure 14:
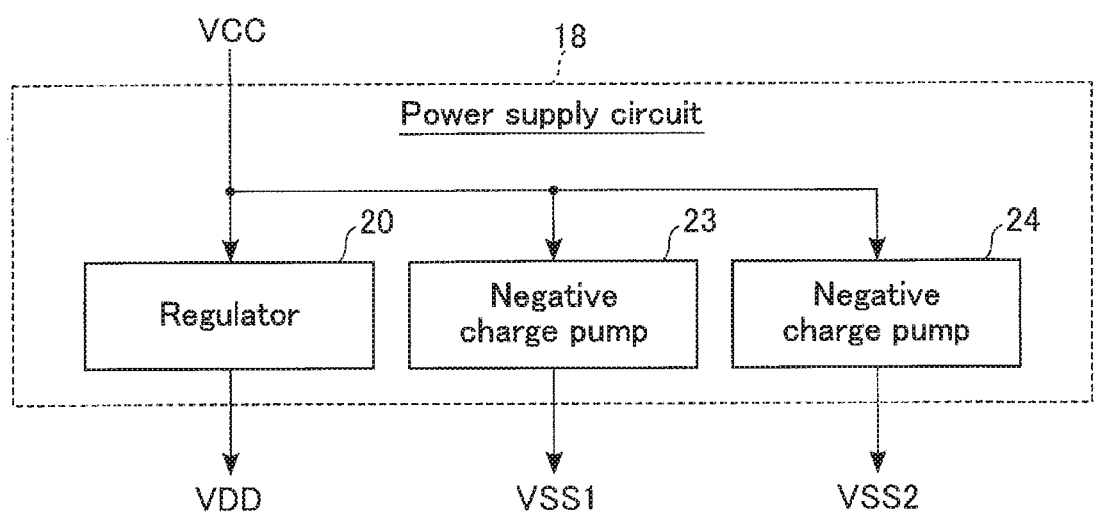
FIG. 14 is a block diagram illustrating a configuration example of a power supply circuit included in a semiconductor memory device according to a second embodiment.

FIG. 14 illustrates an example of the configuration of the power supply circuit 18 included in the semiconductor memory device 1 according to the second embodiment. As illustrated in FIG. 14, the power supply circuit 18 according to the second embodiment has a configuration where the regulators 21 and 22 in the power supply circuit 18 according to the first embodiment are replaced by negative charge pumps 23 and 24, respectively.

The negative charge pump 23 generates a voltage VSS1 from a voltage VCC. The negative charge pump 24 generates a voltage VSS2 from the voltage VCC. Each of the voltages VSS1 and VSS2 is a negative voltage lower than the voltage VSS.

FIG. 15 illustrates a configuration example of an output circuit 32 according to the second embodiment. As illustrated in FIG. 15, in the output circuit 32 according to the second embodiment, the pre-driver 71 includes the transistors TR11 to TR16. The transistors TR11, TR13, and TR14 are, for example, P-type MOSFETs (PMOS). The transistors TR12, TR15, and TR16 are, for example, N-type MOSFETs (NMOS).

A voltage VCCQ is applied to each of the source and the back gate of the transistor TR11. The gate of the transistor TR11 is coupled to a node N2. The drain of the transistor TR11 is coupled to a node N1. The source and the back gate of the transistor TR12 are respectively grounded. The gate of the transistor TR12 is coupled to the node N2. The drain of the transistor TR12 is coupled to the node N1.

The voltage VCCQ is applied to each of the source and the back gate of the transistor TR13. The gate of the transistor TR13 is coupled to a node N4. The drain of the transistor TR13 is coupled to a node N3. The source of the transistor TR14 is coupled to the node N3. The voltage VCCQ is applied to the back gate of the transistor TR14. A signal S4 is applied to the gate of the transistor TR14. The signal S4 is a signal output by the input/output control circuit 40.

The drain of the transistor TR15 is coupled to the drain of the transistor TR14. The source and the back gate of the transistor TR15 are respectively grounded. The gate of the transistor TR15 is coupled to the node N4. A voltage VSS1 is applied to each of the source and the back gate of the transistor TR16. A signal applied to the gate of the transistor TR16. The signal S3 is a signal output by the input/output control circuit 40. The drain of the transistor TR16 is coupled to the node N3.

FIG. 16 illustrates a configuration example of the input/output control circuit 40 according to the second embodiment. As illustrated in FIG. 16, the input/output control circuit 40 according to the second embodiment has a configuration where the level shifters 42 and 43 in the input/output control circuit 40 according to the first embodiment are replaced by level shifters 44 and 45, respectively.

The level shifter 44 outputs the signal S3 in which a voltage with the "L" level of the signal STBY is shifted to the voltage VSS1. The level shifter 45 outputs a signal S4 in which a voltage with the "L" level of the signal STBY is shifted to the voltage VSS2. The other configurations of the semiconductor memory device 1 according to the second embodiment are the same as those of the first embodiment.

[2-2] Operation of Output Circuit 32

Next, the operation of the output circuit 32 in the semiconductor memory device 1 according to the second embodiment will be described. In the second embodiment, it is assumed that the voltages VSS1 and VSS2 are negative voltages lower than the voltage VSS, the absolute value of the voltage VSS2 is greater than the absolute value of the voltage VSS1, and the absolute value of the voltage VSS2 is equal to or greater than the absolute value of the threshold voltage of the transistor TR14.

FIG. 17 illustrates a relationship between the logic level and the voltage of each signal in the semiconductor memory device 1 according to the second embodiment. The "H" level of the signal S3 corresponds to the voltage VDD. The "L" level of the signal S3 corresponds to the voltage VSS1. The "H" level of the signal S4 corresponds to the voltage VDD. The "L" level of the signal S4 corresponds to the voltage VSS2.

First, the operation of a pre-driver 71 according to the second embodiment in the first state will be described. In the first state, the output circuit 32 is in the stand-by state, and the logic level of the node N2 is the "L" level, and the logic level of the node N4 is the "H" level.

The transistor TR11 enters the ON state since the "L" level has been applied to the gate. The transistor TR12 enters the OFF state since the "L" level has been applied to the gate. As a result, the voltage of the node N1 is determined to be the voltage VCCQ by the transistor TR11 which has entered the ON state.

The transistor TR16 enters the ON state since the signal S3 with the voltage of VDD has been applied to the gate. The transistor TR13 enters the OFF state since the "H" level has been applied to the gate. The transistor TR14 enters the OFF state since the signal S4 with the voltage VDD has been applied to the gate. The transistor TR15 enters the OFF state since the transistors TR13 and TR14 are in the OFF state. As a result, the voltage of the node N3 is determined to be the voltage VSS1 by the transistor TR16 which has entered the ON state.

As a result of the fact that in the first state, the pre-driver 71 has operated in this way, each of the transistors TR7 and TR8 of the main driver 80 enters the OFF state, and the output node of the output circuit 32 enters a high-impedance state. At that time, the voltage VSS1 has been applied to the gate of the transistor TR8.

Subsequently, the operation of the pre-driver 71 according to the second embodiment in the second state will be described in sequence for a case where the output circuit 32 has output the "L" level and a case where the output circuit 32 has output the "H" level.

In the second state, the output circuit 32 is in the active state, the logic level of the node N2 is equal to the logic level of the signal SP, and the logic level of the node N4 is equal to the logic level of the signal SN. First, a case will be described where the logic level of the node N2 is the "L" level and the logic level of the node N4 is the "L" level.

The transistor TR11 enters the ON state since the "L" level has been applied to the gate. The transistor TR12 enters the OFF state since the "L" level has been applied to the gate. As a result, the voltage of the node N1 is determined to be the voltage VCCQ by the TR11 which has entered the ON state.

The transistor TR16 enters the OFF state since the signal S3 with the voltage VSS1 has been applied to the gate. The transistor TR13 enters the ON state since the "L" level has been applied to the gate. The transistor TR15 enters the OFF state since the "L" level has been applied to the gate. A signal S4 with the voltage VSS2 which is a voltage lower than the voltage VSS by the threshold voltage of the transistor TR14 or more has been applied to the gate. However, since the transistor TR15 is in the OFF state, the transistor TR14 does not apply the voltage to the node N3. As a result, the voltage of the node N3 is determined to be the voltage VCCQ by the transistor TR13 which has entered the ON state.

As a result of the fact that in the second state, the pre-driver 71 has operated in this way, the transistor TR7 of the main driver 80 enters the OFF state, the transistor TR8 of the main driver 80 enters the ON state, and the output circuit 32 can output the "L" level with the voltage VSS.

Subsequently, a description will be given of a case where in the second state, the logic level of the node N2 is the "H" level, and the logic level of the node N4 is the "H" level.

The transistor TR11 enters the OFF state since the "H" level has been applied to the gate. The transistor TR12 enters the ON state since the "H" level has been applied to the gate. As a result, the voltage of the nodes is determined to be the voltage VSS by the transistor TR12 which has entered the ON state.

The transistor TR16 enters the OFF state since the signal S3 with the voltage VSS1 has been applied to the gate. The transistor TR13 enters the OFF state since a signal of the "H" level has been applied to the gate. The signal S4 with the voltage VSS2 which is a voltage lower than the voltage VSS by the threshold voltage of the transistor TR14 or more has been applied to the transistor TR14. The "H" level has been applied to the gate of the transistor TR15. Therefore, the transistors TR14 and TR15 enter the ON state. As a result, the voltage of the node N3 is determined to be the voltage VSS by the transistors TR14 and TR15 which have entered the ON state.

As a result of the fact that in the second state, the pre-driver 71 has operated in this way, the transistor TR7 of the main driver 80 enters the ON state, the transistor TR8 of the main driver 80 enters the OFF state, and the output circuit 32 can output the "H" level of the voltage VCCQ.

As described above, the output circuit 32 in the semiconductor memory device 1 according to the second embodiment can control, in the active state, the voltage of the node N3 to be set to the voltage VSS or voltage VCCQ and output the "L" level or "H" level to the output node.

[2-3] Advantageous Effects of Second Embodiment

As described above, the semiconductor memory device 1 according to the second embodiment applies, in the stand-by state, the voltage VSS1 as a negative voltage to the node N3. With this configuration, in the semiconductor memory device 1 according to the second embodiment, the transistor TR8 in the stand-by state enters a reverse bias state, allowing the suppression of leakage current of the transistor TR8. As a result, the semiconductor memory device 1 according to the second embodiment can reduce electric power consumption of the semiconductor memory device 1 in the stand-by state as in the case of the first embodiment.

In the semiconductor memory device 1 according to the second embodiment, the high/low levels of the voltage VSS1 and VSS2 may be changed in accordance with the characteristic of the transistor. One kind of signal may be used for different purposes in accordance with the high/low level relationship of various voltages, thereby omitting another kind of signal. For example, the voltage VSS1 may be set to a voltage higher than the voltage VSS and lower than the threshold voltage of the transistor TR8 such that the transistor TR8 has a weak forward bias voltage. In this case, a regulator may be used in place of the negative charge pump 23 to generate the voltage VSS1. Additionally, in this case, the signal STBY or signal S4 may be used in place of the signal S3.

[3] Third Embodiment

The semiconductor memory device 1 according to a third embodiment differs in the configurations of a pre-driver 72 and the input/output control circuit 40 from the semiconductor memory device 1 according to the first embodiment. In the description below, a description will be given of the points in which the memory system according to the third embodiment differs from that according to the first embodiment.

[3-1] Configuration

FIG. 18 illustrates a configuration example of an output circuit 32 according to the third embodiment. As illustrated in FIG. 18, the pre-driver 72 in the output circuit 32 according to the third embodiment has a configuration where the transistor TR4 in the pre-driver 70 according to the first embodiment is replaced by a current source CS1, a resistor R1, and a transistor TR9.

A voltage VDD1 is applied to the current source CS1 to supply a current to a node N1, based on a signal STBY. One end of the resistor R1 is coupled to the node N1. The drain of the transistor TR9 is coupled to the other end of the resistor R1. The source and the back gate of the transistor TR9 are respectively grounded. A signal S5 is applied to the gate of the transistor TR9. The signal S5 is a signal output by the input/output control circuit 40.

Figure 19:
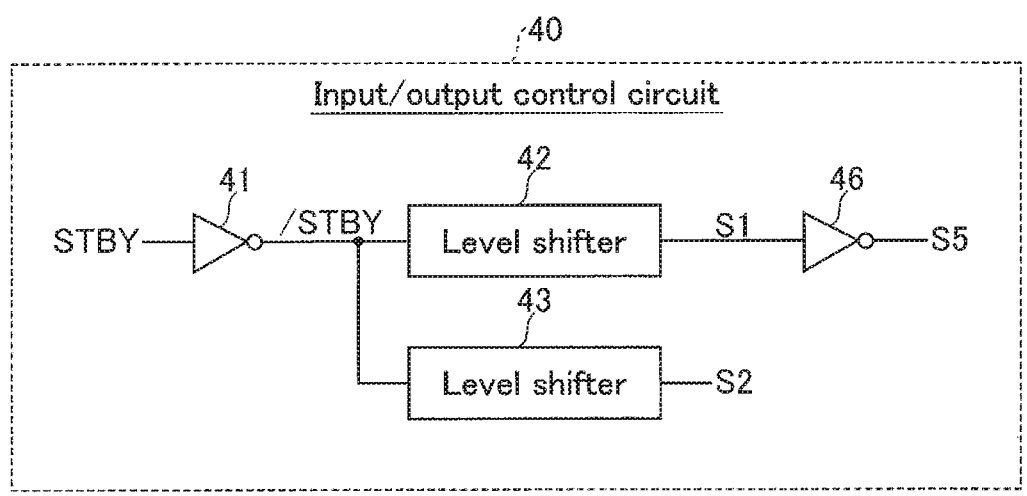
FIG. 19 is a block diagram illustrating a configuration example of an input/output control circuit included in the semiconductor memory device according to the third embodiment.

FIG. 19 illustrates a configuration example of the input/output circuit 40 according to the third embodiment. As illustrated in FIG. 19, the input/output control circuit 40 according to the third embodiment has a configuration where an inverter 46 is added to the input/output control circuit 40 according to the first embodiment. The inverter 46 outputs the signal S5 in which the signal S1 is logically reversed. The other configurations of the semiconductor memory device according to the third embodiment are the same as those of the first embodiment.

[3-2] Operation of Output Circuit 32

Next, the operation of the output circuit 32 in the semiconductor memory device 1 according to the third embodiment will be described. In the third embodiment, as with the description given for the first embodiment, it is assumed that the voltage VCC is greater than the voltages VDD, VDD1, and VDD2, the voltage VDD1 is greater than the voltage VDD, the voltage VDD2 is greater than the voltages VDD and VDD1, and the voltage VDD2 is equal to or greater than a sum of the voltage VCCQ and the threshold voltage of the transistor TR2.

FIG. 20 illustrates a relationship between the logic level and the voltage of each signal in the semiconductor memory device 1 according to the third embodiment. The "H" level of the signal S5 corresponds to the voltage VDD1. The "L" level of the signal S5 corresponds to the voltage VSS.

In addition, when the signal STBY is at the "H" level, the current source CS1 supplies current to the node N1. When the signal STBY is at the "L" level, the current source CS1 enters an electrically non-coupled state with the node N1, and does not supply current to the node N1.

The operation of the pre-driver 72 according to the third embodiment in the first state will be described. In the first state, the output circuit 32 is in the stand-by state, the transistors TR1, TR2, TR3, and TR5 are in the OFF state, and the transistor TR6 is in the ON state.

The current source CS1 supplies current from the voltage VDD1 to the node N1 since the signal STBY is at the "H" level. The transistor TR9 enters the ON state since the signal S5 with the voltage VDD1 has been applied to the gate. As a result, the current supplied from the voltage VDD1 by the current source CS1 flows to the voltage VSS via the resistor R1 and the transistor TR9. A voltage difference occurs between both ends of the resistor R1 by the current flowing to the resistor R1. By the voltage difference that has occurred between both ends of the resistor R1, the voltage of the node N1 becomes, for example, a voltage VDD3, which is a voltage greater than the voltage VCCQ and equal to lower than the voltage VDD1. In addition, the voltage of the node N3 is determined to be the voltage VSS by the transistor TR6 which has entered the ON state.

As a result of the fact that the pre-driver 72 has operated in this way, in the first state, each of the transistors TR7 and TR8 of the main driver 80 enters the OFF state, and the output node of the output circuit 32 enters a high-impedance state. At that time, the voltage VDD3 has been applied to the gate of the transistor TR7.

Subsequently, the operation of the pre-driver 72 according to the third embodiment in the second state will be described. In the second state, the output circuit 32 is in the active state.

The current source CS1 enters an electrically non-coupled state to the node N1, without supplying current to the node N1, since the signal STBY is at the "L" level. The transistor TR9 enters the OFF state since the signal S5 with the voltage VSS has been applied to the gate. As a result, the voltage of the node N1 is determined by the transistors TR1, TR2, and TR3, and the voltage of the node N3 is determined by the transistors TR5 and TR6. That is, in the second state, the pre-driver 72 according to the third embodiment operates as with the pre-driver 70 according to the first embodiment in the second state.

For example, in the second state, when the logic level of the node N2 is the "L" level, and the logic level of the node N4 is the "L" level, the transistors TR1, TR2, and TR5 enter the ON state, and the transistors TR3 and TR6 enter the OFF state. As a result, the voltage of the node N1 becomes the voltage VCCQ, and the voltage of the node N3 becomes the voltage VCCQ. Furthermore, for example, in the second state, when the logic level of the node N2 is the "H" level, and the logic level of the node N4 is the "H" level, the transistors TR1, TR2, and TR5 enter the OFF state, and the transistors TR3 and TR6 enter the ON state. As a result, the voltage of the node N1 becomes the voltage VSS, and the voltage of the node N3 becomes the voltage VSS.

In this way, the output circuit 32 in the semiconductor memory device 1 according to the third embodiment can control, in the active state, the voltage of the node N1 to be set to the voltage VCCQ or voltage VSS and output the "L" level or "H" level to the output node.

[3-3] Advantageous Effects of Third Embodiment

As described above, the semiconductor memory device 1 according to the third embodiment applies, in the stand-by state, the voltage VDD3, which is equal to or greater than the voltage VCCQ, to the node N1. In the semiconductor memory device 1 according to the third embodiment, the transistor TR7 in the stand-by state enters the reverse bias state to enable suppressing leakage current of the transistor TR7. As a result, the semiconductor memory device 1 according to the third embodiment can reduce the electric power consumption of the semiconductor memory device 1 in the stand-by state as in the case of the first embodiment.

In the semiconductor memory device 1 according to the third embodiment, the high/low levels of the voltages VDD1, VDD2, and VDD3 may be changed suitably in accordance with the characteristic of the transistor. The amount of current supplied by the current source CS1 and the resistance value of the resistor R1 may also be changed in accordance with the characteristic of the transistor. In addition, one kind of signal may be used for different purposes in accordance with the high/low level relationship of various voltages, thereby omitting another kind of signal.

For example, the voltage VDD3 may be set to a voltage lower than the voltage VCCQ such that the transistor TR7 enters a weak forward bias. In this case, in order to set the voltage VDD3, for example, the amount of current supplied by the current source CS1 may be changed, the resistance value of the resistor R1 may be changed, or the magnitude of the voltage VDD1 may be changed to be in agreement with the current amount of the current source CS1 and the resistance value of the resistor R1.

[4] Fourth Embodiment

The semiconductor memory device 1 according to the fourth embodiment differs in the configurations of a pre-driver 73 and the input/output control circuit 40 from the semiconductor memory device 1 according to the second embodiment. In the description below, a description will be given of the points in which the memory system according to the fourth embodiment differs from that according to the second embodiment.

[4-1] Configuration

Figure 21:
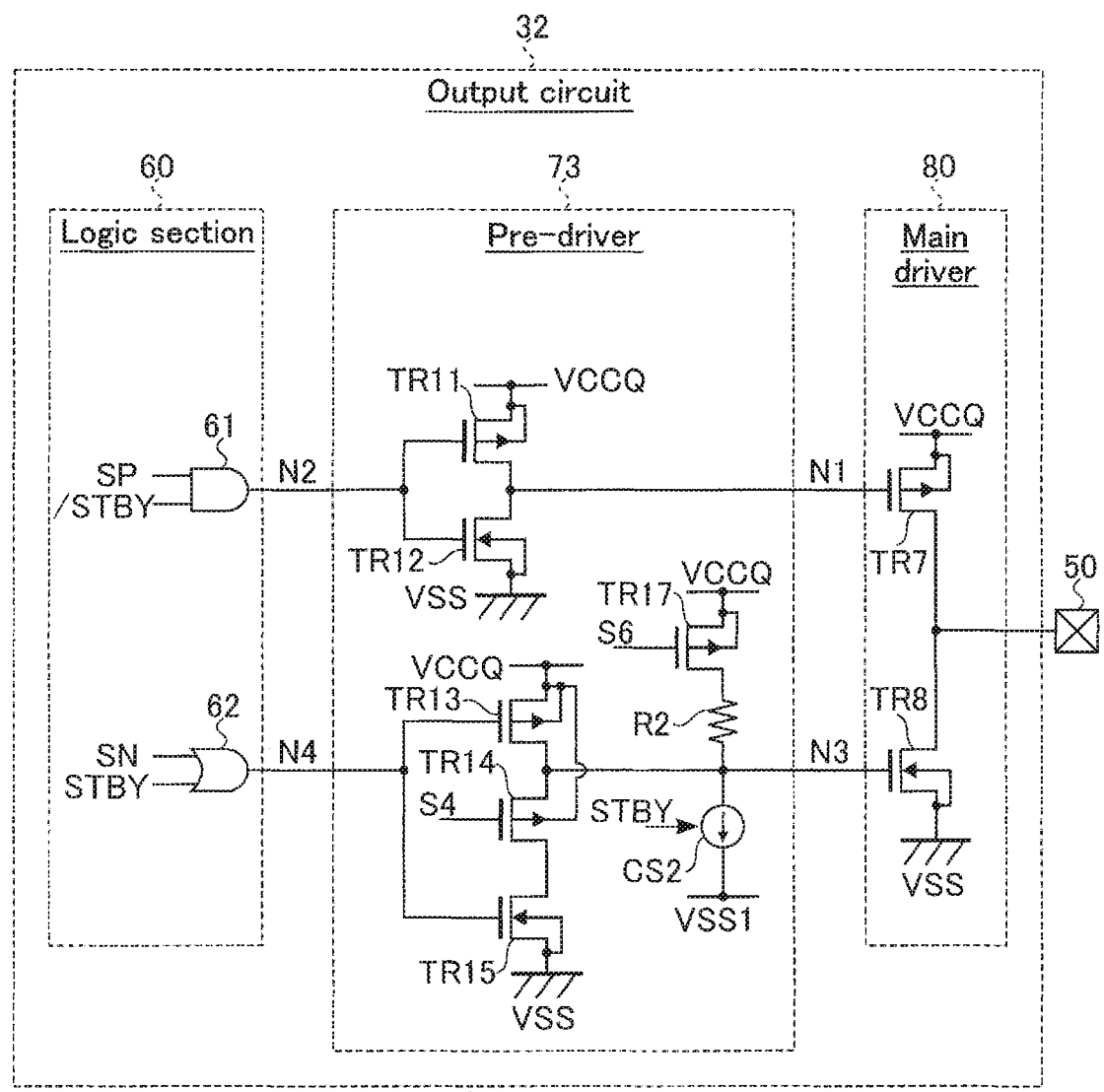
FIG. 21 is a circuit diagram illustrating a configuration example of an output circuit included in the semiconductor memory device according to a fourth embodiment.

FIG. 21 illustrates a configuration example of an output circuit 32 according to the fourth embodiment. As illustrated in FIG. 21, the pre-driver 73 in the output circuit 32 according to the fourth embodiment has a configuration where the transistor TR16 in the pre-driver 71 according to the second embodiment is replaced by a current source CS2, a resistor R2, and a transistor TR17.

The voltage VSS1 is applied to the current source CS2, and current is supplied to the voltage VSS1 from the node N3, based on the signal STBY. One end of the resistor R2 is coupled to the node N3. The drain of the transistor TR17 is coupled to the other end of the resistor R2. The voltage VCCQ is applied to each of the source and the back gate of the transistor TR17. A signal S6 is applied to the gate of the transistor TR17. The signal S6 is a signal output by the input/output control circuit 40.

FIG. 22 illustrates a configuration example of the input/output circuit 40 according to the fourth embodiment. As illustrated in FIG. 22, the input/output circuit 40 according to the fourth embodiment has a configuration where an inverter 47 is added to the input/output circuit 40 according to the second embodiment. The inverter 47 outputs the signal S6 in which the signal S3 is logically reversed. The other configurations of the semiconductor memory device 1 according to the fourth embodiment are the same as those of the second embodiment.

[4-2] Operation of Output Circuit 32

Next, the operation of the output circuit 32 in the semiconductor memory device 1 according to the fourth embodiment will be described. In the fourth embodiment, as with the description provided for the second embodiment, it is assumed that the voltages VSS1 and VSS2 are negative voltages lower than the voltage VSS, the absolute value of the voltage VSS2 is greater than the absolute value of the voltage VSS1, and the absolute value of the voltage VSS2 is equal to or greater than the absolute value of the threshold voltage of the transistor TR14.

FIG. 23 illustrates a relationship between the logic level and the voltage of each signal in the semiconductor memory device 1 according to the fourth embodiment. The "L" level of the signal S6 corresponds to the voltage VSS1. The "H" level of the signal S6 corresponds to the voltage VDD.

In addition, when the signal STBY is at the "H" level, the current source CS2 supplies current to the voltage VSS1 from a node N3. When the signal STBY is at the "L" level, the current source CS2 enters an electrically non-coupled state to the node N3, without supplying current from the node N3 to the voltage VSS1.

First, the operation of the pre-driver 73 according to the fourth embodiment in the first state will be described. In the first state, the output circuit 32 is in the stand-by state, the transistor TR11 is in the ON state, and the transistors TR12, TR13, TR14, and TR15 are in the OFF state.

Since the signal STBY is at the "H" level, the current source CS2 supplies current from the node N3 to the voltage VSS1. The transistor TR17 enters the ON state since the signal S6 with the voltage VSS1 has been applied to the gate. As a result, the current that has flowed from the voltage VCCQ to the node N3 through the transistor TR17 and the resistor R2 is supplied from the node N3 to the voltage VSS1 by the current source CS2. A voltage difference occurs between both ends of the resistor R2 due to the current flowing to the resistor R2. Due to the voltage difference that has occurred between both ends of the resistor R2, the voltage of the node N3 becomes, for example, a voltage VSS3, which is a negative voltage and greater than the voltage VSS1. In addition, the voltage of the node N1 is determined to be the voltage VCCQ by the transistor TR11 which has entered the ON state.

As a result of the fact that the pre-driver 73 has operated in this way, in the first state, each of the transistors TR7 and TR8 of the main driver 80 enters the OFF state, and the output node of the output circuit 32 enters a high-impedance state. At that time, the voltage VSS3 has been applied to the gate of the transistor TR8.

Subsequently, the operation of the pre-driver 73 according to the fourth embodiment in the second state will be described. In the second state, the output circuit 32 is in the active state.

Since the signal STBY is at the "L" level, the current source CS2 enters an electrically non-coupled state to the node N3, without supplying current from the node N3 to the voltage VSS1. The transistor TR17 enters the OFF state since the signal S6 with the voltage VDD has been applied to the gate. As a result, the voltage of the node N3 is determined by the transistors TR13, TR14, and TR15. That is, in the second state, the pre-driver 73 according to the fourth embodiment operates as in the case of the pre-driver 71 according to the second embodiment in the second state.

For example, in the second state, when the logic level of the node N2 is the "L" level, the logic level of the node N4 is the "L" level, the transistors TR11 and TR13 enter the ON state, and the transistors TR12, TR14, and TR15 enter the OFF state. As a result, the voltage of the node N1 becomes the voltage VCCQ, and the voltage of the node N3 becomes the voltage VCCQ. Furthermore, for example, in the second state, when the logic level of the node N2 is the "H" level, and the logic level of the node N4 is the "H" level, the transistors TR11 and TR13 enter the OFF state, and the transistors TR12, TR14, and TR15 enter the ON state. As a result, the voltage of the node N1 becomes the voltage VSS, and the voltage of the node N3 becomes the voltage VSS.

In this way, the output circuit 32 in the semiconductor memory device 1 according to the fourth embodiment can control, in the active state, the voltage of the node N3 to be set to the voltage VCCQ or voltage VSS and output the "L" level or "H" level to the output node.

[4-3] Advantageous Effects of Fourth Embodiment

As described above, the semiconductor memory device according to the fourth embodiment applies, in the stand-by state, the voltage VDD3 as a negative voltage to the node N3. In the semiconductor memory device 1 according to the fourth embodiment, the transistor TR8 in the stand-by state enters a reverse bias state to enable suppressing leakage current of the transistor TR8. As a result, the semiconductor memory device 1 according to the fourth embodiment can reduce electrical power consumption of the semiconductor memory device 1 in the stand-by state as in the case of the second embodiment.

In the semiconductor memory device 1 according to the fourth embodiment, the high/low levels of the voltages VSS1, VSS2, and VSS3 may be changed suitably in accordance with the characteristic of the transistor. In addition, the amount of current supplied by the current source CS2 and the resistance value of the resistor R2 may also be changed in accordance with the characteristic of the transistor. Furthermore, one kind of signal may be used for different purposes in accordance with the high/low level relationship of various voltages, thereby omitting another kind of signal.

For example, the voltage VSS3 may be set to a voltage higher than the voltage VSS such that the transistor TR8 enters a weak forward bias. In this case, in order to set the voltage VSS3, for example, the amount of current supplied by the current source CS2 may be changed, the resistance value of the resistor R2 may be changed, or the magnitude of the voltage VSS1 may be changed be in agreement with the current amount of the current source CS2 and the resistance value of the resistor R2.

[5] Fifth Embodiment

The semiconductor memory device 1 according to a fifth embodiment differs in configurations of a power supply circuit 18, a pre-driver 74, and an input/output control circuit 40 from the semiconductor memory device 1 according to the first embodiment. Hereinafter, a description will be given of the points in which the memory system according to the fifth embodiment differs from that according to the first embodiment.

[5-1] Configuration

The power supply circuit 18 included in the semiconductor memory device 1 according to the fifth embodiment has a configuration where the regulator 22 is omitted from the power supply circuit 18 included in the semiconductor memory device 1 according to the first embodiment.

FIG. 24 illustrates a configuration example of an output circuit 32 according to the fifth embodiment. As illustrated in FIG. 24, in the output circuit 32 according to the fifth embodiment, the pre-driver 74 includes transistors TR21 to TR24 and a level shifter 91. The transistors TR21 and TR23 are, for example, P-type MOSFETs. The transistors TR22 and TR24 are, for example, N-type MOSFETs.

A voltage VDD1 is applied to each of the source and the back gate of the transistor TR21. The drain of the transistor TR21 is coupled to a node N1. The source and the back gate of the transistor TR22 are respectively grounded. The drain of the transistor TR22 is coupled to the node N1. The level shifter 91 applies a signal based on the logic level of a node N2 to the gate of the transistor TR21 and the gate of the transistor TR22. A voltage VCCQ is applied to each of the source and the back gate of the transistor TR23. The gate of the transistor TR23 is coupled to a node N4. The drain of the transistor TR23 is coupled to a node N3. The source and the back gate of the transistor TR24 are respectively grounded. The gate of the transistor TR24 is coupled to the node N4. The drain of the transistor TR24 is coupled to the node N3.

The input/output control circuit 40 included in the semiconductor memory device 1 according to the fifth embodiment has a configuration where the level shifters 42 and 43 are omitted from the input/output control circuit 40 included in the semiconductor memory device 1 according to the first embodiment. The other configurations of the semiconductor memory device 1 according to the fifth embodiment are the same as those of the first embodiment.

[5-2] Operation of Output Circuit 32

Next, the operation of the output circuit 32 in the semiconductor memory device 1 according to the fifth embodiment will be described. In the fifth embodiment, it is assumed that the voltage VDD1 is a voltage higher than the voltage VCCQ.

First, the operation of the pre-driver 74 according to the fifth embodiment in the first state will be described. In the first state, the output circuit 32 is in the stand-by state, the logic level of the node N2 is the "L" level, and the logic level of the node N4 is the "H" level.

The level shifter 91 outputs the "L" level of the voltage VSS to the gate of the transistor TR21 and the gate of the transistor TR22, based on the "L" level of the node N2. The transistor TR21 enters the ON state since the "L" level has been applied to the gate. The transistor TR22 enters the OFF state since the "L" level has been applied to the gate. As a result, the voltage of the node N1 is determined to be the voltage VDD1 by the transistor TR21 which has entered the ON state.

The transistor TR23 enters the OFF state since the "H" level has been applied to the gate. The transistor TR24 enters the ON state since the "H" level has been applied to the gate. As a result, the voltage of the node N3 is determined to be the voltage VSS by the transistor TR24 which has entered the ON state.

As a result of the fact that the pre-driver 74 has operated in this way, in the first state, each of the transistors TR7 and TR8 of the main driver 80 enters the OFF state, and the output node of the output circuit 32 enters a high-impedance state. At that time, the voltage VDD1 has been applied to the gate of the transistor TR7.

Subsequently, the operation of the pre-driver 74 according to the fifth embodiment in the second state will be described in sequence for a case where the output circuit 32 has output the "L" level, and a case where the output circuit 32 has output the "H" level.

In the second state, the output circuit 32 is in the active state, the logic level of the node N2 is equal to the logic level of a signal SP, and the logic level of the node N4 is equal to the logic level of a signal SN. First, a description will be given of a case where the logic level of the node N2 is the "L" level, and the logic level of the node N4 is the "L" level.

The level shifter 91 outputs the "L" level of the voltage VSS to the gate of the transistor TR21 and the gate of the transistor TR22, based on the "L" level of the node N2. The transistor TR21 enters the ON state since the "L" level has been applied to the gate. The transistor TR22 enters the OFF state since the "L" level has been applied to the gate. As a result, the voltage of the node N1 is determined to be the voltage VDD1 by the transistor TR21 which has entered the ON state.

The transistor TR23 enters the ON state since the "L" level has been applied to the gate. The transistor TR24 enters the OFF state since the "L" level has been applied to the gate. As a result, the voltage of the node N3 is determined to be the voltage VCCQ by the transistor TR23 which has entered the ON state.

As a result of the fact that the pre-driver 74 has operated in this way, in the second state, the transistor TR7 of the main driver 80 enters the OFF state, the transistor TR8 of the main driver 80 enters the ON state, and the output circuit 32 can output the "L" level of the voltage VSS.

Subsequently, a description will be given of a case where the logic level of the node N2 is the "H" level, and the logic level of the node N4 is the "H" level.

The level shifter 91 outputs the "H" level of the voltage VDD1 to the gate of the transistor TR21 and the gate of the transistor TR22, based on the "H" level of the node N2. The transistor TR21 enters the OFF state since the "H" level has been applied to the gate. The transistor TR22 enters the ON state since the "H" level has been applied to the gate. As a result, the voltage of the node N1 is determined to be the voltage VSS by the transistor TR22 which has entered the ON state.

The transistor TR23 enters the OFF state since the "H" level has been applied to the gate. The transistor TR24 enters the ON state since the "H" level has been applied to the gate. As a result, the voltage of the node N3 is determined to be the voltage VSS by the transistor TR24 which has entered the ON state.

As a result of the fact that the pre-driver 74 has operated in this way, in the second state, the transistor TR7 of the main driver 80 enters the ON state, the transistor TR8 of the main driver 80 enters the OFF state, and the output circuit 32 can output the "H" level of the voltage VCCQ.

As described above, the output circuit 32 in the semiconductor memory device 1 according to the fifth embodiment can control, in the active state, the voltage of the node N1 to be set to the voltage VSS or voltage VDD1, and output the "L" level or "H" level to the output node.

[5-3] Advantageous Effects of Fifth Embodiment

As described above, the semiconductor memory device 1 according to the fifth embodiment applies, in the stand-by state, the voltage VDD1 which is equal to or higher than the voltage VCCQ to the node N1. In the semiconductor memory device 1 according to the fifth embodiment, the transistor TR7 in the stand-by state can enter a reverse bias state to suppress leakage current of the transistor TR7. As a result, the semiconductor memory device 1 of the fifth embodiment can reduce the electric power consumption of the semiconductor memory device 1 in the stand-by state as in the case of the first embodiment.

The high/low level of the voltage VDD1 may be changed suitably in accordance with the characteristic of the transistor. For example, the voltage VDD1 may be set to a voltage lower than the voltage VCCQ such that the transistor TR7 has a weak forward bias.

[6] Sixth Embodiment

A semiconductor memory device 1 according to a sixth embodiment differs in configurations of the power supply circuit 18, a pre-driver 75, and the input-output control circuit 40 from the semiconductor memory device 1 according to the second embodiment. A description will be given of the points in which the semiconductor memory device 1 according to the sixth embodiment differs from that according to the second embodiment.

[6-1] Configuration

The power supply circuit 18 included in the semiconductor memory device 1 according to the sixth embodiment has a configuration where the negative charge pump 24 is omitted from the power supply circuit 18 included in the semiconductor memory device 1 according to the second embodiment.

Figure 25:
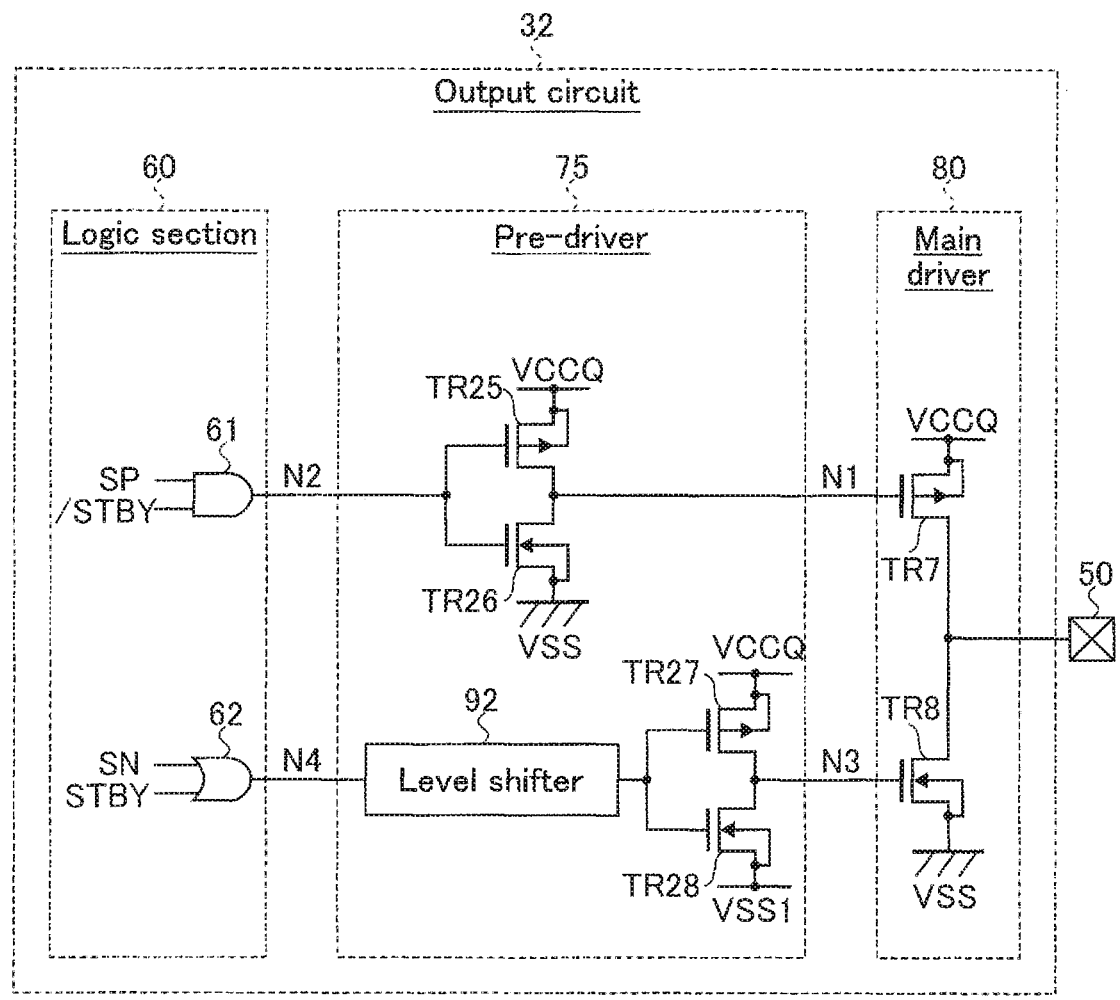
FIG. 25 is a circuit diagram illustrating a configuration example of an output circuit included in a semiconductor memory device according to a sixth embodiment.

FIG. 25 illustrates a configuration example of an output circuit 32 according to the sixth embodiment. As illustrated in FIG. 25, in the output circuit 32 according to the sixth embodiment, the pre-driver 75 includes transistors TR25 to TR28, and a level shifter 92. The transistors TR25 and TR27 are, for example, P-type MOSFETs. The transistors TR26 and TR28 are, for example, N-type MOSFETs.

A voltage VCCQ is applied to each of the source and the back gate of the transistor TR25. The gate of the transistor TR25 is coupled to a node N2. The drain of the transistor TR25 is coupled to a node N1. The source and the back gate of the transistor TR26 are respectively grounded. The gate of the transistor TR26 is coupled to the node N2. The drain of the transistor TR24 is coupled to the node N1. The voltage VCCQ is applied to each of the source and the back gate of the transistor TR27. The drain of the transistor TR27 is coupled to a node N3. A voltage VSS1 is applied to each of the source and the back gate of the transistor TR28. The drain of the transistor TR28 is coupled to the node N3. The level shifter 92 applies a signal based on the logic level of a node N4 to the gate of the transistor TR27 and the gate of the transistor TR28.

The input/output control circuit 40 included in the semiconductor memory device 1 according to the sixth embodiment has a configuration where the level shifters 44 and 45 are omitted from the input/output control circuit 40 included in the semiconductor memory device 1 according to the second embodiment. The other configurations of the semiconductor memory device 1 according to the sixth embodiment are the same as those of the second embodiment.

[6-2] Operation of Output Circuit 32

Next, the operation of the output circuit 32 in the semiconductor memory device according to the sixth embodiment will be described. In the sixth embodiment, it is assumed that the voltage VSS1 is a negative voltage.

First, the operation of the pre-driver 75 according to the sixth embodiment in the first state will be described. In the first state, the output circuit 32 is in the stand-by state, and the logic level of the node N2 is the "L" level, and the logic level of the node N4 is the "H" level.

The transistor TR25 enters the ON state since the "L" level has been applied to the gate. The transistor TR26 enters the OFF state since the "L" level has been applied to the gate. As a result, the voltage of the node N1 is determined to be the voltage VCCQ by the transistor TR25 which has entered the ON state.

The level shifter 92 outputs the "H" level of the voltage VCCQ to the gate of the transistor TR27 and the gate of the transistor TR28, based on the "H" level of the node N4. The transistor TR27 enters the OFF state since the "H" level has been applied to the gate. The transistor TR28 enters the ON state since the "H" level has been applied to the gate. As a result, the voltage of the node N3 is determined to be the voltage VSS1 by the transistor TR28 which has entered the ON state.

As a result of the fact that the pre-driver 75 has operated in this way, in the first state, each of the transistors TR7 and TR8 of the main driver 80 enters the OFF state, and the output node of the output circuit 32 is in a high impedance state. At that time, the voltage VSS1 has been applied to the gate of the transistor TR8.

Subsequently, the operation of the pre-driver 75 according to the sixth embodiment in the second state will be described in sequence for a case where the output circuit 32 has output the "L" level and a case where the output circuit 32 has output the "H" level.

In the second state, the output circuit 32 is in the active state, the logic level of the node N2 is equal to the logic level of a signal SP, and the logic level of the node N4 is equal to the logic level of a signal SN. First, a case will be described in which the logic level of the node N2 is the "L" level, and the logic level of the node N4 is the "L" level.

The transistor TR25 enters the ON state since the "L" level has been applied to the gate. The transistor TR26 enters the OFF state since the "L" level has been applied to the gate. As a result, the voltage of the node N1 is determined to be the VCCQ by the transistor TR25 which has entered the ON state.

The level shifter 92 outputs the "L" level of the voltage VSS1 to the gate of the transistor TR27 and the gate of the transistor TR28, based on the "L" level of the node N4. The transistor TR27 enters the ON state since the "L" level has been applied to the gate. The transistor TR28 enters the OFF state since the "L" level has been applied to the gate. As a result, the voltage of the node N1 is determined to be the voltage VCCQ by the transistor TR27 which has entered the ON state.

As a result of the fact that the pre-driver 75 has operated in this way, in the second state, the transistor TR7 of the main driver 80 enters the OFF state, the transistor TR8 of the main driver 80 enters the ON state, and the output circuit 32 can output the "L" level of the voltage VSS.

Subsequently, a case will be described in which the logic level of the node N2 is the "H" level, and the logic level of the node N4 is the "H" level.

The transistor TR25 enters the OFF state since the "H" level has been applied to the gate. The transistor TR26 enters the ON state since the "H" level has been applied to the gate.

As a result, the voltage of the node N1 is determined to be the voltage VSS by the transistor TR26 which has entered the ON state.

The level shifter 92 outputs the "H" level of the voltage VCCQ to the gate of the transistor TR27 and the gate of the transistor TR28, based on the "H" level of the node N4. The transistor TR27 enters the OFF state since the "H" level has been applied to the gate. The transistor TR28 enters the ON state since the "H" level has been applied to the gate. As a result, the voltage of the node N1 is determined to be the voltage VSS1 by the transistor TR28 which has entered the ON state.

As a result of the fact that the pre-driver 75 has operated in this way, in the second state, the transistor TR7 of the main driver 80 enters the ON state, the transistor TR8 in the main driver 80 enters the OFF state, and the output circuit 32 can output the "H" level of the voltage VCCQ.

As described above, the output circuit 32 in the semiconductor memory device 1 according to the sixth embodiment can control, in the active state, the voltage of the node N3 to be set to the voltage VSS1 or voltage VCCQ and output the "L" level or "H" level to the output node.

[6-3] Advantageous Effects of Sixth Embodiment

As described above, the semiconductor memory device 1 according to the sixth embodiment applies, in the stand-by state, the voltage VSS1 as a negative voltage to the node N3. In the semiconductor memory device 1 according to the sixth embodiment, the transistor TR8 in the stand-by state can enter a reverse bias state to suppress the leakage current of the transistor TR8. As a result, the semiconductor memory device 1 according to the sixth embodiment can reduce the electric power consumption of the semiconductor memory device 1 in the stand-by state as in the case of the second embodiment.

The high/low level of the voltage VSS1 may be changed suitably in accordance with the characteristic of the transistor. For example, the voltage VSS1 may be set positive voltage such that the transistor TR8 has a weak forward bias.

[7] Other Modifications

The above-mentioned embodiments exemplify cases where the output circuit 32 may take two states, i.e., a stand-by state and an active state; however, the operating states of the output circuits 32 are not limited thereto. The output circuit 32 may enter a state different from the stand-by state and active state. In addition, the above-mentioned embodiments exemplify a case where the output circuit 32 is controlled by a signal STBY based on the signal /CE; however, the signal that controls the output circuit 32 is not limited to the signal STBY. The output circuit 32 may operate based, for example, on a signal other than the signal STBY.

The above embodiments exemplify a case where the semiconductor memory device 1 operates using a voltage supplied from the outside, and the input/output module 10 operates using a voltage generated in the power supply circuit 18. These voltages may be supplied to each circuit block through, for example, interconnects referred to as a "power supply line". The semiconductor memory device 1 may include, for example, a power supply line of the voltage VCCQ, a power supply line of the voltage VSS, a power supply line of the voltage VDD, a power supply line of the voltage VDD1, a power supply line of the voltage VDD2, and the like. In addition, for example, a plurality of circuits that operate using the voltage VCCQ may be coupled to a power supply line that supplies the voltage VCCQ.

The above-mentioned embodiments exemplify a case where the pre-driver 70 includes a transistor that prevents a PN junction from entering the ON state. The transistor TR2 included in the semiconductor memory device 1 according to the first embodiment and the transistor TR14 included in the semiconductor memory device 1 according to the second embodiment are each an example of a transistor that prevents a PN junction from entering the ON state. The configuration of the pre-driver 70 is not limited to a configuration including a transistor that prevents a PN junction from entering the ON state. For example, in the case of setting, in the stand-by state, a transistor included in the main driver 80 to a forward bias state, the pre-driver 70 may be configured by omitting the transistor that prevents a PN junction from entering the ON state.

The above-mentioned embodiments exemplify a case where the main driver 80 includes the transistors TR7 and TR8; however, the configuration of the main driver 80 is not limited thereto. FIG. 26 illustrates a configuration example of the main driver 80 included in the semiconductor memory device 1 according to a modification of the first embodiment. As illustrated in FIG. 26, the main driver 80 included in the semiconductor memory device 1 according to the modification of the first embodiment further includes resistors R3 and R4 in addition to the configuration of the main driver 80 included in the semiconductor memory device 1 according to the first embodiment. The resistor R3 is provided between the drain of the transistor TR7 and the output node of the main driver 80. The resistor R4 is provided between the drain of the transistor TR8 and the output node of the main driver 80. By the main driver 80 being configured as described above, the output impedance of the main driver 80 included in the semiconductor memory device 1 according to the modification of the first embodiment is based on the ON resistance of the transistor TR7 and the resistance value of the resistor R3, or the ON resistance of the transistor TR8 and the resistance value of the resistor R4.

The ON resistance of a transistor may vary depending on the operating state of the transistor, for example, a drain-source voltage, or a gate-source voltage. The resistance value of a resistor is hardly affected by the magnitude of difference in voltages applied to both ends of the resistor as compared to the ON resistance of a transistor. Therefore, fluctuation in output impedance with a change in operating state of a transistor can be reduced by determining output impedance at both the transistor and the resistor. The main driver 80 included in the first embodiment allows such a modification. In addition, the main drivers 80 included in the other embodiments can be modified in similar fashion.

The pre-driver 70 exemplified in the above-mentioned embodiments may further include, for example, a plurality of inverters. FIG. 27 illustrates a configuration example of a pre-driver 76 included in the semiconductor memory device 1 according to a modification of the first embodiment. As illustrated in FIG. 27, the pre-driver 76 included in the semiconductor memory device 1 according to the modification of the first embodiment further includes transistors TR31 to TR38 in addition to the configuration of the pre-driver 70 included in the first embodiment. The transistors TR31, TR33, TR35, and TR37 are respectively, for example, P-type MOSFETs. The transistors TR32, TR34, TR36, and TR38 are respectively, for example, N-type MOSFETs.

A voltage VCCQ is applied to the source and the back gate of the transistor TR31. The source and the back gate of the transistor TR32 are grounded. Each of the gate of the transistor TR31 and the gate of the transistor TR32 is coupled to a node N2. The voltage VCCQ is applied to the source and the back gate of the transistor TR33. The source and the back gate of the transistor TR34 are grounded. The gate of the transistor TR33 and the gate of the transistor TR34 are coupled to the drain of the transistor TR31 and the drain of the transistor TR32, respectively. The drain of the transistor TR33 and the drain of the transistor TR34 are coupled to the gate of the transistor TR1 and the gate of the transistor TR3, respectively.

The voltage VCCQ is applied to the source and the back gate of the transistor TR35. The source and the back gate of the transistor TR36 are grounded. Each of the gate of the transistor TR35 and the gate of the transistor TR36 is coupled to a node N4. The voltage VCCQ is applied to the source and the back gate of the transistor TR37. The source and the back gate of the transistor TR38 are grounded. The gate of the transistor TR37 and the gate of the transistor TR38 are coupled to the drain of the transistor TR35 and the drain of the transistor TR36, respectively. The drain of the transistor TR37 and the drain of the transistor TR28 are coupled to the gate of the transistor TR5 and the gate of the transistor TR6, respectively.

It an also be restated that the configuration of the pre-driver 76 is a configuration in which inverters are added to the pre-driver 70 included in the first embodiment. Specifically, the transistors TR31 and TR32 constitute an inverter. The transistors TR33 and TR34 constitute an inverter. The transistors TR35 and TR36 constitute an inverter. The transistors TR37 and TR38 constitute an inverter. Two inverters are provided in series between the output of an AND gate 61 and each gate of the transistors TR1 and TR3. Two inverters are provided in series between the output of an OR gate 62 and each gate of the transistors TR5 and TR6.

By configuring the pre-driver 76 as described above, it is possible to enhance, in the active state, the ability to control the voltage of the node N1 and the voltage of the node N3. A rise and a fall of a signal can be aligned, for example, by subjecting a signal to pass through a plurality of inverters which are coupled in series. In addition, the drive power of inverters can be increased in a stepwise fashion by providing, for example, one or more inverters such that the sizes of transistors constituting each inverter are increased as the signal is further sent forward from the logic section 60 side toward the main driver 80 side. By increasing the drive power of the inverters in a stepwise fashion, the voltage of the node N1 and the voltage of the node N3 can be controlled, even in the case where, for example, the transistors TR7 and TR8 of the main driver 80 are large in size and have large parasitic capacity.

Figure 28:
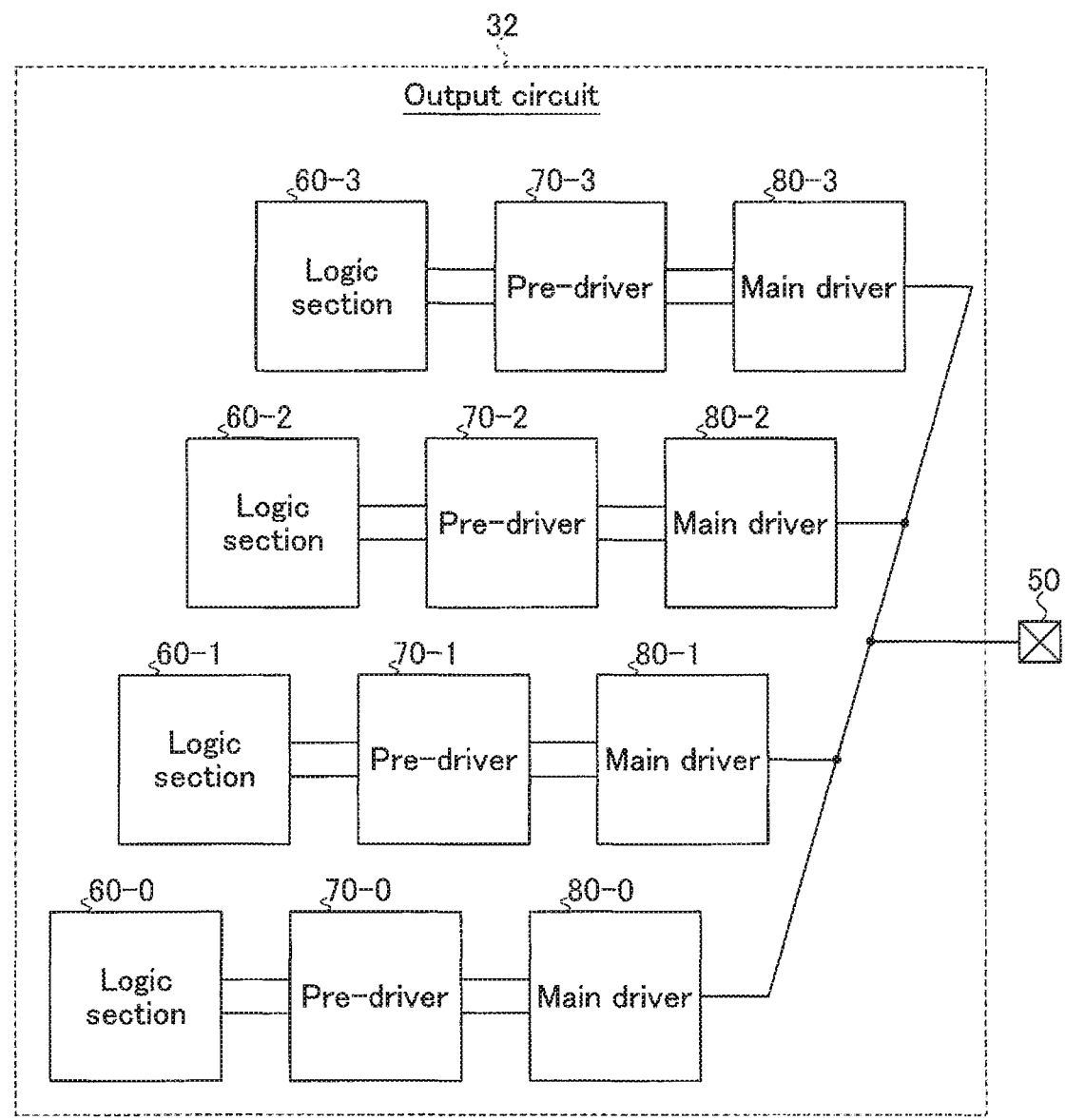
FIG. 28 is a block diagram illustrating a configuration example of an output circuit included in a semiconductor memory device according to a modification of the first embodiment.

The output circuit 32 illustrated in the above-mentioned embodiments may include a plurality of groups each composed of a logic section, a pre-driver, and a main driver. FIG. 28 illustrates a configuration example of the output circuit 32 included in the semiconductor memory device 1 according to a modification of the first embodiment. The output circuit 32 included in the semiconductor memory device 1 according to the modification the first embodiment includes a group of a logic section 60-0, a pre-driver 70-0, and a main driver 80-0; a group of a logic section 60-1, a pre-driver 70-1, and a main driver 80-1; a group of a logic section 60-2, a pre-driver 70-2, and a main driver 80-2; and a group of a logic section 60-3, a pre-driver 70-3, and a main driver 80-3. The output node of the main driver 80-0, the output node of the main driver 80-1, the output node of the main driver 80-2, and the output node of the main driver 80-3 are respectively coupled in common to a pad 50. The output impedance of the output circuit 32 may be controlled by, for example, changing the number of groups of a logic section, a pre-driver, and a main driver, to be made active.

The above-mentioned embodiments are described by way of example using a case where the semiconductor memory device 1 is a NAND flash memory; however, the embodiments are not limited thereto. The output circuit 32 described in the above-mentioned embodiments may be used for overall devices configured to output a signal.

It has been described that the above-mentioned embodiments can reduce the electric power consumption in the stand-by state. Reduction in electric power consumption can also be realized, for example, by means of a pre-driver. For example, when transistors with a low threshold voltage are used for the transistors TR7 and TR8 of the main driver 80, this allows reduction in size of the transistors and reduction in parasitic capacity at the gates of the transistors, as compared to the case of using transistors with a high threshold voltage. The transistors constituting the pre-driver are provided in a size in which the voltage of each gate of the transistors TR7 and TR8 of the main driver 80 is controllable. When the transistors TR7 and TR8 are small in size, this also enables down-sizing of transistors constituting the pre-driver. Down-sizing of transistors constituting the pre-driver enables reduction in electric power consumption at the time of transmitting a signal, as compared to a case where the pre-driver includes transistors that are large in size.

The above-mentioned embodiments exemplify a case where leakage current increases due to GIDL. GIDL is an electric current generated by tunneling between bands in a region where a gate electrode and a drain electrode of a transistor are provided in an overlapped manner. GIDL may become marked, for example, when a reverse bias is applied between the gate and the drain. The phenomenon associated with leakage current of transistors is not limited to GIDL.

In the specification of the present application, a state where the gate-source voltage of a transistor exceeds a threshold voltage is represented as the transistor being in the "ON state". In addition, the ON state can also be restated as a "strong forward bias state". A state where the gate-source voltage of a transistor is lower than a threshold voltage is represented as the transistor being in a "weak forward bias state". A state where the gate-source voltage of a transistor is substantially 0 V is represented as the transistor being in a "zero bias state". When the gate-source voltage of a transistor is applied with a reverse polarity to that of the threshold voltage, it is represented as the transistor being in a "reverse bias state". It is also possible to represent a "strong reverse bias state" and a "weak reverse bias state" based on the magnitude of the reverse bias. The transistor is in the OFF state in each of the weak forward bias state, zero bias state, and reverse bias state.

Here, a case will be described by way of example where 1.8V is applied to the source of a P-type MOSFET with a threshold voltage of −0.6 V. When the voltage of the gate is 0 V, the gate-source voltage is −1.8V, and the transistor is in the ON state and is in a strong forward bias state. When the voltage of the gate is 1.5V, the gate-source voltage is −0.3V, and the transistor is in a weak forward bias state. When the voltage of the gate is 1.8V, the gate-source voltage is 0 V, and the transistor is in a zero bias state. When the voltage of the gate is 2.1V, the gate-source voltage is 0.3V, and the transistor is in a reverse bias state. When the voltage of the gate is 3.6 V, the gate-source voltage is 1.8V, and the transistor is in a reverse bias state. By comparing the case where the voltage of the gate is 3.6V to the case where the voltage of the gate is 2.1V, the case where the voltage of the gate is 3.6V can also be expressed as being in a strong reverse bias state, and the case where the voltage of the gate is 2.1V can also be expressed as being in a weak reverse bias state.

Here, a case will be described by way of example where the source of an N-type MOSFET with a threshold voltage of 0.6 V is grounded. When the voltage of the gate is 1.8V, the gate-source voltage is 1.8V, and the transistor is in the ON state and in a strong forward bias state. When the voltage of the gate is 0.3V, the gate-source voltage is 0.3V, and the transistor is in a weak forward bias state. When the voltage of the gate is 0 V, the gate-source voltage is 0 V, and the transistor is in a zero bias state. When the voltage of the gate is −0.3V, the gate-source voltage is −0.3V, and the transistor is in a reverse bias state. When the voltage of the gate is −1.8V, the gate-source voltage is −1.8V, and the transistor is in a reverse bias state. By comparing the case where the voltage of the gate is −0.3V to the case where the voltage of the gate is −1.8V, the case where the voltage of the gate is −1.8V can also be expressed as being in a strong reverse bias state, and the case where the voltage of the gate is −0.3V can also be expressed as being in a weak reverse bias state.

In the present specification, in the case where a transistor is in the OFF state, current flowing through between the source and the drain is referred to as "leakage current". The current flowing between the source and the drain of a transistor is referred to as "leakage current", for example, in any of the case where the transistor is in a weak forward bias state, the case where the transistor is in a zero bias state, the case where the transistor is in a weak reverse bias state, and the case where the transistor is in a strong reverse bias state.

In the present specification, the term "coupling" is intended to mean that elements are electrically coupled and does not exclude the case where another element is interposed therebetween. In addition, with respect to the expression "electrically coupled", an insulator may be interposed between elements, provided that the elements can operate in the same manner as in the case where the elements are electrically coupled.

In the specification of the present application, each of the source and the drain of a transistor may be referred to as "an end" of the transistor. For example, a first end of a transistor is a source or a drain, and a second end of the transistor is a drain or a source.

In the above-mentioned embodiments, an example is described in which the output circuit 32 is controlled by various signals. The signals to control the output circuit 32 are not limited to the examples illustrated in the above-mentioned, embodiments. For example, the signal S5 according to the third embodiment may be replaced by the signal STBY. For example, the signal S6 of the fourth embodiment may be replaced by the signal /STBY.

In the third and fourth embodiments, an example is described in which a voltage used in the stand-by state is generated by a circuit using a current source. The configuration of the circuit using a current source is not limited to the examples illustrated in the third and fourth embodiments.

Figure 29:
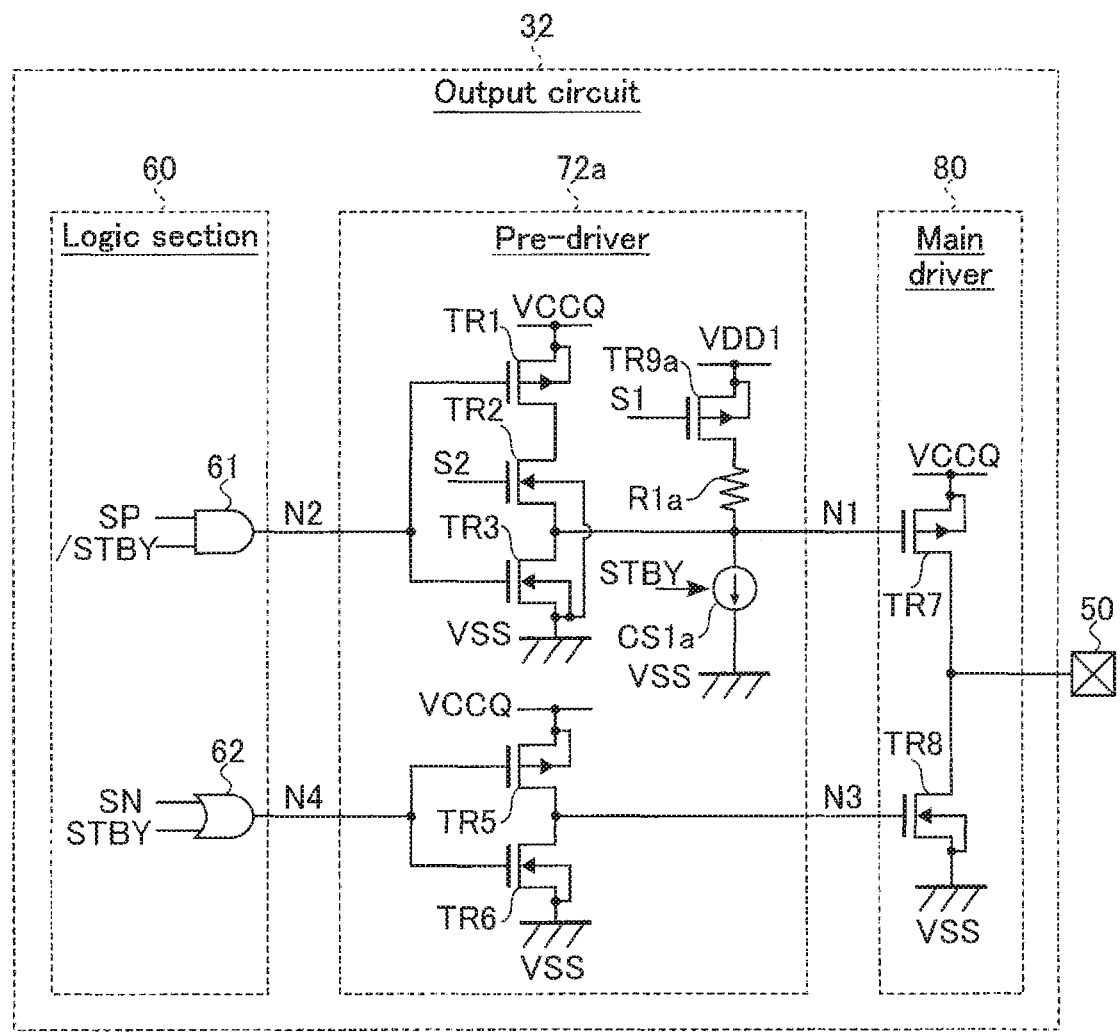
FIG. 29 is a circuit diagram illustrating a configuration example of an output circuit included in a semiconductor memory device according to a modification of the third embodiment.

FIG. 29 illustrates a configuration example of an output circuit 32 according to a modification of the third embodiment. As illustrated in FIG. 29, a pre-driver 72a included in the modification of the third embodiment has a configuration where the transistor TR9, resistor R1, and current source CS1 are replaced by a transistor TR9a, resistor R1a, and current source CS1a, relative to the pre-driver 72 included in the third embodiment. The transistor TR9a is, for example, a P-type MOSFET.

A voltage VDD1 is applied to the source and the back gate of the transistor TR9a A signal S1 is applied to the gate of the transistor TR9a. The drain of the transistor TR9a is coupled to one end of the resistor R1a. The other end of the resistor R1a is coupled to a node N1. A voltage VSS is applied to the current source CS1a, and current is supplied from the node N1 to the voltage VSS based on the signal STBY. The other configurations of the semiconductor memory device 1 according to the modification of the third embodiment are the same as those of the third embodiment. The semiconductor memory device 1 according to the modification of the third embodiment can operate similarly to the semiconductor memory device 1 according to the third embodiment. The third embodiment and the modification of the third embodiment can also be expressed as including a circuit, in which a transistor, a resistor, and a current source are arranged in series, between the voltage VDD1 and the voltage VSS. The arrangement of the transistor, resistor, and current source provided in series between the voltage VDD1 and the voltage VSS as described above may be interchanged appropriately.

FIG. 30 illustrates a configuration example of an output circuit 32 according to a modification of the fourth embodiment. As illustrated in FIG. 30, the pre-driver 73a included in the modification of the fourth embodiment has a configuration where the transistor TR17, resistor R2, and current source CS2 are replaced by a transistor TR17a, a resistor R2a, and a current source CS2a, relative to the pre-driver 73 included in the fourth embodiment. The transistor TR17a is, for example, an N-type MOSFET.

The voltage VSS1 is applied to the source and the back gate of the transistor TR17a. A signal S3 is applied to the gate of the transistor TR17a. The drain of the transistor TR17a is coupled to one end of the resistor R2a. The other end of the resistor R2a is coupled to the node N3. A voltage VCCQ is applied to the current source CS2a, and current is supplied from the voltage VCCQ to the node N3, based on the signal STBY. The other configurations of the semiconductor memory device 1 according to the modification of the fourth embodiment are the same as those of the fourth embodiment. The semiconductor memory device 1 according to the modification of the fourth embodiment can operate similarly to the semiconductor memory device 1 according to the fourth embodiment. The fourth embodiment and the modification of the fourth embodiment can be expressed as including a circuit, in which a transistor, a resistor, and a current source are arranged in series, between the voltage VCCQ and the voltage VSS1. The arrangement of the transistor, resistor, and current source provided in series between the voltage VCCQ and the voltage VSS1 as described above may be interchanged appropriately.

In the second, fourth, and sixth embodiments, a case has been described by way of example in which the voltage VSS1 is lower than the voltage VSS. A configuration in the case of including an N-type MOSFET to which the voltage VSS1 lower than the voltage VSS is applied will be described by way of example in which the transistors TR13 to TR16 are included in the pre-driver 71 of the second embodiment.

FIG. 31 illustrates an example of a cross-sectional structure of the pre-driver 71 according to the second embodiment. FIG. 31 illustrates a cross-sectional structure of a semiconductor substrate on which the pre-driver 71 according to the second embodiment is provided, by extracting a region including the transistors TR13 to TR16. The region illustrated in FIG. 31 includes a semiconductor substrate 400, N-type well regions 201 and 202, a P-type well region 301, N-type diffusion regions 101 to 106, P-type diffusion regions 111 to 116, insulators 121 to 124, and conductors 131 to 134.

In FIG. 31, the plane defined by an X direction and a Y direction corresponds to a surface of a semiconductor substrate 400 on which the semiconductor memory device 1 is formed, and a Z direction corresponds to a vertical direction relative to the surface of the semiconductor substrate 400 on which the semiconductor memory device 1 is formed. Electrical coupling through contacts or interconnects are illustrated with use of lines for simplification.

The semiconductor substrate 400 is composed of P-type silicon. An N-type well region 201 is formed inside the semiconductor substrate 400, and the upper end thereof is in contact with the top surface of the semiconductor substrate 400. An N-type diffusion region 101 and P-type diffusion regions 111 to 114 are arranged in sequence inside the N-type well region 201 in the X-direction. Each upper end of the N-type diffusion region 101 and P-type diffusion regions 111 to 114 is in contact with the top surface of the semiconductor substrate 400. The N-type diffusion region 101 is electrically coupled to the N-type well region 201. The P-type diffusion region 111 functions as a source of the transistor TR13. The P-type diffusion region 112 functions as a drain of the transistor TR13. The P-type diffusion region 113 functions as a source of the transistor TR14. The P-type diffusion region 114 functions as a drain of the transistor TR14. Insulators 121 and 122 are provided over the N-type well region 201. The insulator 121 functions as a gate insulating film of the transistor TR13. The insulator 122 functions as a gate insulating film of the transistor TR14. A conductor 131 is provided on the insulator 121. The conductor 131 functions as a gate electrode of the transistor TR13. A conductor 132 is provided on the insulator 122. The conductor 132 functions as a gate electrode of the transistor TR14. The N-type diffusion region 101 and the P-type diffusion region 111 are electrically coupled via interconnect, and a voltage VCCQ is applied thereto. The P-type diffusion regions 112 and 113 are electrically coupled to the node N3 via interconnect. The conductor 131 is coupled to the node N4 via interconnect. A signal S4 is applied to the conductor 132 via interconnect.

Inside the semiconductor substrate 400, the N-type diffusion regions 102 and 103 and the P-type diffusion region 115 are arranged in sequence in the X direction. Each upper end of the N-type diffusion regions 102 and 103 and the P-type diffusion region 115 is in contact with the top surface of the semiconductor substrate 400. The N-type diffusion region 102 functions as a drain of the transistor TR15. The N-type diffusion region 103 functions as a source of the transistor TR15. The P-type diffusion region 115 is electrically coupled to the semiconductor substrate 400. An insulator 123 is provided on the semiconductor substrate 400. The insulator 123 functions as a gate insulating film of the transistor TR15. A conductor 133 is provided on the insulator 123. The conductor 133 functions as a gate electrode of the transistor TR15. The N-type diffusion region 102 is electrically coupled to the P-type diffusion region 114 via interconnect. The N-type diffusion region 103 and the P-type diffusion region 115 are electrically coupled via interconnect, and a voltage VSS is applied thereto. The conductor 133 is coupled to the node N4 via interconnect.

An N-type well region 202 is formed, inside the semiconductor substrate 400, apart from the N-type well region 201. The upper end of the N-type well region 202 is in contact with the top surface of the semiconductor substrate 400. The depth of the N-type well region 202 in the Z direction is greater than that of the N-type well region 201 in the Z direction. The N-type well region 202 is also referred to as a "deep N-type well". A P-type well region 301 is provided inside the N-type well region 202. The upper end of the P-type well region 301 is in contact with the top surface of the semiconductor substrate 400. The depth of the P-type well region 301 in the Z direction is smaller than that of the N-type well region 202 in the Z direction. The P-type well region 301 is surrounded by the N-type well region 202 and is separated from the semiconductor substrate 400. Inside the P-type well region, N-type diffusion regions 104 and 105 and a P-type diffusion region 116 are arranged in sequence in the X direction. Each upper end of the N-type diffusion regions 104 and 105 and the P-type diffusion region 116 is in contact with the top surface of the semiconductor substrate 400. The N-type diffusion region 104 functions as a drain of the transistor TR16. The N-type diffusion region 105 functions as a source of the transistor TR16. The P-type diffusion region 116 is electrically coupled to the P-type well region 301. An insulator 124 is provided over the P-type well region 301. The insulator 124 functions as a gate insulating film of the transistor TR16. A conductor 134 is provided on the insulator 124. The conductor 134 functions as a gate electrode of the transistor TR16. The N-type diffusion region 104 is coupled to the node N3 via interconnect. The N-type diffusion region 105 and the P-type diffusion region 116 are electrically coupled via interconnect, and a voltage VSS1 is applied thereto. A signal S3 is applied to the conductor 134 via interconnect. Inside the N-type well region 202, an N-type diffusion region 106 is provided. The upper end of the N-type diffusion region 106 is in contact with the top surface of the semiconductor substrate 400. The N-type diffusion region 106 is electrically coupled to the N-type well region 202. The voltage VCCQ is applied to the N-type diffusion region 106 via interconnect.

An N-type MOSFET is provided, for example, on a P-type semiconductor substrate or in a P-type well region, and an N-type diffusion region functions as a source or a drain. For example, when the voltage of the P-type well region becomes a voltage VSS, and the voltage of an N-type diffusion region functioning as a source becomes a voltage VSS1 which is lower than the voltage VSS, a current with a forward bias may flow from the P-type well region to the N-type diffusion region. In contrast, in the example illustrated in FIG. 31, the transistor TR16 with the source to which the voltage VSS1 is applied thereto is provided in the P-type well region 301 which is provided inside the N-type well region 202. The P-type well region 301 is surrounded by the N-type well region 202 and is separated from the semiconductor substrate 400. Furthermore, the voltage of the N-type well region 202 is set to the voltage VCCQ which has been applied via the N-type diffusion region 106. By providing such a configuration, the voltage of the P-type well region 301 can be set to a different voltage from that of the semiconductor substrate 400. The voltage of the P-type well region 301 is set to the voltage VSS1 which was applied via the P-type diffusion region 116. By providing such a configuration, the voltage of the P-type well region 301 can be set to a different voltage from that of the semiconductor substrate 400. The voltage of the P-type well region 301 is set to the voltage VSS1 which has been applied via the P-type diffusion region 116. With this configuration, it is possible to prevent a forward bias current from flowing from the P-type well region 301 to the N-type diffusion regions 104 and 105 functioning as the source and the drain of the transistor TR16.

Such a structure in which a P-type well region is provided inside an N-type well region (deep N well) provided up to a deep part of the semiconductor substrate 400 is also referred to as a "triple well structure". FIG. 31 illustrates an example where the transistor TR16 is provided on a triple well structure; however, the transistor provided on a triple well structure is not limited to the transistor TR16. An N-type transistor with a source and a drain to which a voltage lower than the voltage VSS may be applied may be provided on the triple well structure. An N-type transistor with a source and a drain to which a voltage lower than the voltage VSS will not be applied may also be provided on the triple well structure.

Figure 32:
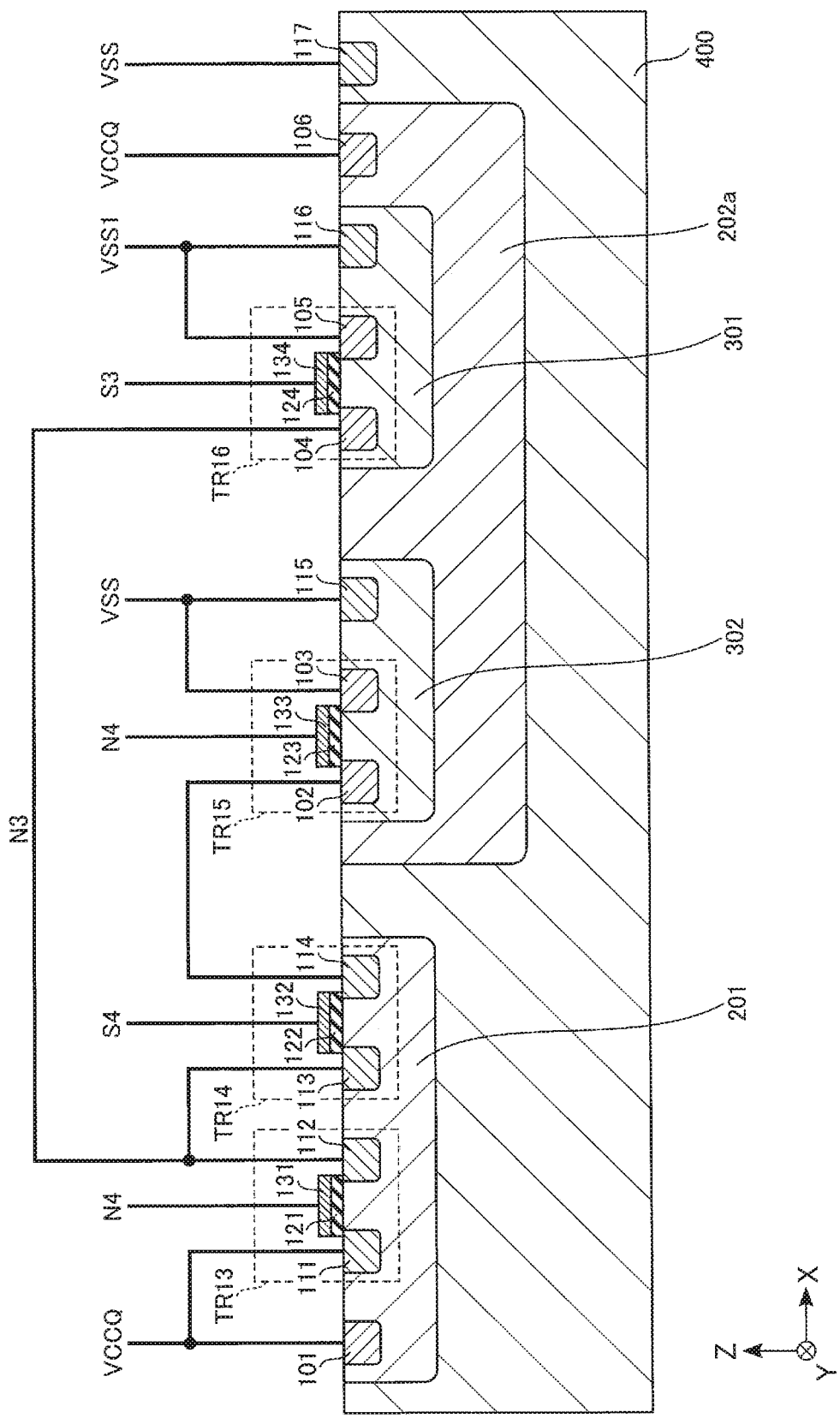
FIG. 32 is a diagram illustrating an example of a cross-sectional structure of the pre-driver included in the semiconductor memory device according to the second embodiment.

FIG. 32 illustrates an example of a cross-sectional structure of the pre-driver 71 according to the second embodiment. The example illustrated in FIG. 32 further includes a P-type well region 302 and a P-type diffusion region 117, relative to the example illustrated in FIG. 31, and the N-type well region 202 is replaced by an N-type well region 202a which includes the P-type well region 302. Specifically, the P-type well region 302 is provided apart from the P-type well region 301. Each of the N-type diffusion regions 102 and 103 and the P-type diffusion region 115 is provided inside the P-type well region 302. The insulator 123 and the conductor 133 are provided over the P-type well region 302. The P-type diffusion region 115 is electrically coupled to the P-type well region 302. The N-type well region 202a includes the P-type well regions 301 and 302. The P-type well region 301 is surrounded by an N-type well region 202a and is separated from each of the P-type well region 302 and the semiconductor substrate 400. The P-type well region 302 is surrounded by the N-type well region 202a and is separated from each of the P-type well region 301 and the semiconductor substrate 400. A P-type diffusion region 117 is provided in the semiconductor substrate 400. The upper end of the P-type diffusion region 117 is in contact with the top surface of the semiconductor substrate 400. The P-type diffusion region 117 is electrically coupled to the semiconductor substrate 400. The voltage VSS is applied to the P-type diffusion region 117 via interconnect.

The voltage of the P-type well region 302 is set to the voltage VSS that has been applied via the P-type diffusion region 115. That is, in the example illustrated in FIG. 32, two P-type well regions to which different voltages are applied are provided inside the N-type well region 202a. In this way, one or more P-type well regions to which different voltages are applied may be provided in an N-type well region provided up to a deep part of the semiconductor substrate 400.

[8] Seventh Embodiment

A semiconductor memory device 1 according to a seventh embodiment differs in configuration of the logic section 60 and the main driver 80 from the semiconductor memory device 1 according to the second embodiment. A description will be given of the points in which the semiconductor memory device 1 according to the seventh embodiment differs from that according to the second embodiment.

[8-1] Configuration

Figure 33:
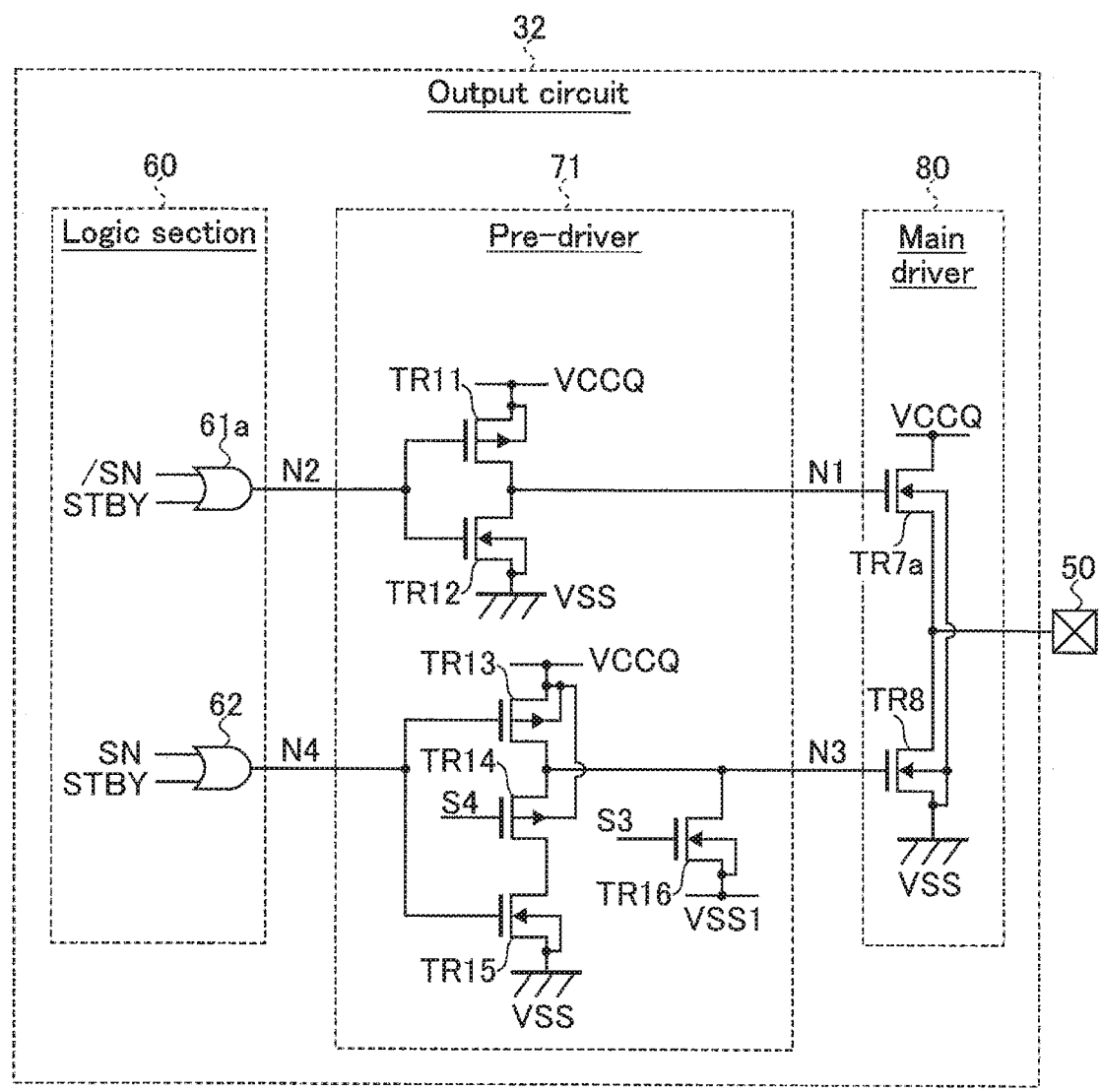
FIG. 33 is a circuit diagram illustrating a configuration example of an output circuit included in a semiconductor memory device according to the seventh embodiment.

FIG. 33 illustrates a configuration example of an output circuit 32 according to the seventh embodiment. As illustrated in FIG. 33, in the output circuit 32 of the seventh embodiment, the logic section 60 includes an OR gate 61a and an OR gate 62. The OR gate 61a performs an OR operation of a signal /SN and the signal STBY, and outputs an operation result to the node N2. The OR gate 62 performs an OR operation of a signal SN and the signal STBY, and outputs an operation result to the node N4. The signals SN and /SN are, for example, signals input in the output circuit 32 from a data bus. The signal /SN is an inversion signal of the signal SN.

The main driver 80 includes a transistor TR7a and a transistor TR8. The transistors TR7a and TR8 are, for example, N-type MOSFETs. A voltage VCCQ is applied to the drain of the transistor TR7a. The source of the transistor TR7a is coupled to a pad 50. The gate of the transistor TR7a is coupled to a node N1. The back gate of the transistor TR7a is grounded. The drain of the transistor TR8 is coupled to the pad 50. The source and the back gate of the transistor TR8 are respectively grounded. The gate of the transistor TR8 is coupled to the node N3. The other configurations of the semiconductor memory device 1 according to the seventh embodiment are the same as those of the second embodiment.

[8-2] Operation of Output Circuit 32

Next, the operation of the output circuit 32 in the semiconductor memory device 1 according to the seventh embodiment will be described. In the seventh embodiment, it is assumed that voltages VSS1 and VSS2 are negative voltages lower than the voltage VSS, the absolute value of the voltage VSS2 is greater than the absolute value of the voltage VSS1, and the absolute value of the voltage VSS2 is equal to or greater than the absolute value of a threshold voltage of the transistor TR14.

FIG. 17 illustrates a relationship between the logic level and the voltage of each signal in the semiconductor memory device 1 according to the seventh embodiment. The "H" level of a signal S3 corresponds to the voltage VDD. The "L" level of the signal S3 corresponds to the voltage VSS1. The "H" level of a signal S4 corresponds to the voltage VDD. The "L" level of the signal S4 corresponds to the voltage VSS2.

First, the operation of the pre-driver 71 according to the seventh embodiment in the first state will be described. In the first state, the output circuit 32 is in the stand-by state, the logic level of the node N2 is the "H" level, and the logic level of the node N4 is the "H" level.

The transistor TR11 enters the OFF state since the "H" level has been applied to the gate. The transistor TR12 enters the ON state since the "H" level has been applied to the gate. As a result, the voltage of the node N1 is determined to be the voltage VSS by the transistor TR12 which has entered the ON state.

The transistor TR16 enters the ON state since a signal S3 of the voltage VDD has been applied to the gate. The transistor TR13 enters the OFF state since the "H" level has been applied to the gate. The transistor TR14 enters the OFF state since a signal S4 of the voltage VDD has been applied to the gate. The transistor TR15 enters substantially the OFF state since the transistors TR13 and TR14 are in the OFF state, and no current flows to the transistor TR15. As a result, the voltage of the node N3 is determined to be a voltage VSS1 by the transistor TR16 which has entered the ON state.

As a result of the fact that the pre-driver 71 has operated in this way, in the first state, each of the transistors TR7a and TR8 of the main driver 80 enters the OFF state, and the output node of the output circuit 32 enters a high-impedance state. At that time, the voltage VSS1 has been applied to the gate of the transistor TR8.

Subsequently, the operation of the pre-driver 71 according to the seventh embodiment in the second state will be described in sequence for a case where the output circuit 32 has output the "L" level and a case where the output circuit 32 has output the "H" level.

In the second state, the output circuit 32 is in the active state, the logic level of the node N2 is equal to the logic level of the signal /SN, and the logic level of the node N4 is equal to the logic level of the signal SN. First, a case will be described in which the logic level of the node N2 is the "H" level and the logic level of the node N4 is the "L" level.

The transistor TR11 enters the OFF state since the "H" level has been applied to the gate. The transistor TR12 enters the ON state since the "H" level has been applied to the gate. As a result, the voltage of the node N1 is determined to be a voltage VSS by the transistor TR12 which has entered the ON state.

The transistor TR16 enters the OFF state since a signal S3 of the voltage VSS1 has been applied to the gate. The transistor TR13 enters the ON state since the "L" level has been applied to the gate. The transistor TR15 enters the OFF state since the "L" level has been applied to the gate. A signal S4 of a voltage VSS2, which is a voltage lower than the voltage VSS by a threshold voltage of the transistor TR14 or more, has been applied to the gate of the transistor TR14. However, since the transistor TR15 is in the OFF state, the transistor TR14 does not apply the voltage to the node N3. As a result, the voltage of the node N3 is determined to be a voltage VCCQ by the transistor TR13 which has entered the ON state.

As a result of the fact that the pre-driver 71 has operated in this way, in the second state, the transistor TR7a of the main driver 80 enters the OFF state, the transistor TR8 of the main driver 80 enters the ON state-, and the output circuit 32 can output the "L" level of the voltage VSS.

Subsequently, a case will be described in which in the second state, the logic level of the node N2 is the "L" level, and the logic level of the node N4 is the "H" level.

The transistor TR11 enters the ON state since the "L" level has been applied to the gate. The transistor TR12 enters the OFF state since the "L" level has been applied to the gate. As a result, the voltage of the node N1 is determined to be a voltage VCCQ by the transistor TR11 which has entered the ON state.

The transistor TR16 enters the OFF state since the signal S3 of the voltage VSS1 has been applied to the gate. The transistor TR13 enters the OFF state since a signal of the "N" level has been applied to the gate. A signal S4 of the voltage VSS2, which is a voltage lower than the voltage VSS by a threshold voltage of the transistor TR14 or more, has been applied to the gate of the transistor TR14. The "H" level has been applied to the gate of the transistor TR15. Therefore, the transistors TR14 and TR15 enter the ON state. As a result, the voltage of the node N3 is determined to be a voltage VSS by the transistors TR14 and TR15 which have entered the ON state.

As a result of the fact that the pre-driver 71 has operated in this way, in the second state, the transistor TR7a of the main driver 80 enters the ON state, and the transistor TR8 of the main driver 80 enters the OFF state. The transistor TR7a is an N-type MOSFET. Therefore, the output circuit 32 according to the seventh embodiment outputs, as the "H" level, a voltage in which the threshold voltage of the transistor TR7a is subtracted from the voltage VCCQ, different than the output circuit 32 according to the second embodiment.

As described above, the output circuit 32 in the semiconductor memory device 1 according to the seventh embodiment can control, in the active state, the voltage of the node N3 to be set to a voltage VSS or voltage VCCQ and output the "L" level or "H" level to the output node. FIG. 34 illustrates an output waveform of the output circuit 32 according to the seventh embodiment and an output waveform of the output circuit 32 according to the second embodiment. As illustrated in FIG. 34, the voltage of the "H" level at the output node (pad 50) of the output circuit 32 in the semiconductor memory device 1 according to the seventh embodiment is lower than that of the second embodiment. In addition, the amplitude between the "L" level and the "H" level at the output node (pad 50) of the output circuit 32 in the semiconductor memory device 1 according to the seventh embodiment is smaller than that of the second embodiment. That is, in the semiconductor memory device 1 according to the seventh embodiment, a voltage VAVR as an average value of amplitudes of the output signal at the output node (pad 50) of the output circuit 32 is smaller than an average value of the voltage VCCQ and the voltage VSS ((VCCQ+VSS)/2).

[8-3] Advantageous Effects of Seventh Embodiment

As described above, the semiconductor memory device 1 according to the seventh embodiment applies, in the stand-by state, a voltage VSS1 as a negative voltage to the node N3. With this configuration, in the semiconductor memory device 1 according to the seventh embodiment, the transistor TR8 in the stand-by state can enter a reverse bias state to suppress leakage current of the transistor TR8. As a result, the semiconductor memory device 1 according to the seventh embodiment can reduce electric power consumption of the semiconductor memory device 1 in the stand-by state, as in the case of the second embodiment.

In addition, in the semiconductor memory device 1 according to the seventh embodiment, the voltage output from the output node (pad 50) by the output circuit 32 corresponds to a voltage VSS in the case of the "L" level, and in the case of the "H" level, corresponds to a voltage in which the threshold voltage of the transistor TR7a is subtracted from the voltage VCCQ. Therefore, it is possible to lower a voltage corresponding to the "H" level and reduce the amplitude between the "L" level and the "H" level. Therefore, the operation time necessary for the transition of the level of an output signal between the "L" level and the "H" level can be shortened, and the electric power consumption can be reduced.

In the semiconductor memory device 1 according to the seventh embodiment, the high/low levels of the voltages VSS1 and VSS2 may be suitably changed in accordance with the characteristic of the transistor. In addition, one kind of signal may be used for different purposes in accordance with the high/low level relationship of each of the voltages, thereby omitting another kind of signal. For example, the voltage VSS1 may be set to a voltage higher than the voltage VSS and lower than the threshold voltage of the transistor TR8 such that the transistor TR8 enters a weak forward bias. In this case, the voltage VSS1 may be generated using a regulator in place of the negative charge pump 23. In this case, the signal STBY or signal S4 may also be used in place of the signal S3.

[8-4] Modification of Seventh Embodiment

In the seventh embodiment, a case has been explained in which the voltage VSS1 is applied to the node N3 via the transistor TR16; however, the method of applying the voltage VSS1 is not limited thereto. For example, the voltage may be applied to the node N3 by means of a circuit including a current source, as in the case of the fourth embodiment.

Figure 35:
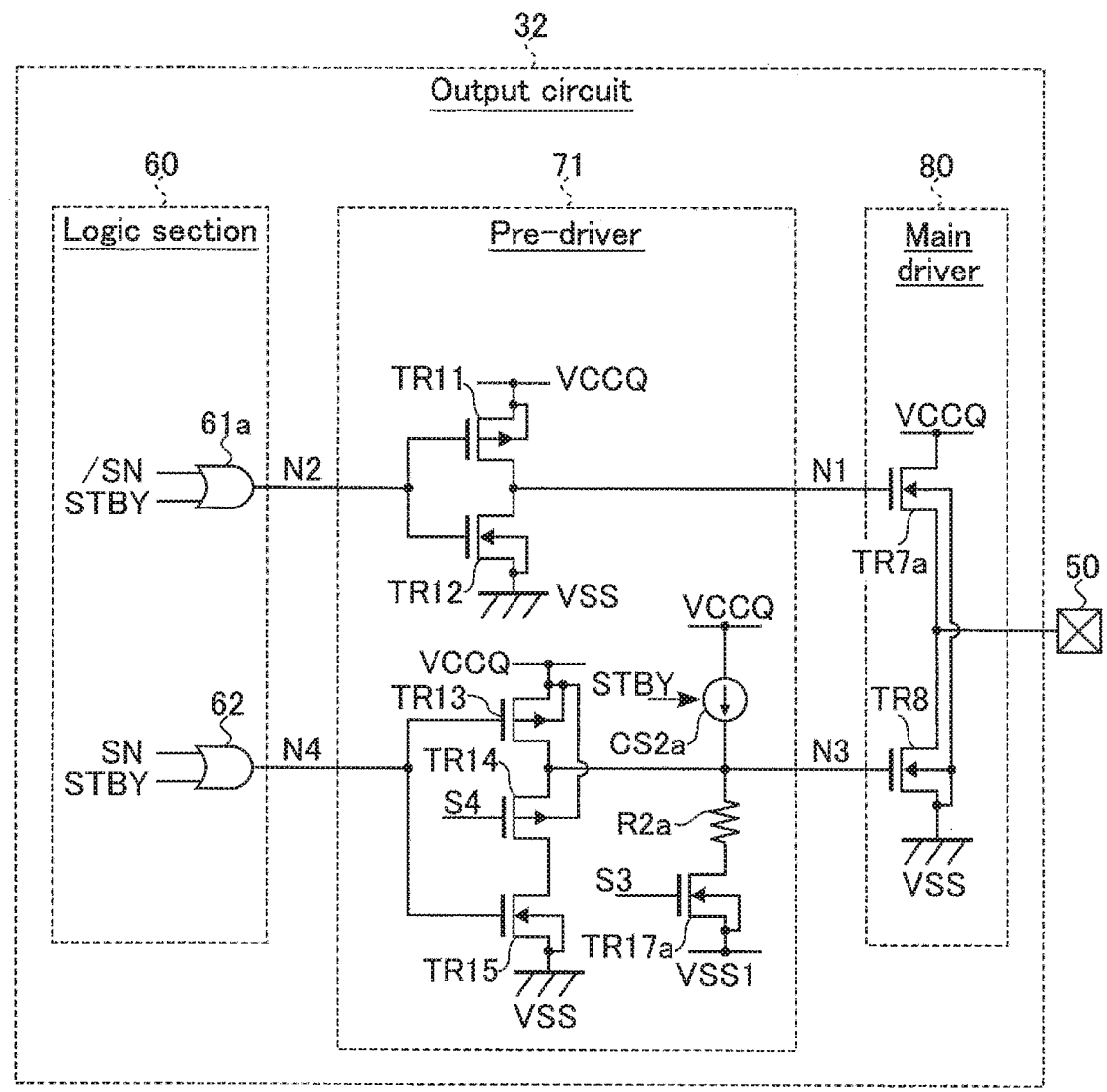
FIG. 35 is a circuit diagram illustrating a configuration example of an output circuit included in a semiconductor memory device according to a modification of the seventh embodiment.

FIG. 35 illustrates a configuration of the output circuit 32 according to a modification of the seventh embodiment. The output circuit 32 according to the modification of the seventh, embodiment differs from the output circuit 32 according to the seventh embodiment in that the pre-driver 71 does not include the transistor TR16 but includes a transistor TR17a, a resistor R2a, and a current source CS2a. The transistor TR17a is, for example, an N-type MOSFET.

The voltage VSS1 is applied to the source and the back gate of the transistor TR17a. The signal S3 is applied to the gate of the transistor TR17a. The drain of the transistor TR17a is coupled to one end of the resistor R2a. The other end of the resistor R2a is coupled to the node N3. The voltage VCCQ is applied to the current source CS2a, and current is supplied from the voltage VCCQ to the node N3, based on the signal STBY. The other configurations of the semiconductor memory device 1 according to the modification of the seventh embodiment are the same as those of the seventh embodiment. The semiconductor memory device 1 according to the modification of the seventh embodiment can operate similarly to the semiconductor memory device 1 according to the seventh embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An output circuit comprising:
   a first power supply line;
   a second power supply line;
   a third power supply line;
   a pad;
   a first transistor with a first end being coupled to the first power supply line, and a second end being coupled to the pad;
   a second transistor with a first end being coupled to the second power supply line, and a second end being coupled to the pad; and
   a first circuit coupled to each of the third power supply line and a gate of the first transistor,
   wherein:
   a first voltage is applied to the first power supply line,
   a second voltage which is lower than the first voltage is applied to the second power supply line,
   a third voltage which is different from both the first and second voltages is applied to the third power supply line, and
   wherein:
   in a first case, the first circuit applies a fourth voltage to the gate of the first transistor,
   in a second case, the first circuit causes the third power supply line and the gate of the first transistor to be electrically non-coupled,
   each of the third voltage and the fourth voltage is higher than the first voltage, and
   the first transistor is a P-type MOSFET.

2. The output circuit according to claim 1, further comprising:
   a third transistor with a first end being coupled to the first power supply line;
   a fourth transistor with a first end being coupled to the gate of the first transistor, and a second end being coupled to a second end of the third transistor; and
   a fifth transistor with a first end being coupled to the second power supply line, a second end being coupled to the gate of the first transistor, and a gate being coupled to a gate of the third transistor,
   wherein:
   in the first case, the second voltage is applied to a gate of the fourth transistor, and
   in the second case, a fifth voltage which is higher than the first voltage is applied to the gate of the fourth transistor.

3. The output circuit according to claim 2, wherein the first circuit comprises a sixth transistor with a first end being coupled to the third power supply line, and a second end being coupled to the gate of the first transistor.

4. The output circuit according to claim 3, wherein each of the fourth voltage and the fifth voltage is equal to the third voltage, and
   in the first case, the third voltage is applied to a gate of the sixth transistor.

5. The output circuit according to claim 2, wherein the first circuit comprises a seventh transistor, a first resistor, and a first current source, which are coupled in series between the third power supply line and the second power supply line, and
   wherein:
   in the first case, the seventh transistor enters the ON state, and the first current source supplies a first current, and
   in the second case, the seventh transistor enters the OFF state, and the first current source does not supply the first current.

6. An output circuit comprising:
   a first power supply line;
   a second power supply line;
   a third power supply line;
   a pad;
   a first transistor with a first end being coupled to the first power supply line, and a second end being coupled to the pad;
   a second transistor with a first end being coupled to the second power supply line, and a second end being coupled to the pad; and
   a first circuit coupled to each of the third power supply line and a gate of the first transistor,
   wherein:
   a first voltage is applied to the first power supply line,
   a second voltage which is lower than the first voltage is applied to the second power supply line,
   a third voltage which is different from both the first and second voltages is applied to the third power supply line, and
   wherein:
   in a first case, the first circuit applies a fourth voltage to the gate of the first transistor, in a second case, the first circuit causes the third power supply line and the gate of the first transistor to be electrically non-coupled, in the first case, the first transistor causes the first power supply line and the pad to be electrically non-coupled, and wherein the first circuit comprises a sixth transistor with one end being coupled to the third power supply line, and a second end being coupled to the gate of the first transistor.

7. An output circuit comprising:

a first power supply line;

a second power supply line;

a third power supply line;

a pad;

a first transistor with a first end being coupled to the first power supply line, and a second end being coupled to the pad;

a second transistor with a first end being coupled to the second power supply line, and a second end being coupled to the pad; and a first circuit coupled to each of the third power supply line and a gate of the first transistor, wherein:

a first voltage is applied to the first power supply line, a second voltage which is lower than the first voltage is applied to the second power supply line, a third voltage which is different from both the first and second voltages is applied to the third power supply line, and wherein:

in a first case, the first circuit applies a fourth voltage to the gate of the first transistor, in a second case, the first circuit causes the third power supply line and the gate of the first transistor to be electrically non-coupled, in the first case, the first transistor causes the first power supply line and the pad to be electrically non-coupled, and wherein the first circuit comprises a seventh transistor, a first resistor, and a first current source, which are coupled in series between the third power supply line and the second power supply line, and wherein:

in the first case, the seventh transistor enters the ON state, and the first current source supplies a first current, and in the second case, the seventh transistor enters the OFF state, and the first current source does not supply current.

8. The output circuit according to claim 1, further comprising:

a second resistor coupled between the second end of the first transistor and the pad; and a third resistor coupled between the second end of the second transistor and the pad.

9. An output circuit comprising:

a first power supply line;

a second power supply line;

a third power supply line;

a pad;

a first transistor with a first end being coupled to the first power supply line, and a second end being coupled to the pad;

a second transistor with a first end being coupled to the second power supply line, and a second end being coupled to the pad; and a first circuit coupled to each of the third power supply line and a gate of the second transistor, wherein:

a first voltage is applied to the first power supply line, a second voltage which is lower than the first voltage is applied to the second power supply line, a third voltage which is different from both the first and second voltages is applied to the third power supply line, and wherein:

in a first case, the first circuit applies a fourth voltage to the gate of the second transistor, and in a second case, the first circuit causes the third power supply line and the gate of the second transistor to be electrically non-coupled, each of the third voltage and the fourth voltage is lower than the second voltage, and the second transistor is an N-type MOSFET.

10. The output circuit according to claim 9, further comprising:

a third transistor with a first end being coupled to the first power supply line, and a second end being coupled to the gate of the second transistor;

a fourth transistor with a first end being coupled to the gate of the second transistor; and a fifth transistor with a first end being coupled to the second power supply line, a second end being coupled to a second end of the fourth transistor, and a gate being coupled to a gate of the third transistor, wherein:

in the first case, a fifth voltage which is higher than the first voltage is applied to a gate of the fourth transistor, and in the second case, a sixth voltage which is lower than the second voltage is applied to the gate of the fourth transistor.

11. The output circuit according to claim 10, wherein the first circuit comprises a sixth transistor with a first end being coupled to the third power supply source, and a second end being coupled to the gate of the second transistor.

12. The output circuit according to claim 10, wherein the first circuit comprises a seventh transistor, a first resistor, and a first current source, which are coupled in series between the first power supply line and the third power supply line, and in the first case, the seventh transistor enters the ON state, and the first current source supplies a first current, and in the second case, the seventh transistor enters the OFF state, and the first current source does not supply the first current.

13. An output circuit comprising:

a first power supply line;

a second power supply line;

a third power supply line;

a pad;

a first transistor with a first end being coupled to the first power supply line, and a second end being coupled to the pad;

a second transistor with a first end being coupled to the second power supply line, and a second end being coupled to the pad; and a first circuit coupled to each of the third power supply line and a gate of the second transistor, wherein:

a first voltage is applied to the first power supply line, a second voltage which is lower than the first voltage is applied to the second power supply line, a third voltage which is different from both the first and second voltages is applied to the third power supply line, and wherein:

in a first case, the first circuit applies a fourth voltage to the gate of the second transistor, in a second case, the first circuit causes the third power supply line and the gate of the second transistor to be electrically non-coupled, in the first case, the second transistor causes the second power supply line and the pad to be electrically non-coupled, and wherein the first circuit comprises a sixth transistor with a first end being coupled to the third power supply source, and a second end being coupled to the gate of the second transistor.

14. An output circuit comprising:

a first power supply line;

a second power supply line;

a third power supply line;

a pad;

a first transistor with a first end being coupled to the first power supply line, and a second end being coupled to the pad;

a second transistor with a first end being coupled to the second power supply line, and a second end being coupled to the pad; and a first circuit coupled to each of the third power supply line and a gate of the second transistor, wherein:

a first voltage is applied to the first power supply line, a second voltage which is lower than the first voltage is applied to the second power supply line, a third voltage which is different from both the first and second voltages is applied to the third power supply line, and wherein:

in a first case, the first circuit applies a fourth voltage to the gate of the second transistor, in a second case, the first circuit causes the third power supply line and the gate of the second transistor to be electrically non-coupled, in the first case, the second transistor causes the second power supply line and the pad to be electrically non-coupled, and wherein the first circuit comprises a seventh transistor, a first resistor, and a first current source, which are coupled in series between the first power supply line and the third power supply line, wherein:

in the first case, the seventh transistor enters the ON state, and the first current source supplies a first current, and in the second case, the seventh transistor enters the OFF state, and the first current source does not supply the first current.

15. The output circuit according to claim 9, further comprising:

a second resistor coupled between the second end of the first transistor and the pad, and a third resistor coupled between the second end of the second transistor and the pad.

16. The output circuit according to claim 9, wherein the first transistor is an N-type MOSFET.

* * * * *